(12) United States Patent
Su et al.

(10) Patent No.: US 12,512,318 B2
(45) Date of Patent: Dec. 30, 2025

(54) METHOD FOR SELECTIVELY FORMING HARD MASK

(71) Applicant: TAIWAN SEMICONDUCTOR MANUFACTURING CO., LTD., Hsinchu (TW)

(72) Inventors: Chia-Wei Su, Taoyuan (TW); Fu-Ting Yen, Hsinchu (TW); Teng-Chun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 747 days.

(21) Appl. No.: 17/871,659

(22) Filed: Jul. 22, 2022

(65) Prior Publication Data

US 2022/0359202 A1 Nov. 10, 2022

Related U.S. Application Data

(60) Continuation of application No. 16/988,635, filed on Aug. 8, 2020, now Pat. No. 11,398,381, which is a
(Continued)

(51) Int. Cl.
| | |
|---|---|
| *H01L 21/027* | (2006.01) |
| *H01L 21/02* | (2006.01) |
| *H01L 21/033* | (2006.01) |
| *H01L 21/3105* | (2006.01) |
| *H01L 21/311* | (2006.01) |

(Continued)

(52) U.S. Cl.
CPC ...... *H01L 21/0337* (2013.01); *H01L 21/0228* (2013.01); *H01L 21/3105* (2013.01); *H01L 21/31053* (2013.01); *H01L 21/31116* (2013.01); *H01L 21/31144* (2013.01); *H01L 21/3115* (2013.01); *H01L 21/32051* (2013.01); *H01L 21/321* (2013.01); *H01L 21/76826* (2013.01); *H01L 21/76829* (2013.01); *H10D 64/01* (2025.01); *H01L 21/32* (2013.01)

(58) Field of Classification Search
CPC ..... H01L 21/027–0338; H01L 21/0228; H01L 21/0337; H01L 21/31053; H01L 21/31116; H01L 21/31144; H01L 21/3115; H01L 21/32; H01L 21/32051; H01L 21/321; H01L 21/76826; H01L 21/76829; H01L 29/401; H01L 29/66545; H01L 29/66795; H01L 21/3105–31155
See application file for complete search history.

(56) References Cited

U.S. PATENT DOCUMENTS

| | | | | |
|---|---|---|---|---|
| 6,630,404 | B1 * | 10/2003 | Babcock | B82Y 30/00 257/E21.026 |
| 10,741,392 | B2 * | 8/2020 | Su | H01L 21/321 |

(Continued)

*Primary Examiner* — Eric A. Ward
(74) *Attorney, Agent, or Firm* — Maschoff Brennan

(57) ABSTRACT

A method includes forming a metal layer over a substrate; forming a dielectric layer over the metal layer; performing a plasma treatment to a first portion of the dielectric layer, such that a carbon concentration of the first portion of the dielectric layer is lower than a carbon concentration of a second portion of the dielectric layer; selectively forming an inhibitor over the first portion of the dielectric layer; and selectively forming a hard mask over portions of the metal layer that is uncovered by the inhibitor.

20 Claims, 55 Drawing Sheets

Related U.S. Application Data division of application No. 16/037,925, filed on Jul. 17, 2018, now Pat. No. 10,741,392.

(60) Provisional application No. 62/591,712, filed on Nov. 28, 2017.

(51) Int. Cl.
*H01L 21/3115* (2006.01)
*H01L 21/3205* (2006.01)
*H01L 21/321* (2006.01)
*H01L 21/768* (2006.01)
*H10D 64/01* (2025.01)
*H01L 21/32* (2006.01)

(56) References Cited

U.S. PATENT DOCUMENTS

| | | | |
|---|---|---|---|
| 11,094,535 B2* | 8/2021 | Tois | H01L 23/53238 |
| 11,398,381 B2* | 7/2022 | Su | H01L 21/3105 |
| 2015/0056813 A1 | 2/2015 | Huang et al. | |
| 2016/0314960 A1* | 10/2016 | Cheng | H01L 21/0332 |
| 2017/0125241 A1* | 5/2017 | Mukherjee | H01L 21/02211 |
| 2018/0005850 A1 | 1/2018 | Citla et al. | |
| 2018/0166303 A1 | 6/2018 | Tabata et al. | |
| 2018/0233350 A1 | 8/2018 | Tois et al. | |
| 2019/0080904 A1 | 3/2019 | Anthis et al. | |
| 2019/0181005 A1 | 6/2019 | Wada | |
| 2020/0168453 A1* | 5/2020 | Saly | H01L 21/76879 |

* cited by examiner

METHOD FOR SELECTIVELY FORMING HARD MASK

PRIORITY CLAIM AND CROSS-REFERENCE

This application is a Continuation application of U.S. application Ser. No. 16/988,635, filed on Aug. 8, 2020, now U.S. Pat. No. 11,398,381, issued on Jul. 26, 2022, which is a Divisional application of U.S. application Ser. No. 16/037,925, filed on Jul. 17, 2018, now U.S. Pat. No. 10,741,392, issued on Aug. 11, 2020, which claims priority to U.S. Provisional Application Ser. No. 62/591,712, filed Nov. 28, 2017, which are herein incorporated by references.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
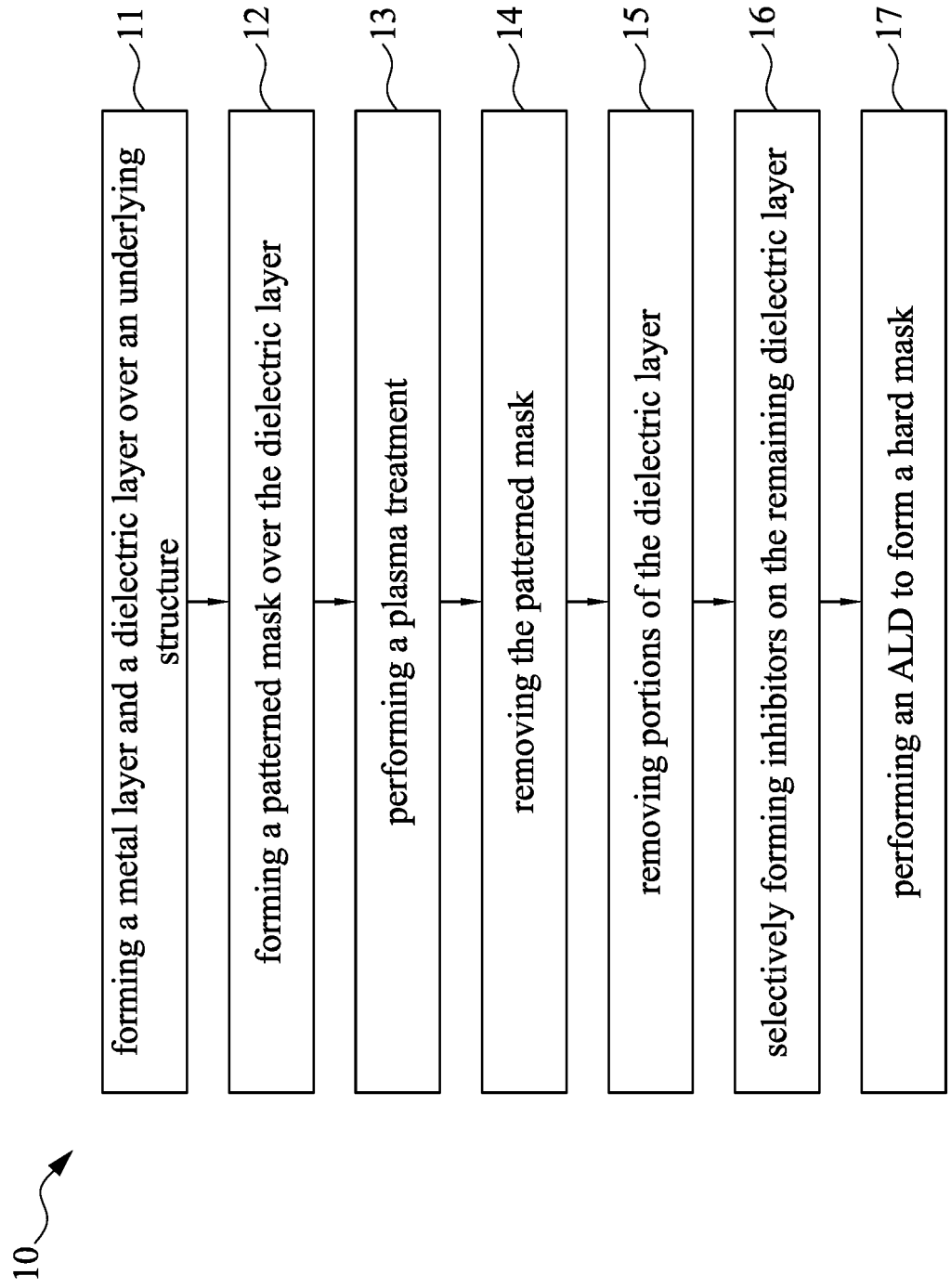
FIG. 1 is a flow chart of a method of manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method of manufacturing a semiconductor structure in accordance with some embodiments of the present disclosure. FIGS. 2 to 8 illustrate a semiconductor structure at various stages according to aspects of the method of FIG. 1.

Figure 2:
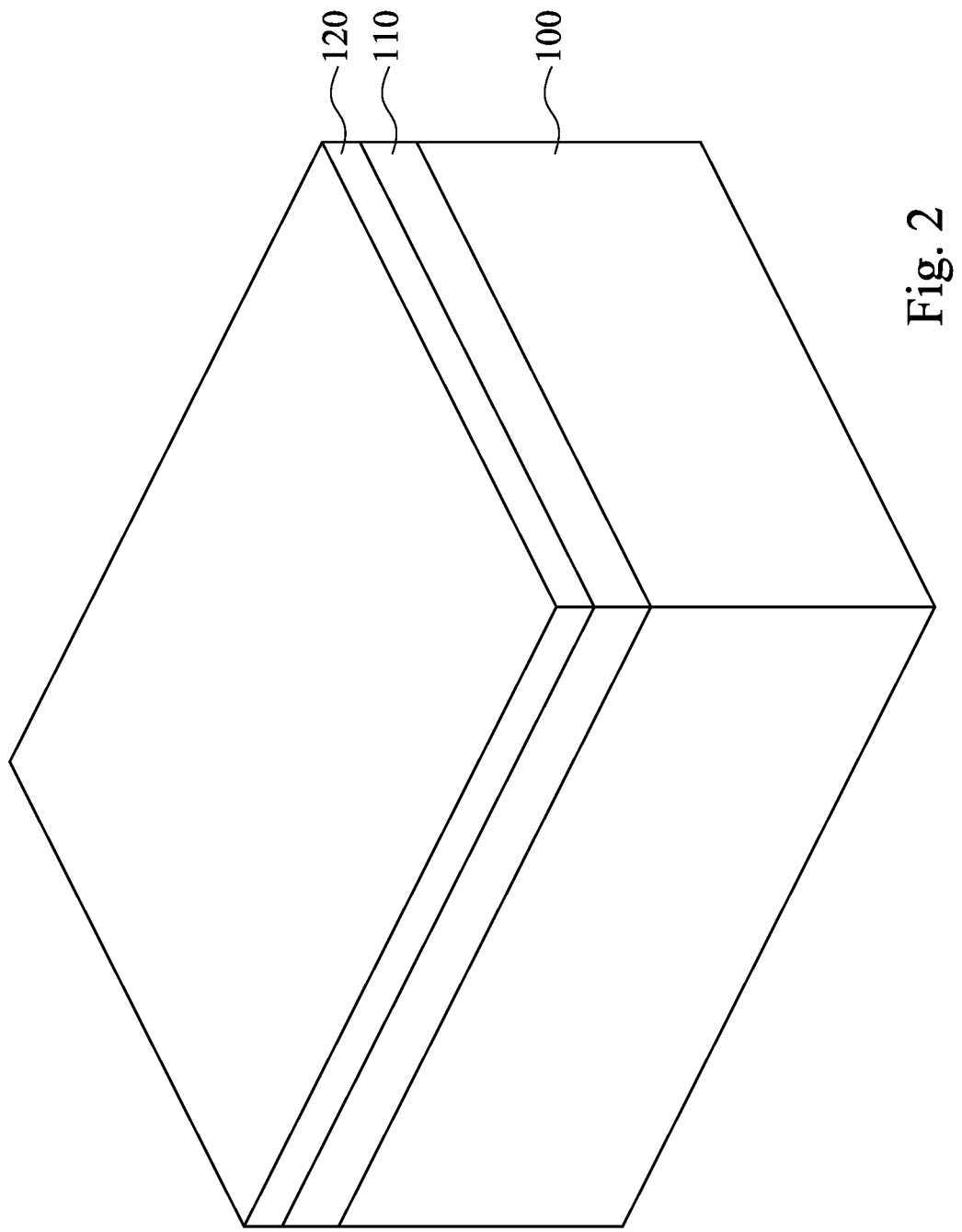
FIGS. 2 to 8 illustrate a semiconductor device at various stages according to aspects of the method of FIG. 1.

Reference is made to FIGS. 1 and 2. The method 10 begins at operation 11 where a metal layer and a dielectric layer are formed over an underlying structure. As illustrated in FIG. 2, a metal layer 110 is formed over an underlying structure 100, and a dielectric layer 120 is then formed over the metal layer 110. In some embodiments, the underlying structure 100 used herein can be, for example, fin structures, gate structures, metal wirings, and/or combination thereof. The detailed illustrations of the underlying structures 100 and/or any additional elements are simplified or omitted in FIGS. 2-8. In some other embodiments, the underlying structure 100 includes semiconductor devices, such as transistors, formed on a semiconductor substrate in certain embodiments. The semiconductor devices used herein may include, for example, a CMOS semiconductor device. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc. in some embodiments, the exemplary devices include a plurality of semiconductor devices (e.g., transistors), including PFETs, NFETs, etc., which may be interconnected.

The metal layer 110 may include W, TiN, Co, Ru, Pt, and/or other suitable materials. The metal layer 110 may be formed by suitable process, such as CVD, PVD, or ALD. The dielectric layer 120 may include SiO, SiN, SiC, SiOC, SiON, SiCN, SiOCN, and/or other suitable materials. The dielectric layer 120 may be formed by suitable process, such as CVD, PVD, or ALD.

Figure 3:
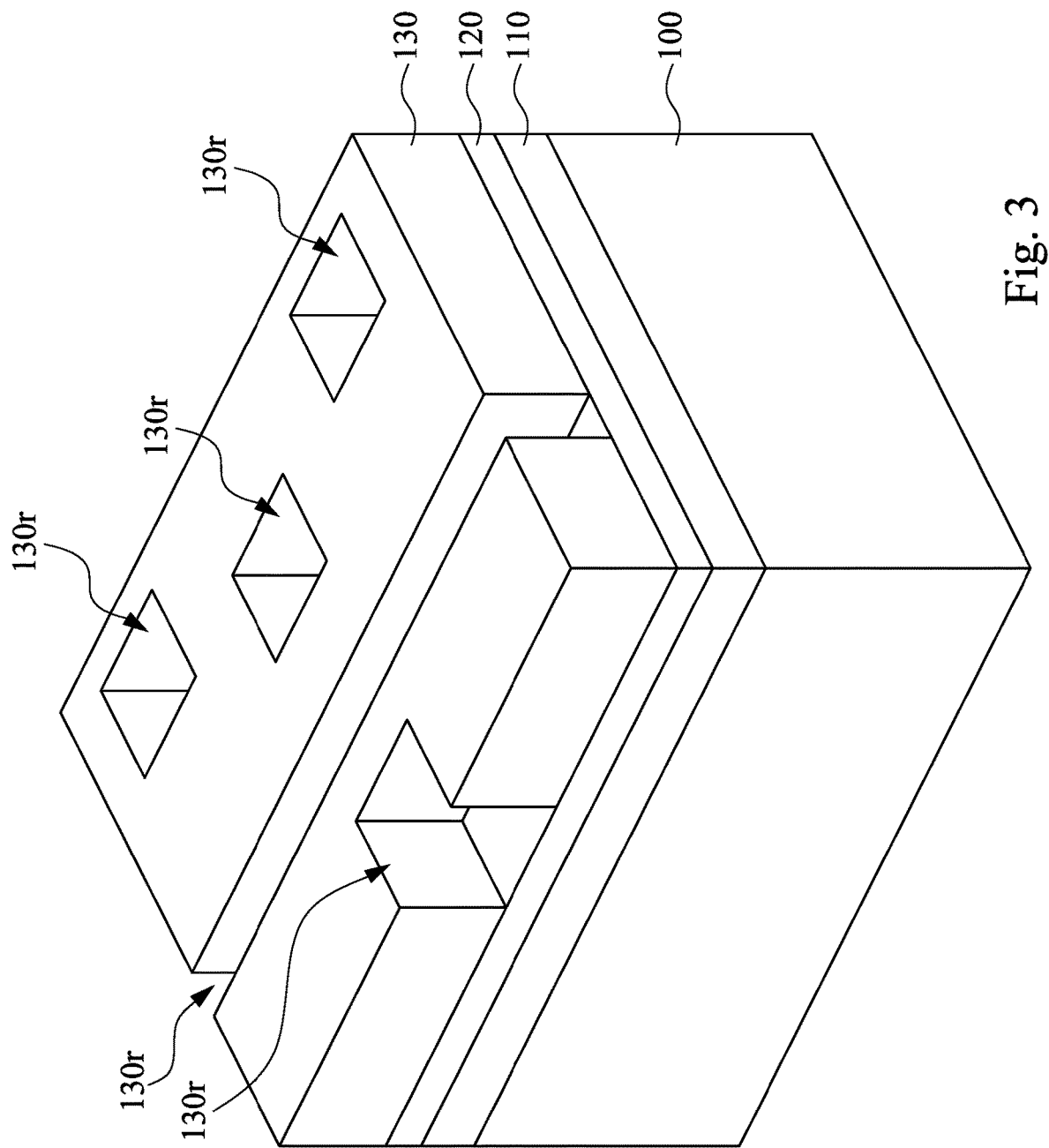

Reference is made to FIGS. 1 and 3. The method 10 proceeds to operation 12 where a patterned mask is formed over the dielectric layer. As illustrated in FIG. 3, a patterned mask 130 is formed over the dielectric layer 120, where the patterned mask 130 defines a plurality of openings 130r that expose the top surface of the dielectric layer 120. It is noted that the number and the shapes of the openings 130r illustrated in FIG. 3 are merely used to explain, and the present disclosure is not limited thereto.

In some embodiments, the mask 130 may be a photoresist. For example, the photoresist 130 is a tri-layer photoresist, with a bottom anti-reflective coating (BARC) layer, an intermediate mask layer, and a top photoresist layer (not separately illustrated within FIG. 3). However, various suitable type of photosensitive material or combination of materials may be utilized. Once the photoresist 130 has been coated on the dielectric layer 120, the photoresist 130 is patterned. In some embodiments, the photoresist 130 may be patterned by exposing a photosensitive material within the photoresist 130 (e.g., the top photoresist layer in the tri-layer photoresist) to an energy source (e.g., light) through, e.g., a reticle. The impact of the energy will cause a chemical reaction in those parts of the photosensitive material that were impacted by the energy source, thereby modifying the physical properties of the exposed portions of the photoresist such that the chemical properties of the exposed portions of the photoresist 130 are different from the chemical properties of the unexposed portions of the photoresist 130. The photoresist 130 may then be developed with, e.g., a developer, in order to separate the exposed portion of the photoresist 130 from the unexposed portion of the photoresist 130.

Figure 4:
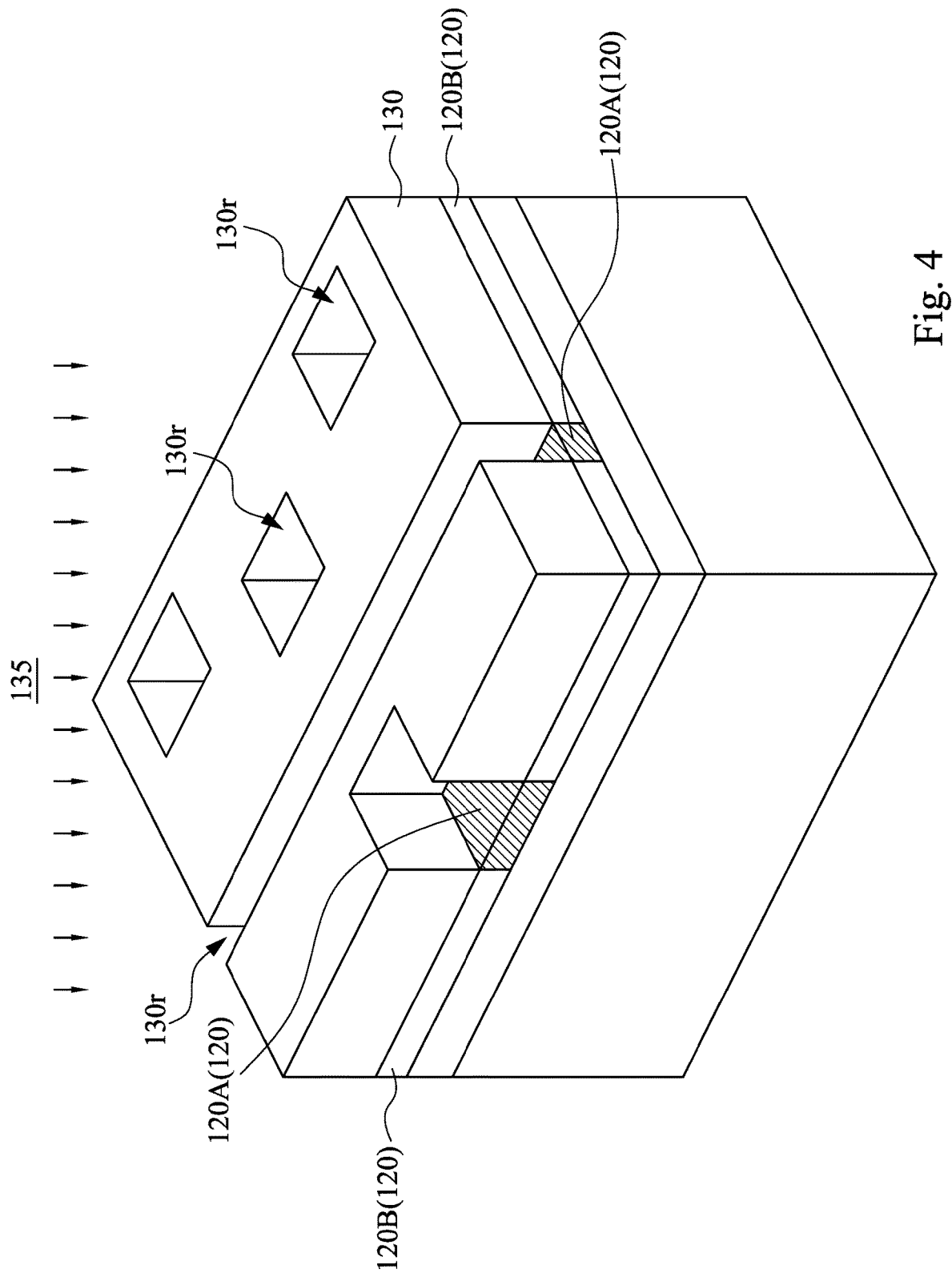

Reference is made to FIGS. 1 and 4. The method 10 proceeds to operation 13 where a plasma treatment is performed to the dielectric layer. As illustrated in FIG. 4, a plasma treatment 135 is performed to the dielectric layer 120 by using the patterned mask 130 as a mask so as to change the etching properties of different portions of the dielectric layer 120. In greater details, portions 120A of the dielectric layer 120 that are exposed from the mask 130 are subject to the plasma treatment 135, and the other portions 120B of the dielectric layer 120 are protected by the mask 130 during the plasma treatment 135.

In some embodiments where the dielectric layer 120 is made of SiOC, a helium (He) plasma may be applied in operation 13 to break parts of the Si—C bonds of the exposed portions 120A of the dielectric layer 120, because the Si—C bonds are susceptible to attack by the plasma processing. In some embodiments, the silicon (Si), carbon (C), oxygen (O), and nitrogen (N) concentrations of a SiOC dielectric layer not treated with plasma treatment are respectively about 28.9%, 16.2%, 54.6%, and 0.2%, and the Si, C, O, and N concentrations of a SiOC dielectric layer treated with plasma treatment are respectively about 28.2%, 11.8%, 59.5%, and 0.5%. That is, the plasma treatment 135 results in a reduced carbon concentration and an increased oxygen concentration, which in turn results in the treated portions 120A of the dielectric layer 120 having a higher oxygen concentration and a lower carbon concentration than the untreated portions 120B of the dielectric layer 120. In some embodiments, He plasma may be generated with the following conditions: a He flow rate from about 500 to about 10000 sccm; a RF power of from about 5 to about 5000 Watts; a chamber pressure of about 5 mtorr to about 1000 mtorr; and a temperature of about 20° C. to about 700° C. The He plasma treatment 135 is performed for a period of about 1 to about 300 seconds.

After the plasma treatment 135, the dielectric layer 120 includes treated portions 120A with greater oxygen concentration and the untreated portions 120B with less oxygen concentration. Stated another way, the treated portions 120A have a first oxygen concentration and the untreated portions 120B have a second oxygen concentration lower than the first oxygen concentration. The oxygen concentration difference between the treated portions 120A and the untreated portions 120B results in etch selectivity between these portions 120A and 120B in the subsequent etching process (in the operation 15). In some embodiments, the etch selectivity is greater than 40 in some embodiments. That is, the etch rate of the untreated portions 120B may be greater (or lower) than 40 times the etch rate of the treated portions 120A in the following etching process.

Figure 5:
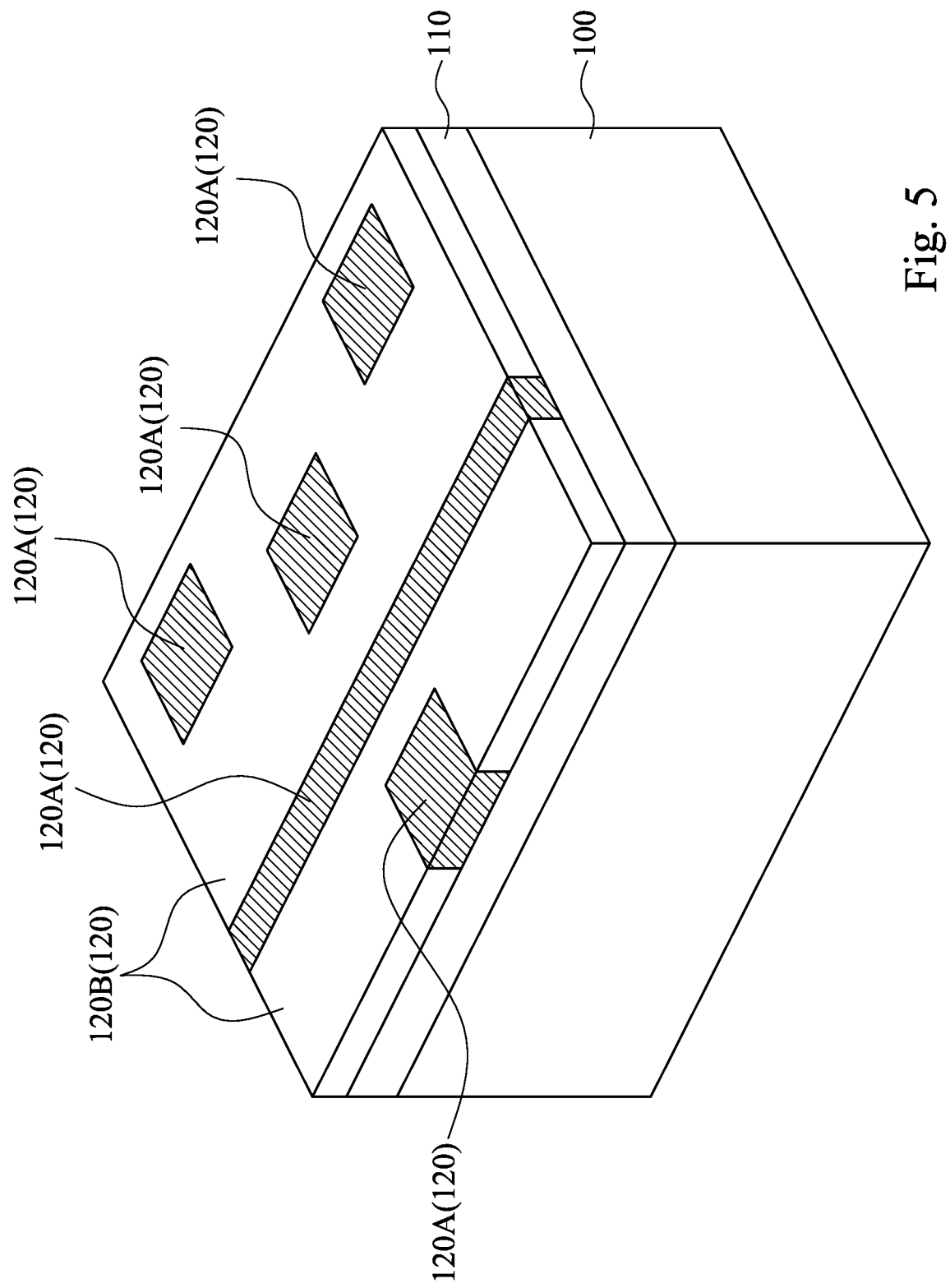

Reference is made to FIGS. 1 and 5. The method 10 proceeds to operation 14 where the patterned mask is removed. The patterned mask 130 is removed by suitable process, such as ashing, such that the untreated portions 120B of the dielectric layer 120 are exposed.

Figure 6:
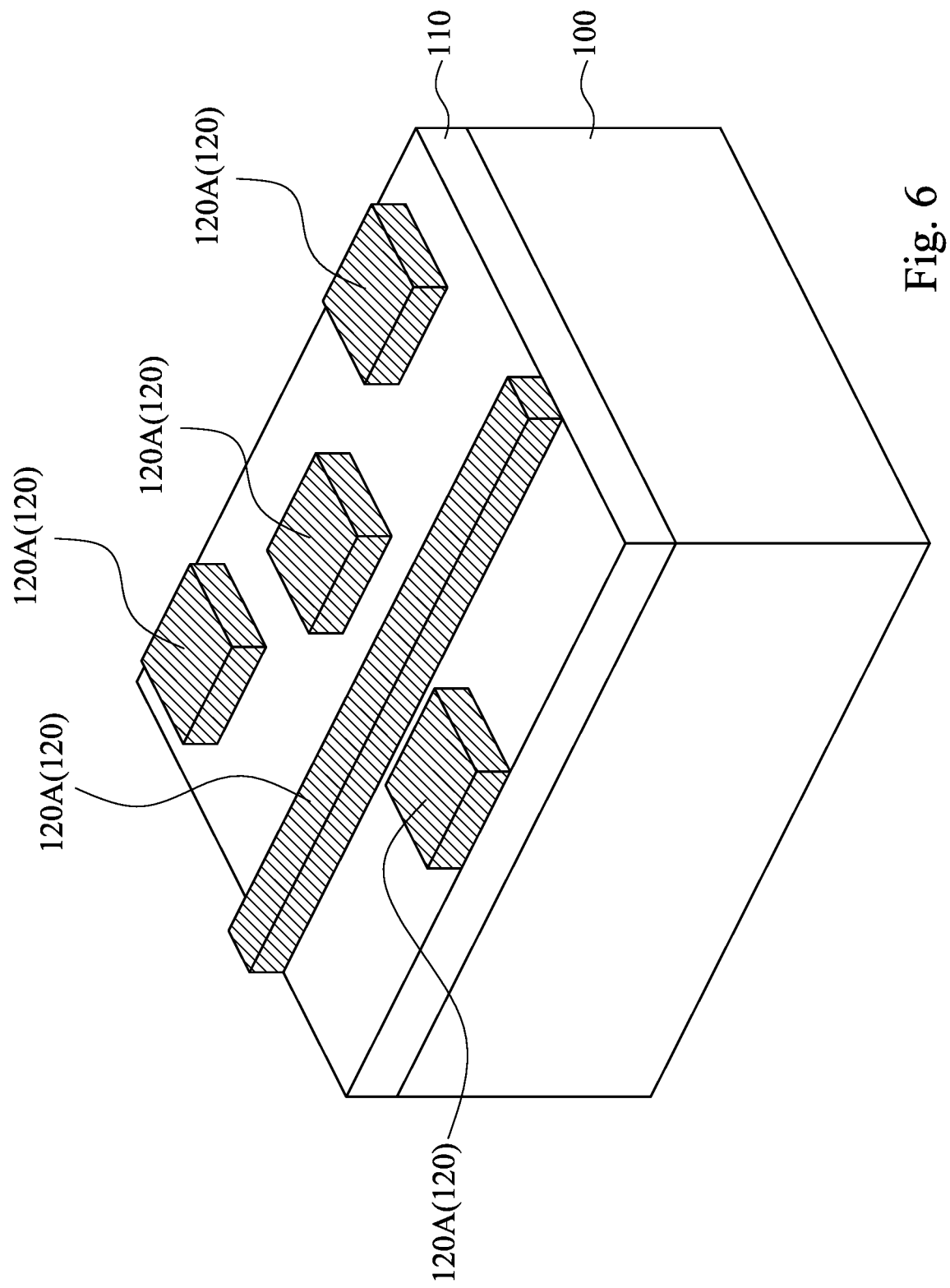

Reference is made to FIGS. 1 and 6. The method 10 proceeds to operation 15 where portions of the dielectric layer are removed. As illustrated in FIG. 6, the untreated portions 120B of the dielectric layer 120 (see FIG. 5) are selectively removed, and the treated portions 120A of the dielectric layer 120 remain on the metal layer 110. In some embodiments, after the operation 15, the treated portions 120A may have a certain loss (not shown) but still has enough thickness (i.e. about 1 nm to about 95 nm) that covers portions of the metal layer 110. In some embodiments, the treated portions 120A remain thickness that is greater than about 50 nm. In some embodiments, the selective removal may include a selective wet etching and/or dry etching with an etch selectivity between the untreated portions 120B and the treated portions 120A, such as an etch selectivity greater than 40. That is, the etch rate of the untreated portions 120B in the selective etching is greater than 40 times the etch rate of the treated portions 120A in the selective etching. In some embodiments, the selective etching process uses an etchant (e.g., $H_2$, HF, $NF_3$, and/or $NH_3$) at etching conditions of about 70° C. (about 30° C. to about 120° C. in some embodiments), pressure from about 40 mtorr to about 3000 mtorr with or without plasma.

Figure 7A:
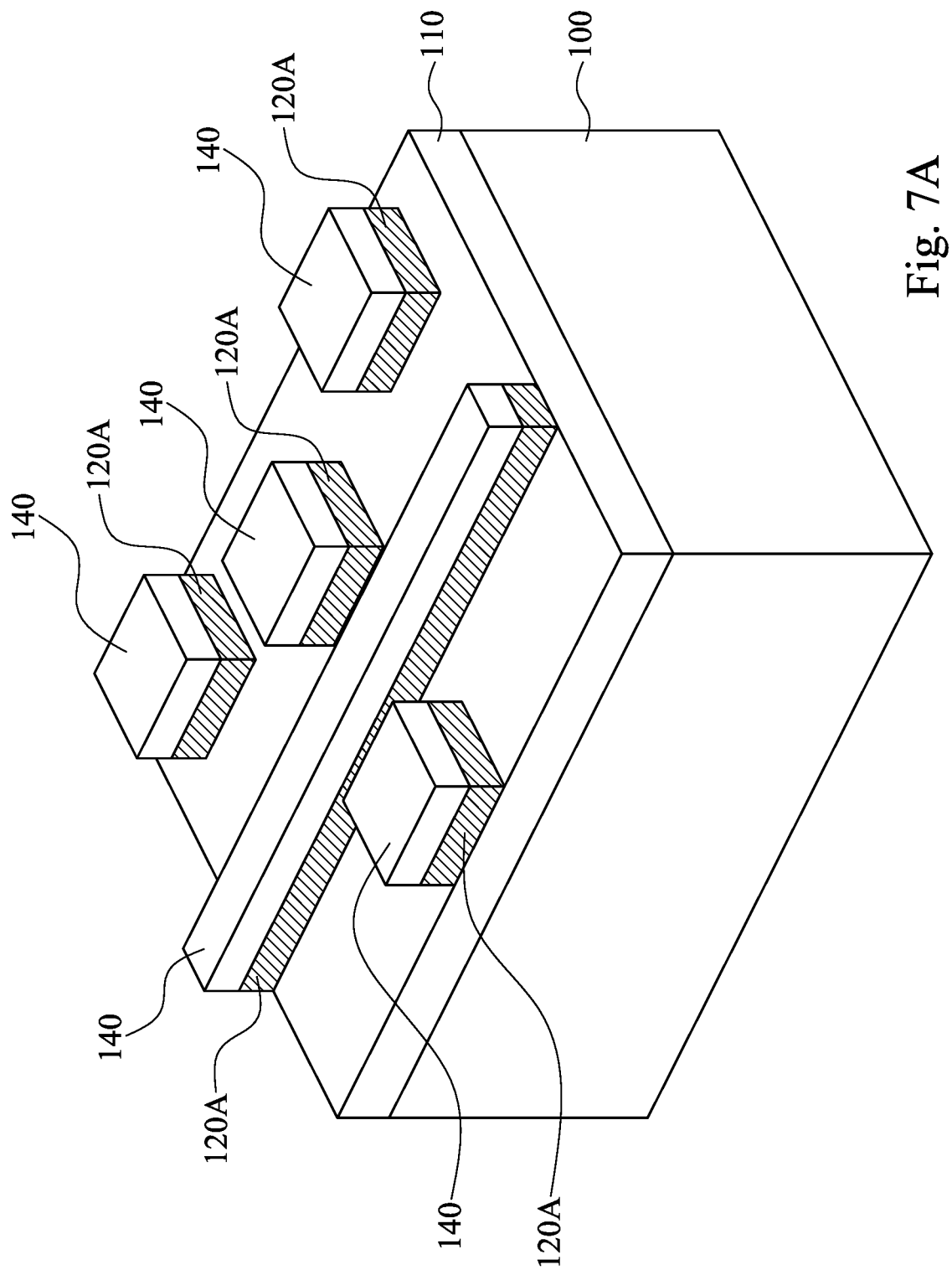
Figure 7B:
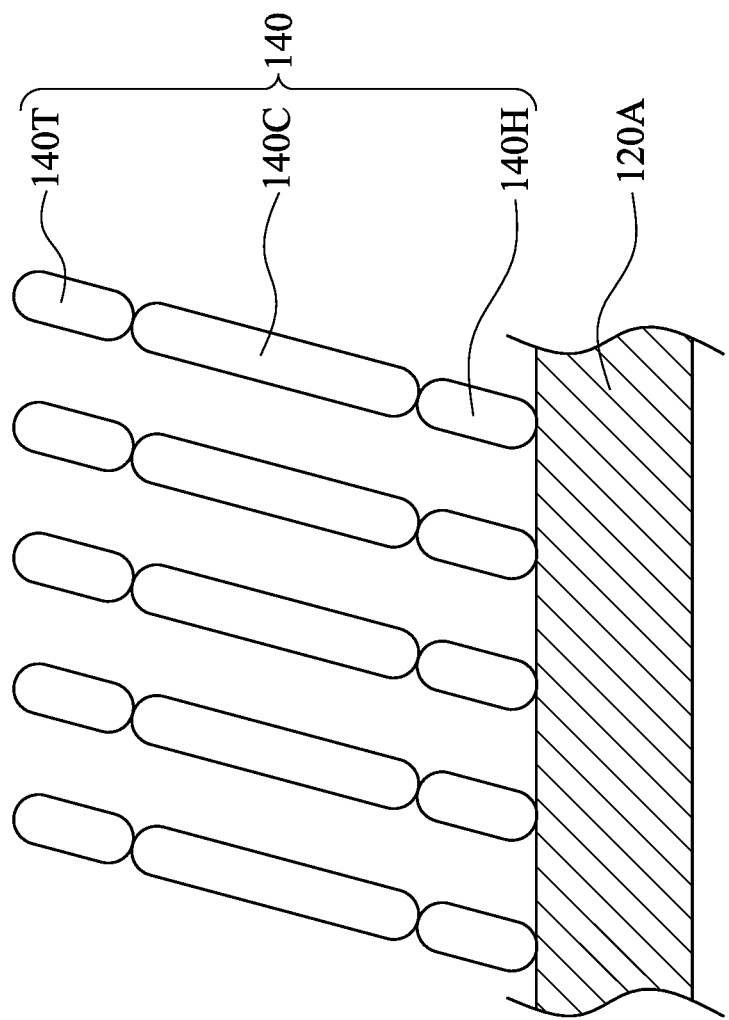

Reference is made to FIGS. 1, 7A, and 7B. The method 10 proceeds to operation 16 where inhibitors are selectively formed on the remaining dielectric layer. As illustrated in FIG. 7A, a plurality of inhibitors 140 are selectively grown on the treated portions 120A of the dielectric layer 120. That is, the inhibitors 140 cover the top surfaces of the portions 120A of the dielectric layer 120, and leave the top surface of the metal layer 110 uncovered. In some embodiments, the thickness of the inhibitor 140 may be in a range from about 1 nm to about 50 nm. In some embodiments, the thickness of the inhibitor 140 is lower than about 20 nm. The inhibitors 140 include a material that can suppress subsequent deposition on the treated portions of the dielectric layer 120. In some embodiments, the inhibitors 140 may be formed by liquid and/or vapor deposition process.

In some embodiments, the inhibitors 140 may be polymer or a self-assemble monolayer (SAM). The SAM inhibitor includes silane-type inhibitor or thiol-type inhibitor. In some embodiments, the silane-type inhibitor may be Octadecyltrichlorosilane ($CH_3(CH_2)_{17}SiCl_3$), Trichloro(1H, 1H, 2H, 2H-perfluorooctyl)silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si-NC_4H_8$), Hexamethyldisilazane ($[(CH_3)_3Si]_2NH$), or Bis(dimethylamino)dimethylsilane ($[(CH_3)_2N]_2Si(CH_3)_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, silane-type inhibitor can selectively formed on a dielectric layer, and not formed on a metal layer.

In some embodiments where the inhibitors 140 are formed of a self-assemble monolayer (SAM), the molecules of the inhibitors 140 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the head group includes alkyitrichlorosilanes (X—$(CH_2)_n$—$SiCl_3$), the head group can be bound to a surface of a dielectric material, rather than a surface of a metal. As such, the inhibitors 140 can be selectively formed (grown) on a specific surface of a dielectric material, while formation of the inhibitors 140 on the metal can be suppressed.

Reference is made to FIG. 7B. For example, the self-assemble monolayer 140 is formed on a substrate including the dielectric layer 120A. The SAM 140 includes a head group 140H connected to a terminal group 140T (i.e., functional group) by way of a molecular chain 140C (i.e., tail). The head group 140H has a hydrophilic interfacial property that attracts the SAM 140 to the dielectric layer 120A. In some embodiments, the head group 140H may include trichlorosilicon ($SiCl_3$) or trimethoxysilane (Si$(OCH_3)_3$), which provide the hydrophilic interfacial property. In some embodiments, the molecular chain 140C may include an alkyl chain, such as methylene $(CH_2)_n$, for example. The terminal group 140T has a hydrophobic interfacial property that repels metal, thereby preventing metal from adhering to the SAM 140. In some embodiments, the terminal group 140T may include a methyl group ($CH_3$), which provides the hydrophobic interfacial property.

Figure 8:
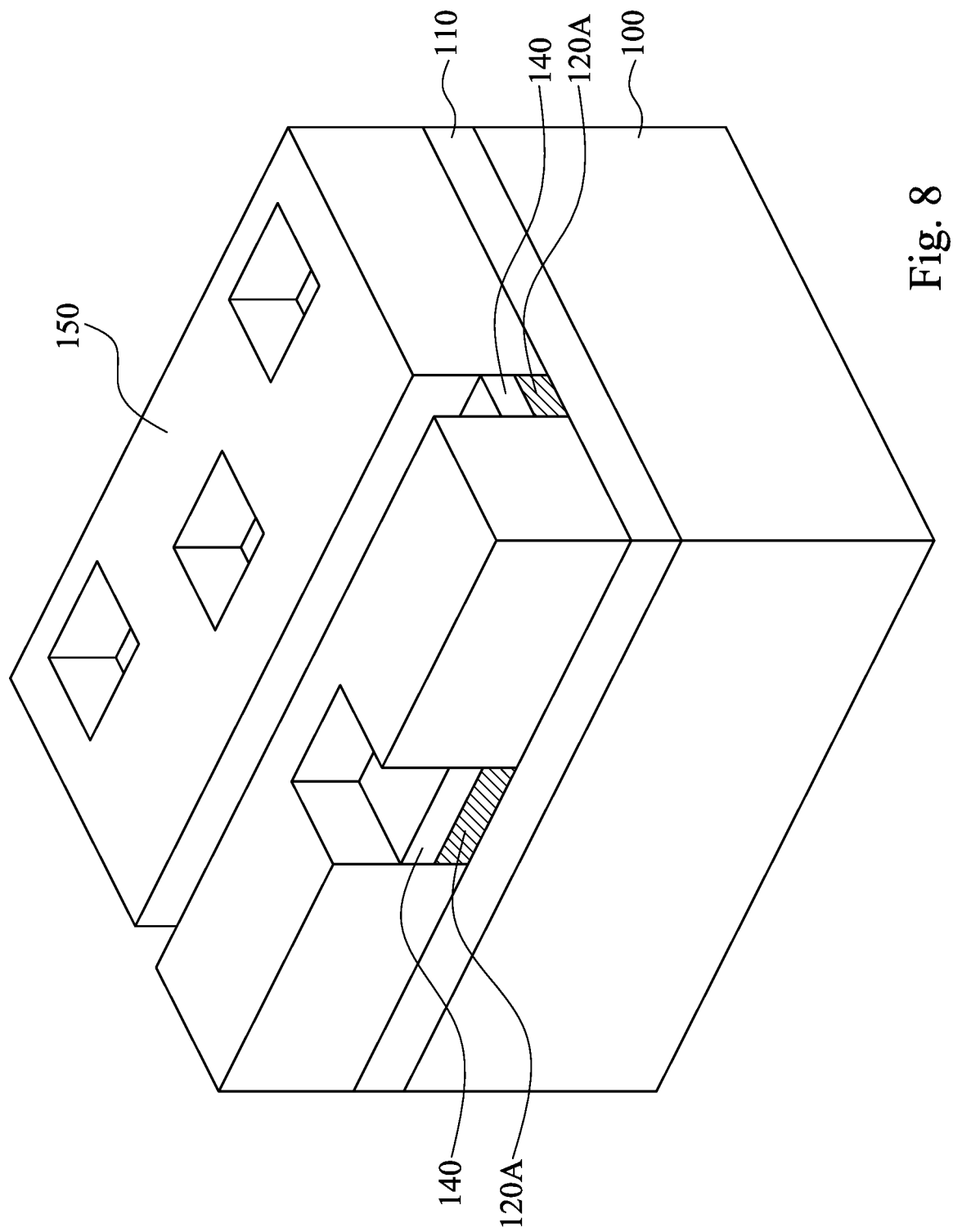

Reference is made to FIGS. 1 and 8. The method 10 proceeds to operation 17 where an area selective deposition (ASD) is performed. As illustrated in FIG. 8, the ASD process is employed to form a hard mask 150 self-aligned to the metal layer 110. The ASD process may be an area-selective atomic layer deposition (ALD) that employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles. In FIG. 8, the self-aligned hard mask 150 has a thickness which is determined by the deposition cycles of ALD processes. The precursor (and/or the reactant) in every cycle can be the same or different. In some embodiments, the self-aligned hard mask 150 can be a metal, such as W, TiN, Co, Ru, PT, or other suitable metal. In some other embodiments, the self-aligned hard mask 150 can be a dielectric, such as SiO, SiN, SiC, SiOC, SiON, SiCN, SiOCN, or the like. In some other embodiments, the self-aligned hard mask 150 can be a metal-oxide, such as be $ZrO_2$, $Al_2O_3$, $Y_2O_3$, AlON, $Yb_2O_3$, $ZrAlO_x$, $La_2O_3$, $TiO_2$, or the like.

ASD is a surface sensitive deposition process, i.e., the film growth is dependent on the material's surface characteristics. For example, the terminal groups 140T of the inhibitors 140 (see FIG. 7B) are substantially inert with the precursors of the ALD process, and the molecular chain 140C of the inhibitors 140 (see FIG. 7B) form a good coverage to block the precursors (i.e., forming steric hindrance) from reacting with the treated dielectric portions 120A. As such, the precursors are prevented from bonding to the inhibitors 140, and the hard mask 150 can be selectively formed on the metal layer 110, not on the inhibitors 140 and/or the treated dielectric portions 120A, which in turn results in the hard mask 150 self-aligned to the metal layer 110.

Due to the material properties as mentioned above, precursors of the ASD process have a tendency not to adhere to the surface of the inhibitors 140. In this way, the precursors of the ASD process have high selectivity between the inhibitors 140 and the metal layer 110. Specifically, the ASD process has selectivity for the metal layer 110 with respect to the inhibitors 140. As such, by forming the inhibitors 140, the deposition rate of the hark mask 150 over the dielectric layer 120A (under the inhibitors 140) can be suppressed. Thus, during the ASD process, the self-aligned hark mask 150 is formed over the metal layer 110, while leaving the top surface of the inhibitors 140 uncovered. In other words, the self-aligned hark mask 150 may not be formed on the inhibitors 140 that covers the treated dielectric portions 120A. In some embodiments where the ASD process is an area-selective ALD process, the ALD process may include plural reaction cycles to form a desired thickness of the self-aligned hark mask 150.

As discussed above, the metal layer 110 is a blanket layer covering an entirety of the underlying structure 100, and thus the selective deposition of the hard mask 150 will not be affected by materials of the underlying structure 100, and will be self-aligned to desired regions of the underlying structure 100 as long as these regions are free from coverage by the inhibitors 140 (or treated dielectric portions 120A in some embodiments). Moreover, since the treated dielectric portions 120A are formed in a pattern corresponding to a pattern of the mask 130 as illustrated in FIG. 4, the self-aligned hard mask 150 that does not cover the treated dielectric portions 120A has a pattern corresponding to the pattern of the mask 130 in nature, without employing additional etching processes. On the contrary, if the hard mask is patterned using photolithography and etching techniques, a patterned photoresist layer is formed on the hard mask and acts as a mask for etching the hard mask. However, the total thickness of the photoresist layer and the hard mask would lead to a high aspect ratio etching condition, which in turn leads to a poor process window and difficulty in etching. As such, a hard mask, which is patterned by photolithography and etching techniques, would be unsatisfactory for a scaled down device. However, in some embodiments of the present disclosure, because the deposition of the hard mask 150 results in a desired pattern in nature without undergoing a photolithography process and an etching process, the concern about the increased aspect ratio and the unsatisfactory pattern of the hard mask can be eased. Moreover, in some embodiments where the ASD is an ALD process, the thickness of the hard mask 150 can be controlled precisely to achieve a desirable low aspect ratio of the openings in the hard mask 150, which in turn facilitates subsequent etching and deposition processes.

Figure 9:
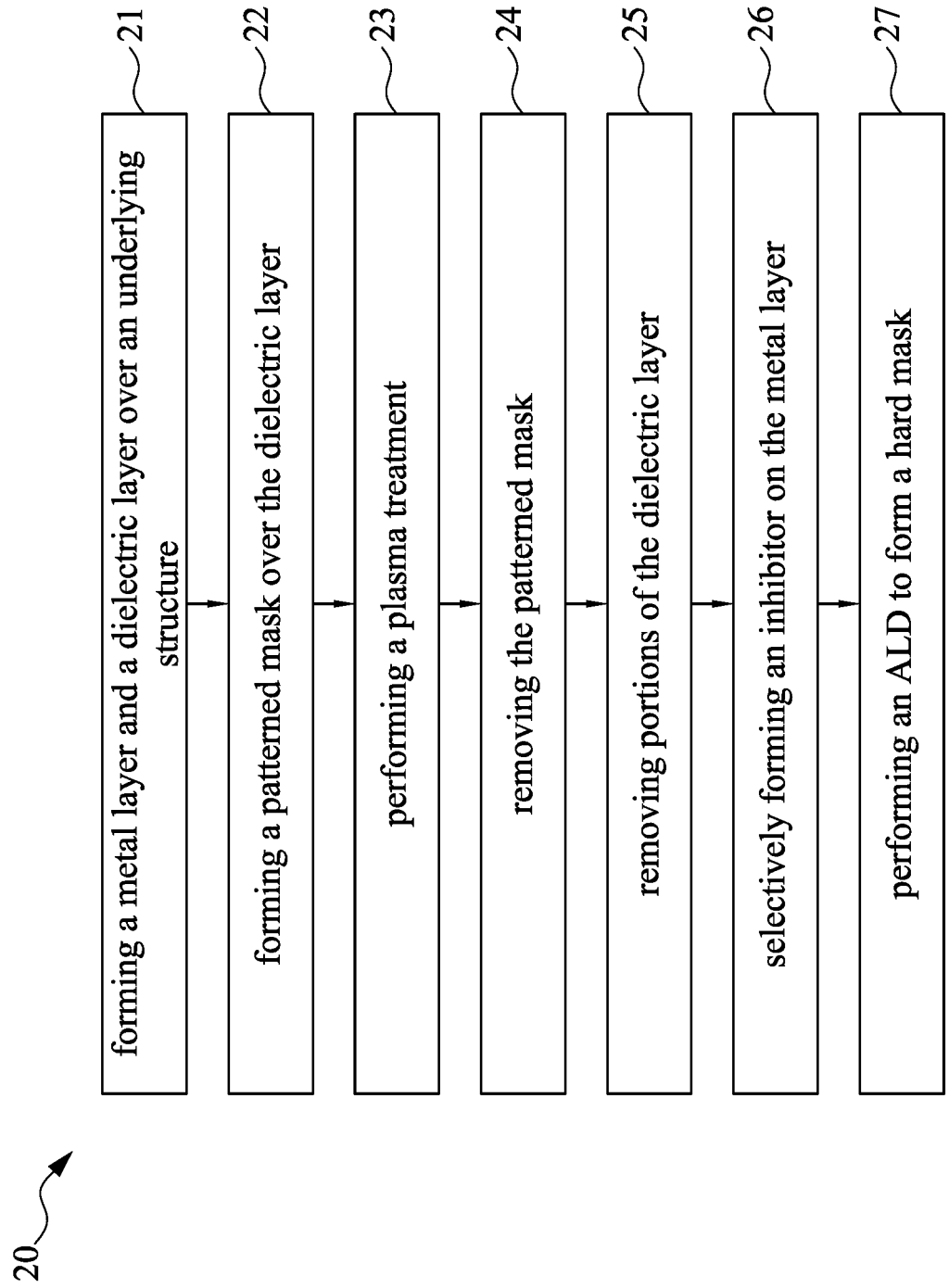
FIG. 9 is a flow chart of a method of manufacturing a semiconductor structure in accordance with some embodiments of the present disclosure.

FIG. 9 is a flow chart of a method of manufacturing a semiconductor structure in accordance with some embodiments of the present disclosure. FIGS. 10 to 16 illustrate a semiconductor structure at various stages according to aspects of the method of FIG. 9.

Figure 10:
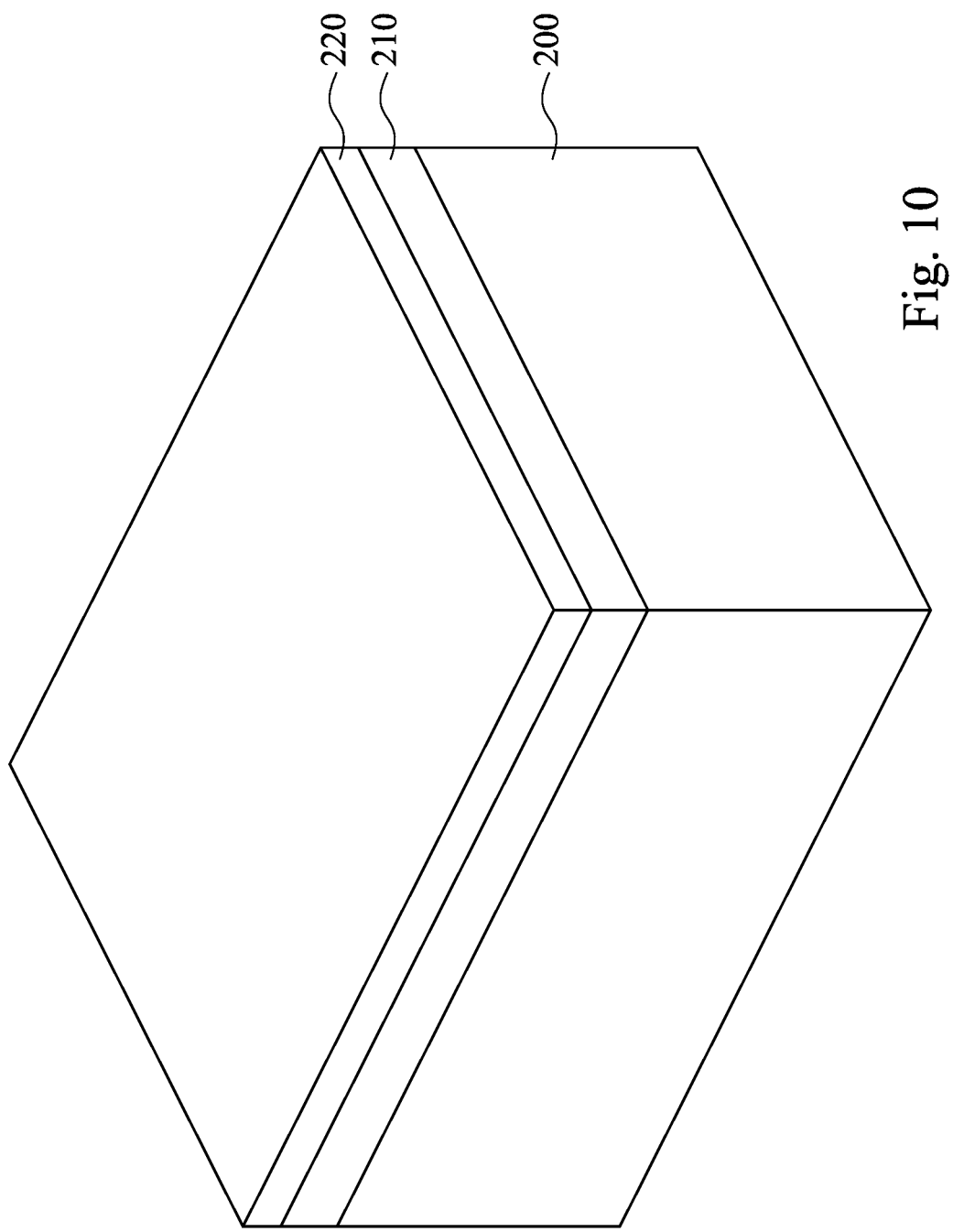
FIGS. 10 to 16 illustrate a semiconductor structure at various stages according to aspects of the method of FIG. 9.

Reference is made to FIGS. 9 and 10. The method 20 begins at operation 21 where a metal layer and a dielectric layer are formed over an underlying structure. As illustrated in FIG. 10, a metal layer 210 is formed over an underlying structure 200, and a dielectric layer 220 is then formed over the metal layer 210. In some embodiments, the underlying structure 200 used herein can be, for example, fin structures, gate structures, metal wirings, and/or combination thereof. The detailed illustrations of the underlying structures 200 and/or any additional elements are simplified are omitted in FIGS. 10-17. In some other embodiments, the underlying structure 200 includes semiconductor devices, such as transistors, formed on a semiconductor substrate in certain embodiments. The semiconductor devices used herein may include, for example, a CMOS semiconductor device. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc. In some embodiments, the exemplary devices include a plurality of semiconductor devices (e.g., transistors), including PFETs, NFETs, etc., which may be interconnected.

The metal layer 210 may include W, TiN, Co, Ru, Pt, and/or other suitable materials. The metal layer 210 may be formed by suitable process, such as CVD, PVD, or ALD. The dielectric layer 220 may include SiO, SiN, SiC, SiOC, SiON, SiCN, SiOCN, and/or other suitable materials. The dielectric layer 220 may be formed by suitable process, such as CVD, PVD, or ALD.

Figure 11:
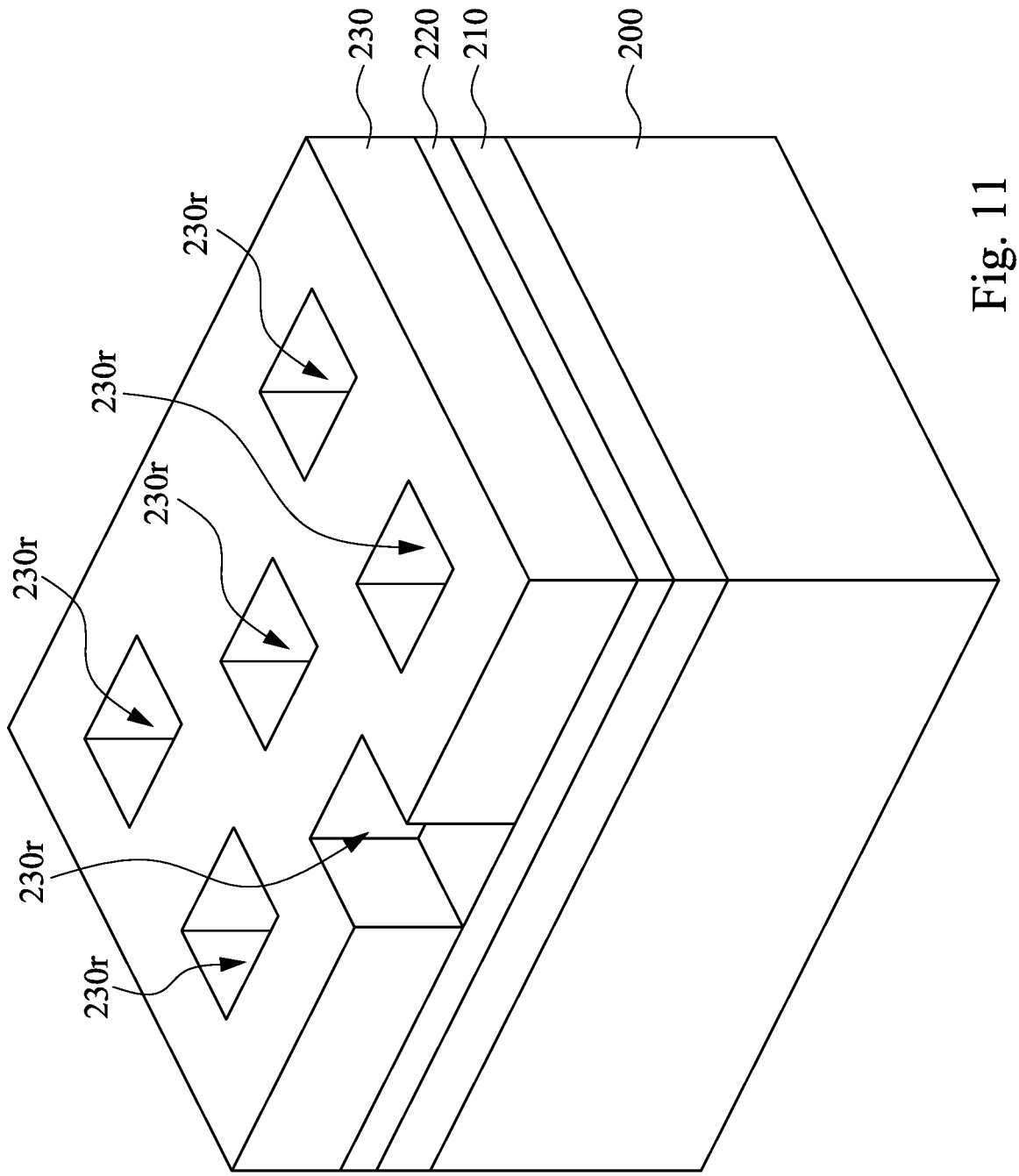

Reference is made to FIGS. 9 and 11. The method 20 proceeds to operation 22 where a patterned mask is formed over the dielectric layer. As illustrated in FIG. 11, a patterned mask 230 having a plurality of opening 230r is formed over the dielectric layer 220, where the patterned mask 230 covers a portion of the dielectric layer 220, while keeps another portion of the dielectric layer 220 exposed through the openings 230r. It is noted that the shapes of the mask 230 illustrated in FIG. 11 are merely used to explain, and the present disclosure is not limited thereto.

In some embodiments, the mask 230 may be a photoresist. For example, the photoresist 230 is a tri-layer photoresist, with a bottom anti-reflective coating (BARC) layer, an intermediate mask layer, and a top photoresist layer (not separately illustrated within FIG. 11). However, any suitable type of photosensitive material or combination of materials may be utilized. Once the photoresist 230 has been coated on the dielectric layer 220, the photoresist 230 is patterned using suitable photolithography techniques. In some embodiments, the photoresist 230 may be patterned by exposing a photosensitive material within the photoresist 230 (e.g., the top photoresist layer in the tri-layer photoresist) to an energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the photoresist 230 are different from the physical properties of the unexposed portions of the photoresist 230. The photoresist 230 may then be developed with, e.g., a developer, in order to separate the exposed portion of the photoresist 230 from the unexposed portion of the photoresist 230.

Figure 12:
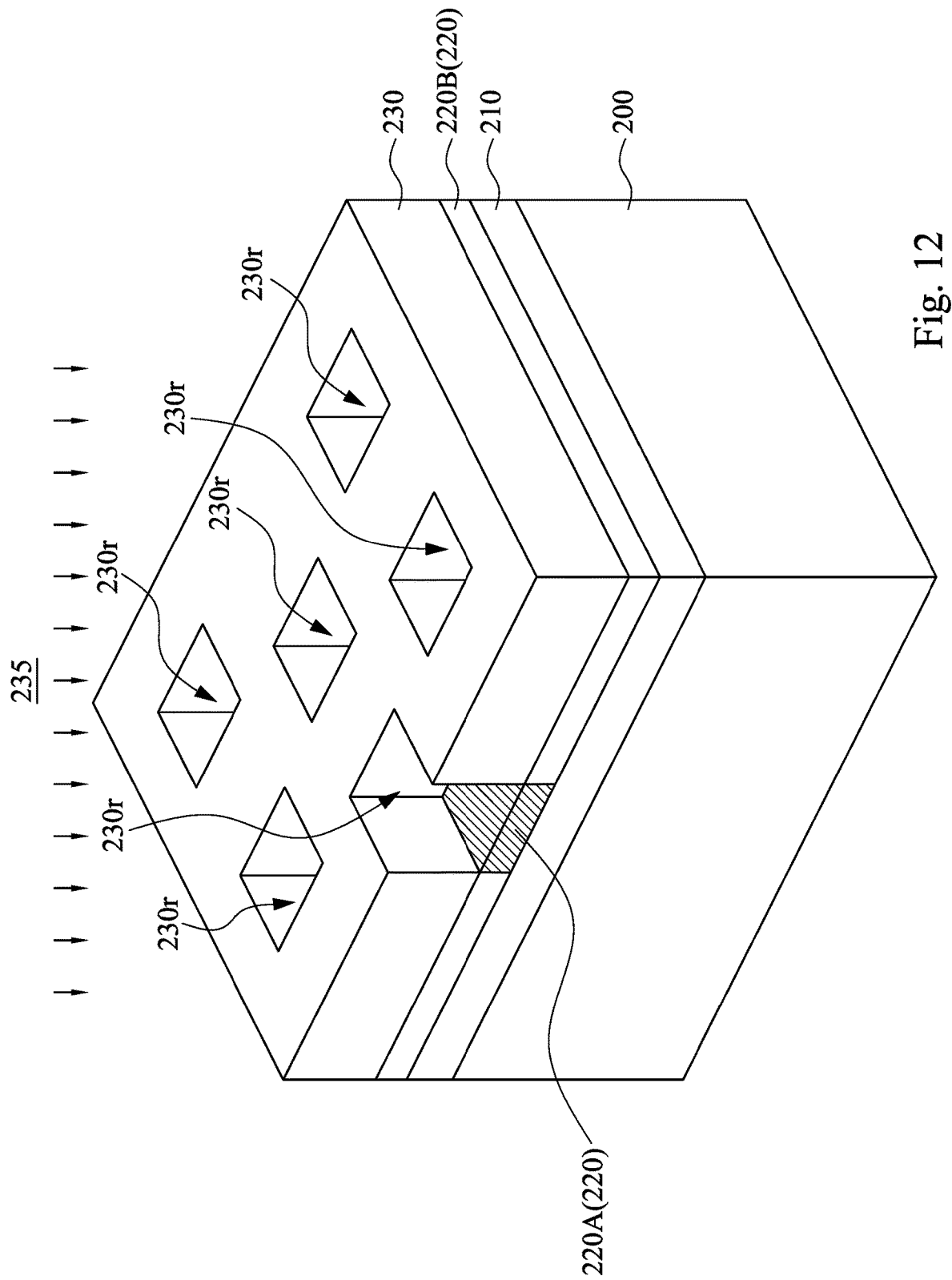

Reference is made to FIGS. 9 and 12. The method 20 proceeds to operation 23 where a plasma treatment is performed to the dielectric layer. As illustrated in FIG. 12, a plasma treatment 235 is performed to the dielectric layer 220 by using the patterned mask 230 as a mask so as to change the etching properties of different portions of the dielectric layer 220. In greater details, portions 220A of the dielectric layer 220 that is exposed from the mask 230 is subject to the plasma treatment 235, and the other portions 220B of the dielectric layer 220 are protected by the mask 230 during the plasma treatment 235.

In some embodiments where the dielectric layer 220 is made of SiOC, a helium (He) plasma may be applied to break parts of the Si—C bonds of the exposed portions 220A of the dielectric layer 220, because the Si—C bonds are susceptible to attack by the plasma processing. In some embodiments, the silicon (Si), carbon (C), oxygen (O), and nitrogen (N) concentrations of a SiOC dielectric layer not treated with plasma treatment are about 28.9%, 16.2%, 54.6%, and 0.2%, respectively, and the Si, C, O, and N concentrations of a SiOC dielectric layer treated with plasma treatment are about 28.2%, 11.8%, 59.5%, and 0.5%, respectively. That is, the plasma treatment 235 results in a reduced carbon concentration and an increased oxygen concentration, which in turn results in the treated portions 220A of the dielectric layer 220 having a higher oxygen concentration and a lower carbon concentration than the untreated portions 220B of the dielectric layer 220. In some embodiments, He plasma may be generated with the following conditions: a He flow rate from about 500 to about 10000 sccm; a RF power of from about 5 to about 5000 Watts; a chamber pressure of about 5 mtorr to about 1000 mtorr; and a temperature of about 20° C. to about 700° C. The He plasma treatment 235 is performed for a period of about 1 to about 300 seconds.

After the plasma treatment 235, the dielectric layer 220 includes treated portions 220A with greater oxygen concentration and an untreated portion 220B with less oxygen concentration. Stated another way, the treated portions 220A have a first oxygen concentration and the untreated portion 220B have a second oxygen concentration lower than the first oxygen concentration. The oxygen concentration difference between treated portions 220A and the untreated portion 220B results in etch selectivity between these portions 220A and 220B in the subsequent etching process (in the operation 25). In some embodiments, the etch selectivity being greater than 40 in some embodiments. That is, the etch rate of the untreated portion 220B may be greater (or lower) than 40 times the etch rate of the treated portions 220A in the following etching process.

Figure 13:
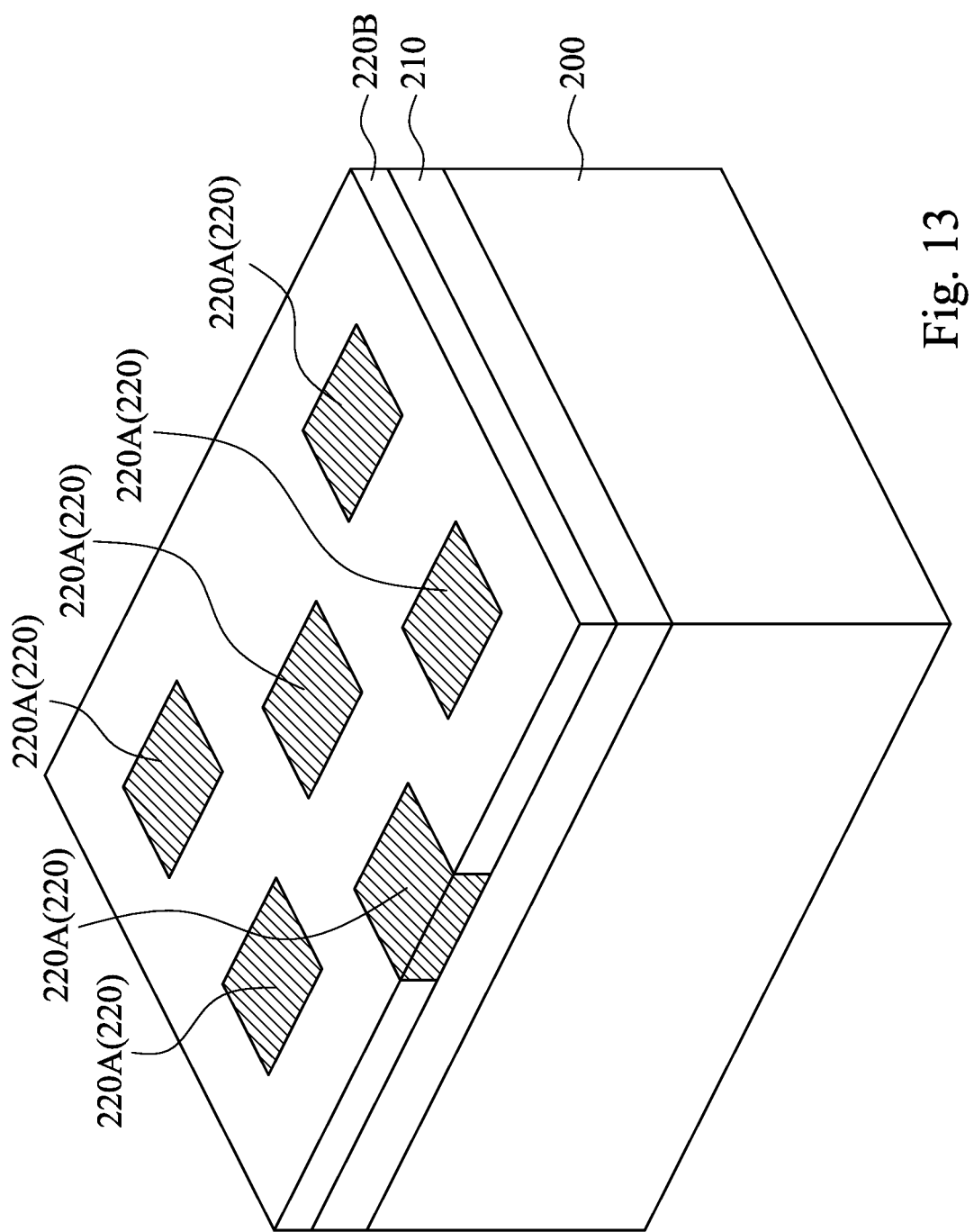

Reference is made to FIGS. 9 and 13. The method 20 proceeds to operation 24 where the patterned mask is removed. The patterned mask 230 is removed by suitable process, such as ashing, such that the portions 220B of the dielectric layer 220 are exposed.

Figure 14:
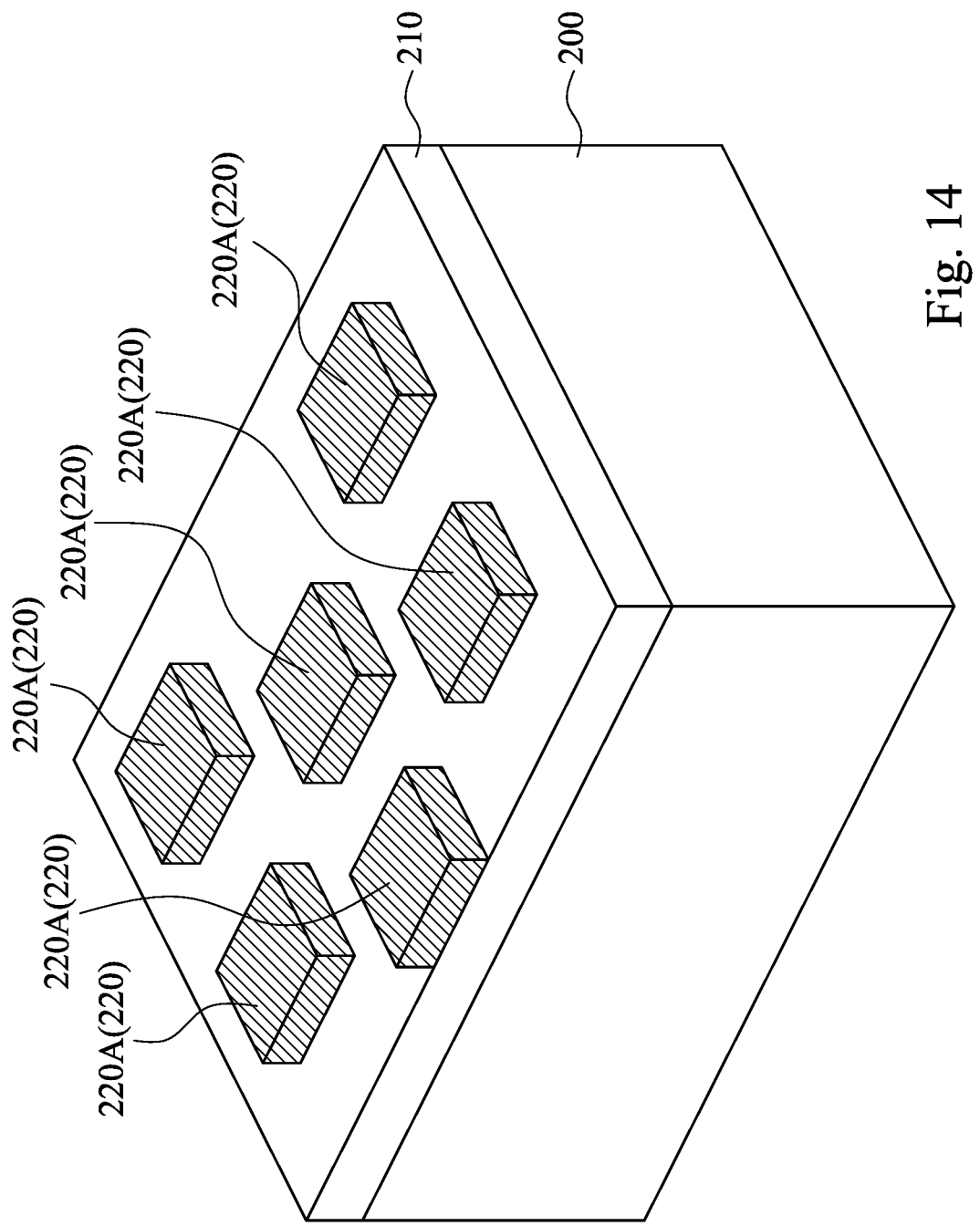

Reference is made to FIGS. 9 and 14. The method 20 proceeds to operation 25 where portions of the dielectric layer are removed. As illustrated in FIG. 14, the untreated portion 220B of the dielectric layer 220 (see FIG. 13) is selectively removed, and the treated portions 220A of the dielectric layer 220 remain on the metal layer 210. In some embodiments, after the operation 25, the treated portions 220A may have a certain loss (not shown) but still has enough thickness (i.e. about 1 nm to about 95 nm) that covers portions of the metal layer 210. In some embodiments, the treated portions 220A remain a thickness that is greater than about 50 nm. In some embodiments, the selective removal may include a selective wet etching and/or dry etching removal with an etch selectivity between the untreated portion 220B and the treated portions 220A, such as an etch selectivity greater than 40. In some embodiments, the selective etching process uses an etchant (e.g., $H_2$, HF, $NF_3$, and/or $NH_3$) at etching conditions of 70° C. (about 30° C. to about 120° C. in some embodiments), pressure from about 40 mtorr to about 3000 mtorr with or without plasma.

Figure 15A:
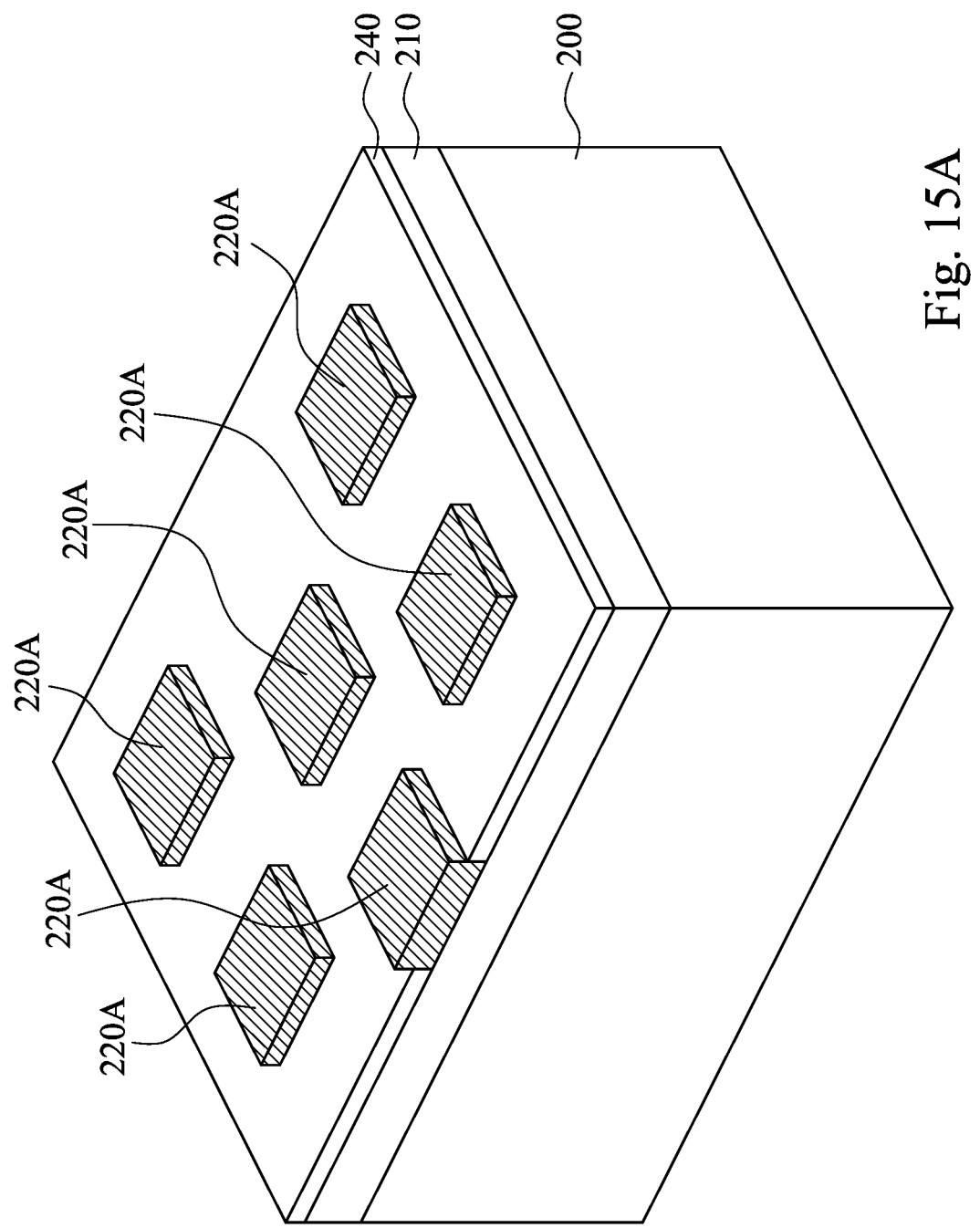
Figure 15B:
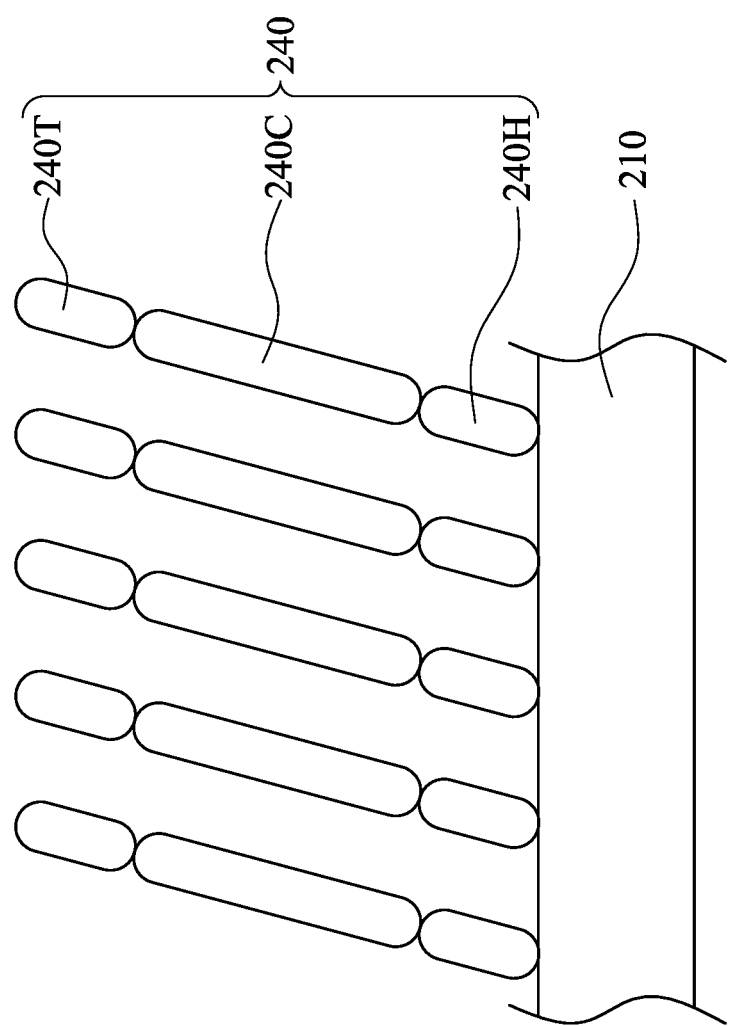

Reference is made to FIGS. 9, 15A, and 15B. The method 20 proceeds to operation 26 where inhibitors are selectively formed on the metal layer. As illustrated in FIG. 15A, an inhibitor 240 is selectively grown on the metal layer 210. That is, the inhibitor 140 covers the top surface of the metal layer 210, and leaves the top surfaces of the dielectric layers 220A uncovered. In some embodiments, the thickness of the inhibitor 240 may be in a range from about 1 nm to about 50 nm. In some embodiments, the thickness of the inhibitor 240 is lower than about 20 nm. The inhibitor 140 includes a material that can suppress deposition on the underlying metal layer 210 in a following deposition process. In some embodiments, the inhibitor 240 may be formed by liquid and/or vapor deposition process.

In some embodiments, the inhibitor 240 may be polymer or self-assemble monolayer (SAM). The SAM inhibitor includes silane-type inhibitor or thiol-type inhibitor. In some embodiments, the silane-type inhibitor may be Octadecyltrichlorosilane $(CH_3(CH_2)_{17}SiCl_3)$, Trichloro(1H, 1H, 2H, 2H-perfluorooctyl)silane $(CF_3(CF_2)_5(CH_2)_2SiCl_3)$, Dimethyldichlorosilane $((CH_3)_2SiCl_2)$/(Dimethylamino)trimethylsilane $((CH_3)_2NSi(CH_3)_3)$, 1-(Trimethylsilyl)pyrrolidine $((CH_3)_3Si—NC_4H_8)$, Hexamethyldisilazane $([(CH_3)_3Si]_2NH)$, or Bis(dimethylamino)dimethylsilane $([(CH_3)_2N]_2Si(CH_3)_2)$. In some other embodiments, the thiol-type inhibitor may be alkanethiol, propanethiol, butanethiol, hexanethiol, heptanethiol, Octadecanethiol, nonanethiol, or dodecanethiol. In some embodiments, thiol-type inhibitor can be selectively formed on a metal layer, and not formed on a dielectric layer.

In some embodiments where the inhibitor 240 is a self-assemble monolayer (SAM), the molecules of the inhibitor 240 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments where the head group includes alkanethiosls $(X—(CH_2)_n—SH)$, the head group can be bound to a surface of a metal material. As such, the inhibitor 240 can be selectively formed (grown) on the metal layer 210 and not on the dielectric layer 220A.

Reference is made to FIG. 15B. For example, the self-assemble monolayer 240 is formed on a substrate including the metal layer 210. The SAM 240 includes a head group 240H connected to a terminal group 240T (i.e., functional group) by way of a molecular chain 240C (i.e., tail). The head group 240H has a hydrophilic interfacial property that attracts the SAM 240 to the metal layer 210. In some embodiments, the head group 240H may include sulfhydryl or thiol, which provide the hydrophilic interfacial property.

In some embodiments, the molecular chain 240C may include an alkyl chain, such as methylene $(CH_2)_n$, for example. The terminal group 240T has a hydrophobic interfacial property that repels metal, thereby preventing metal from adhering to the SAM 240. In some embodiments, the terminal group 240T may include a methyl group $(CH_3)$, which provides the hydrophobic interfacial property.

Figure 16:
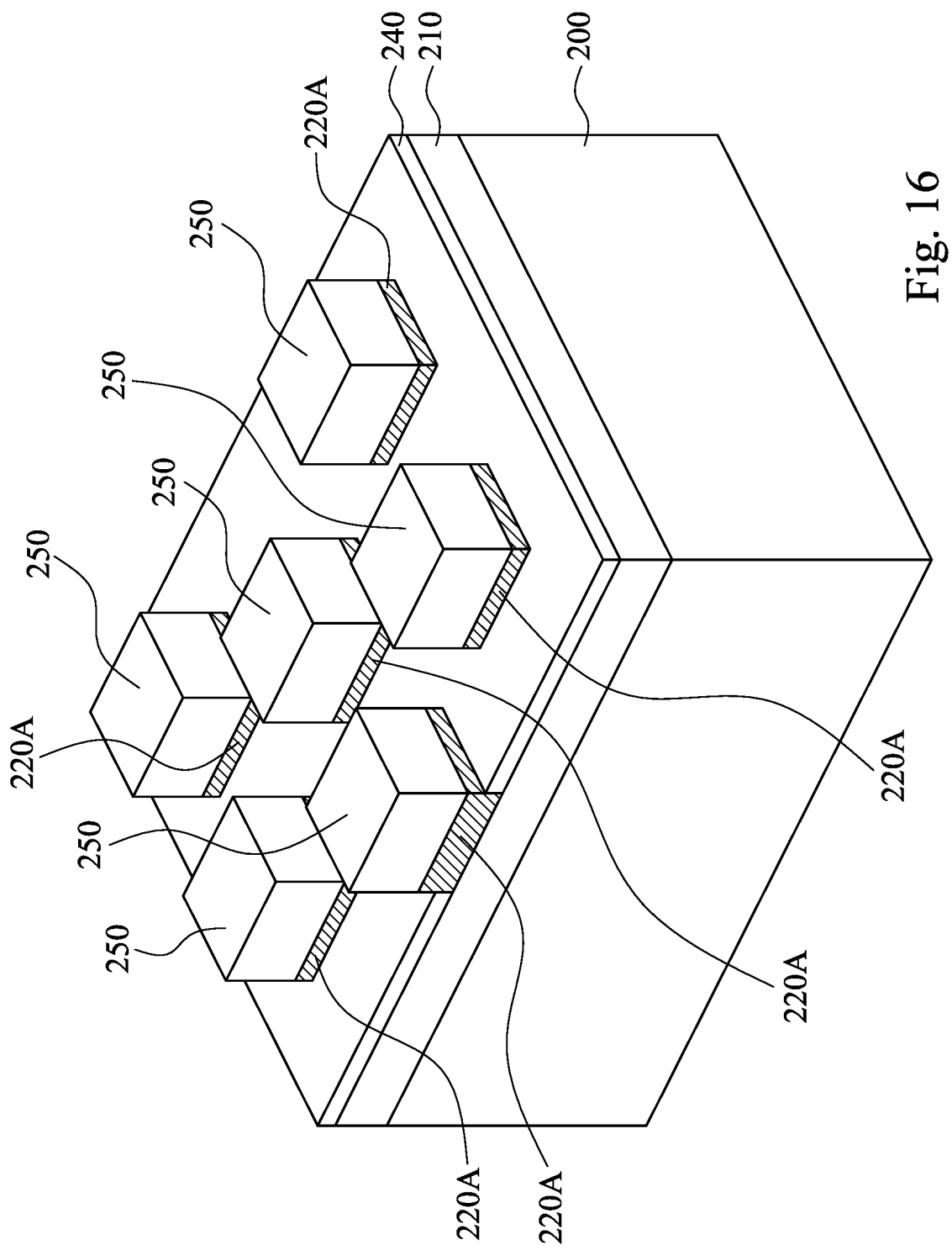

Reference is made to FIGS. 9 and 16. The method 20 proceeds to operation 27 where an area selective deposition (ASD) is performed. As illustrated in FIG. 16, the ASD process is employed to form a self-aligned hard mask 250 over the underlying structure 200. The ASD process may be an area-selective atomic layer deposition (ALD) that employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles. In FIG. 16, the self-aligned hard mask 250 has a thickness which is determined by the deposition cycles of ALD processes. The precursor (and/or the reactant) in every cycle can be the same or different. In some embodiments, the self-aligned hard mask 250 can be a metal, such as W, TiN, Co, Ru, PT, or other suitable metal. In some other embodiments, the self-aligned hard mask 250 can be a dielectric, such as SiO, SiN, SiC, SiOC, SiON, SiCN, SiOCN, or the like. In some other embodiments, the self-aligned hard mask 250 can be a metal-oxide, such as be $ZrO_2$, $Al_2O_3$, $Y_2O_3$, AlON, $Yb_2O_3$, $ZrAlO_x$, $La_2O_3$, $TiO_2$, or the like.

ASD is a surface sensitive deposition process, i.e., the film growth is dependent on the material's surface characteristics. For example, the terminal groups 240T of the inhibitor 240 (see FIG. 15B) are substantially inert with the precursors of the ALD process, and the molecular chain 240C of the inhibitors 240 (see FIG. 15B) form a good coverage to block the precursors (i.e., forming steric hindrance) from reacting with the metal layer 210. As such, the precursors are prevented from bonding to the inhibitor 240, and the hard mask 250 can be selectively formed on the dielectric layer 220A, not on the inhibitors 240 and/or the metal layer 210, which in turn results in the hard mask 250 self-aligned to the dielectric layer 220A.

Due to the material properties as mentioned above, precursors of the ALD process have a tendency not to adhere to the surface of the inhibitor 240. In this way, the precursors of the ASD process have high selectivity between the inhibitor 240 and the dielectric layer 220A. Specifically, the ASD process has selectivity for the dielectric layer 220A with respect to the inhibitor 240. As such, by forming the inhibitor 240, the deposition rate of the hard mask 250 over the portion of the metal layer 210 covered by the inhibitor 240 can be suppressed. Thus, during the ASD process, the self-aligned hark mask 250 is formed over the dielectric layer 220A while leaving the top surface of the inhibitor 240 uncovered. In other words, the self-aligned hark mask 250 may not be formed on the inhibitor 240 that covers the metal layer 210. In some embodiments where the ASD process is an area-selective ALD process, the ALD process may include plural reaction cycles to form a desired thickness of the self-aligned hark mask 250.

As discussed above, the metal layer 210 is a blanket layer covering an entirety of the underlying structure 200, and thus the selective deposition of the hard mask 250 will not be affected by materials of the underlying structure 200, and will be self-aligned to desired regions of the underlying structure 200 as long as these regions are free from coverage by the inhibitor 240. Moreover, since the treated dielectric portions 220A are formed in a pattern corresponding to a pattern of the mask 230 as illustrated in FIG. 12, the self-aligned hard mask 250 that does not cover the inhibitor 240 has a pattern corresponding to the pattern of the mask 230 in nature, without employing additional etching processes. On the contrary, if the hard mask is patterned using photolithography and etching techniques, a patterned photoresist layer is formed on the hard mask and acts as a mask for etching the hard mask. However, the total thickness of the photoresist layer and the hard mask would lead to a high aspect ratio etching condition, which in turn leads to a poor process window and difficulty in etching. As such, a hard mask, which is patterned by photolithography and etching techniques, would be unsatisfactory for a scaled down device. However, in some embodiments of the present disclosure, because the deposition of the hard mask 250 results in a desired pattern in nature without undergoing a photolithography process and an etching process, the concern about the increased aspect ratio and the unsatisfactory pattern of the hard mask can be eased. Moreover, in some embodiments where the ASD is an ALD process, the thickness of the hard mask 250 can be controlled precisely to achieve a desirable low aspect ratio of the openings in the hard mask 250, which in turn facilitates subsequent etching and deposition processes.

Figure 17:
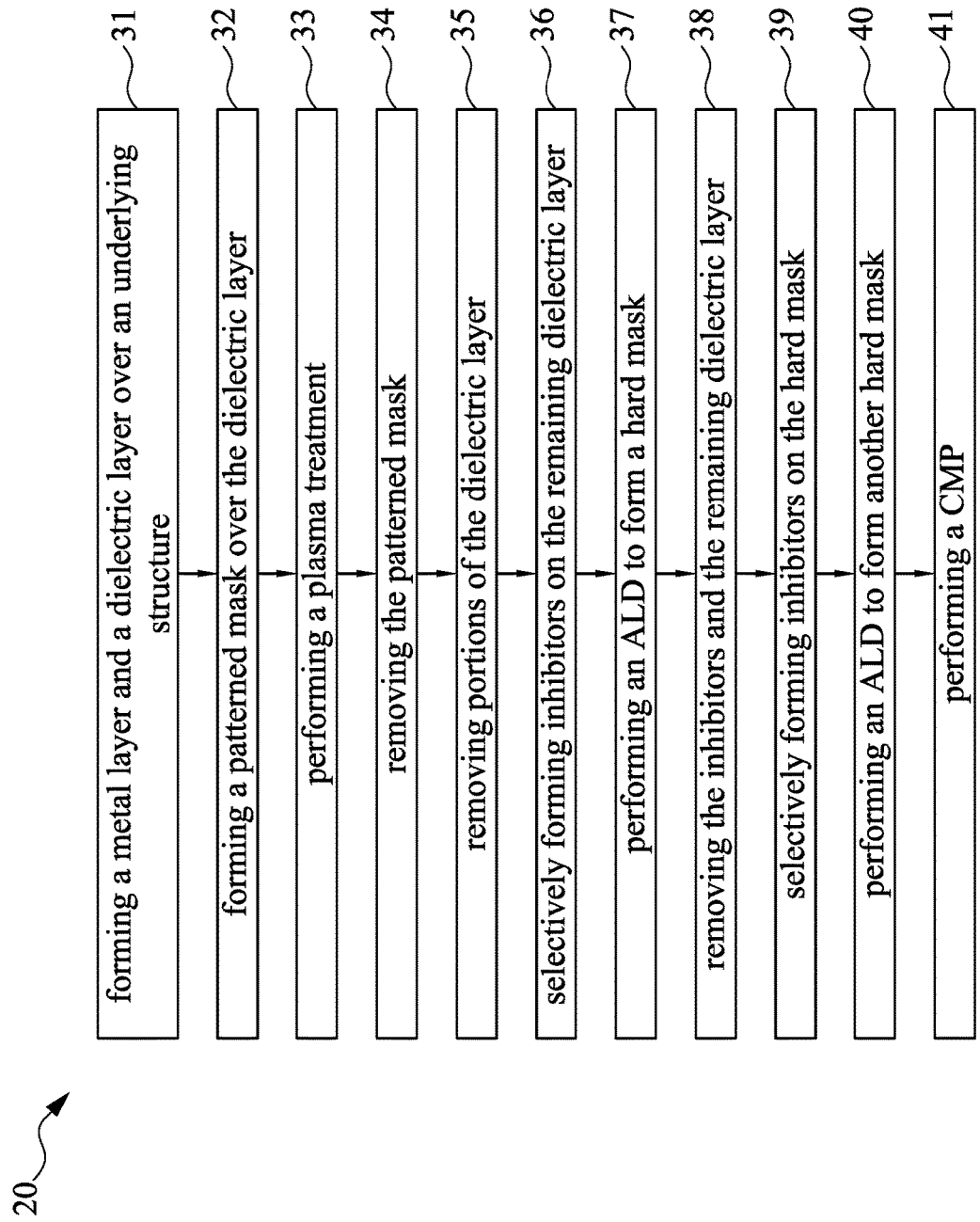
FIG. 17 is a flow chart of a method of manufacturing a semiconductor structure in accordance with some embodiments of the present disclosure.

FIG. 17 is a flow chart of a method of manufacturing a semiconductor structure in accordance with some embodiments of the present disclosure. FIGS. 18 to 28 illustrate a semiconductor structure at various stages according to aspects of the method of FIG. 17.

Figure 18:
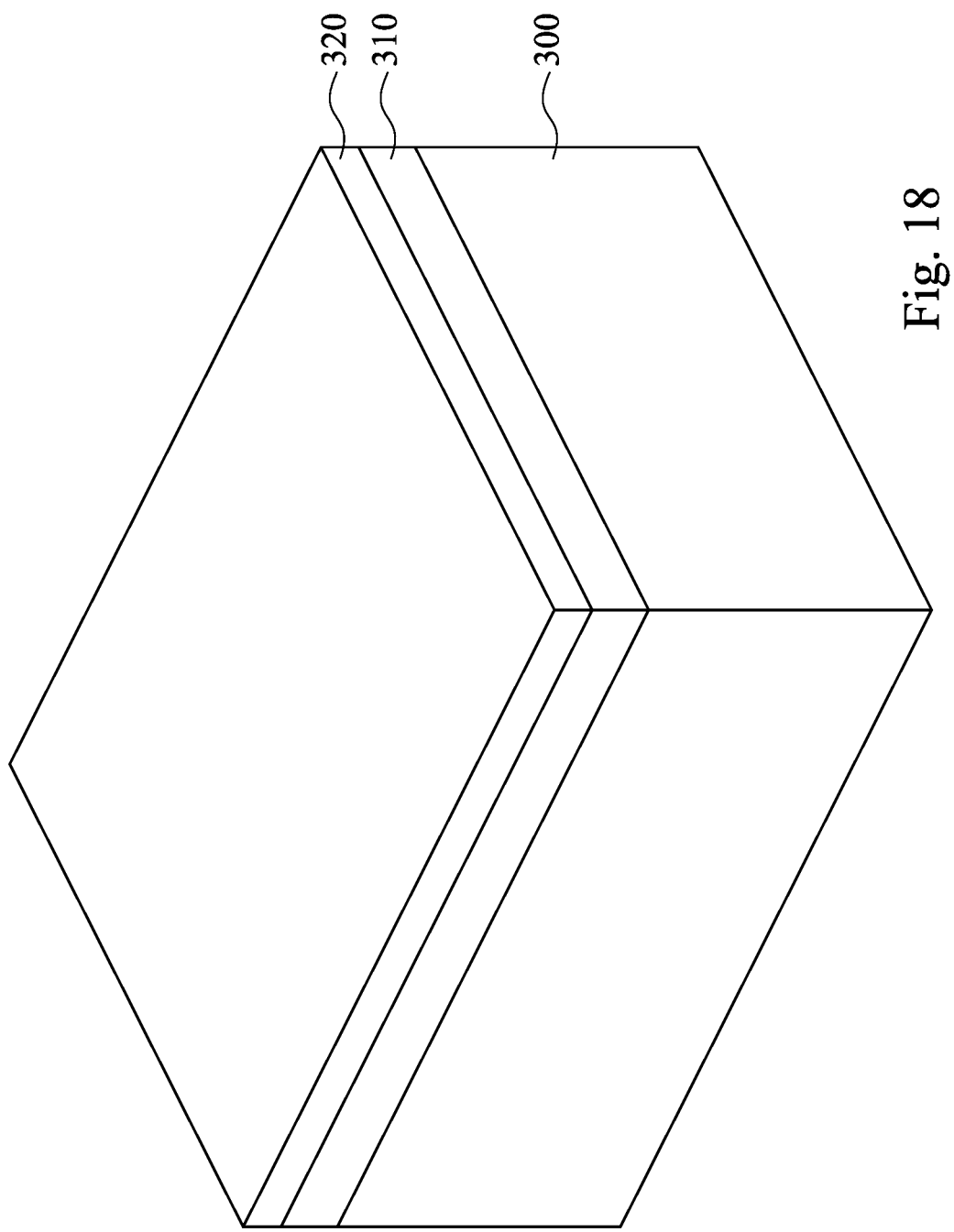
FIGS. 18 to 28 illustrate a semiconductor structure at various stages according to aspects of the method of FIG. 17.

Reference is made to FIGS. 17 and 18. The method 30 begins at operation 31 where a metal layer and a dielectric layer are formed over an underlying structure. As illustrated in FIG. 18, a metal layer 310 is formed over an underlying structure 300, and a dielectric layer 320 is then formed over the metal layer 310. In some embodiments, the underlying structure 300 used herein can be, for example, fin structures, gate structures, metal wirings, and/or combination thereof. The detailed illustrations of the underlying structures 300 and/or any additional elements are simplified are omitted in FIGS. 18-28. In some other embodiments, the underlying structure 300 includes semiconductor devices, such as transistors, formed on a semiconductor substrate in certain embodiments. The semiconductor devices used herein may include, for example, a CMOS semiconductor device. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc. In some embodiments, the exemplary devices include a plurality of semiconductor devices (e.g., transistors), including PFETs, NFETs, etc., which may be interconnected.

The metal layer 310 may include W, TiN, Co, Ru, Pt, and/or other suitable materials. The metal layer 310 may be formed by suitable process, such as CVD, PVD, or ALD. The dielectric layer 320 may include SiO, SiN, SiC, SiOC, SiON, SiCN, SiOCN, and/or other suitable materials. The dielectric layer 320 may be formed by suitable process, such as CVD, PVD, or ALD.

Figure 19:
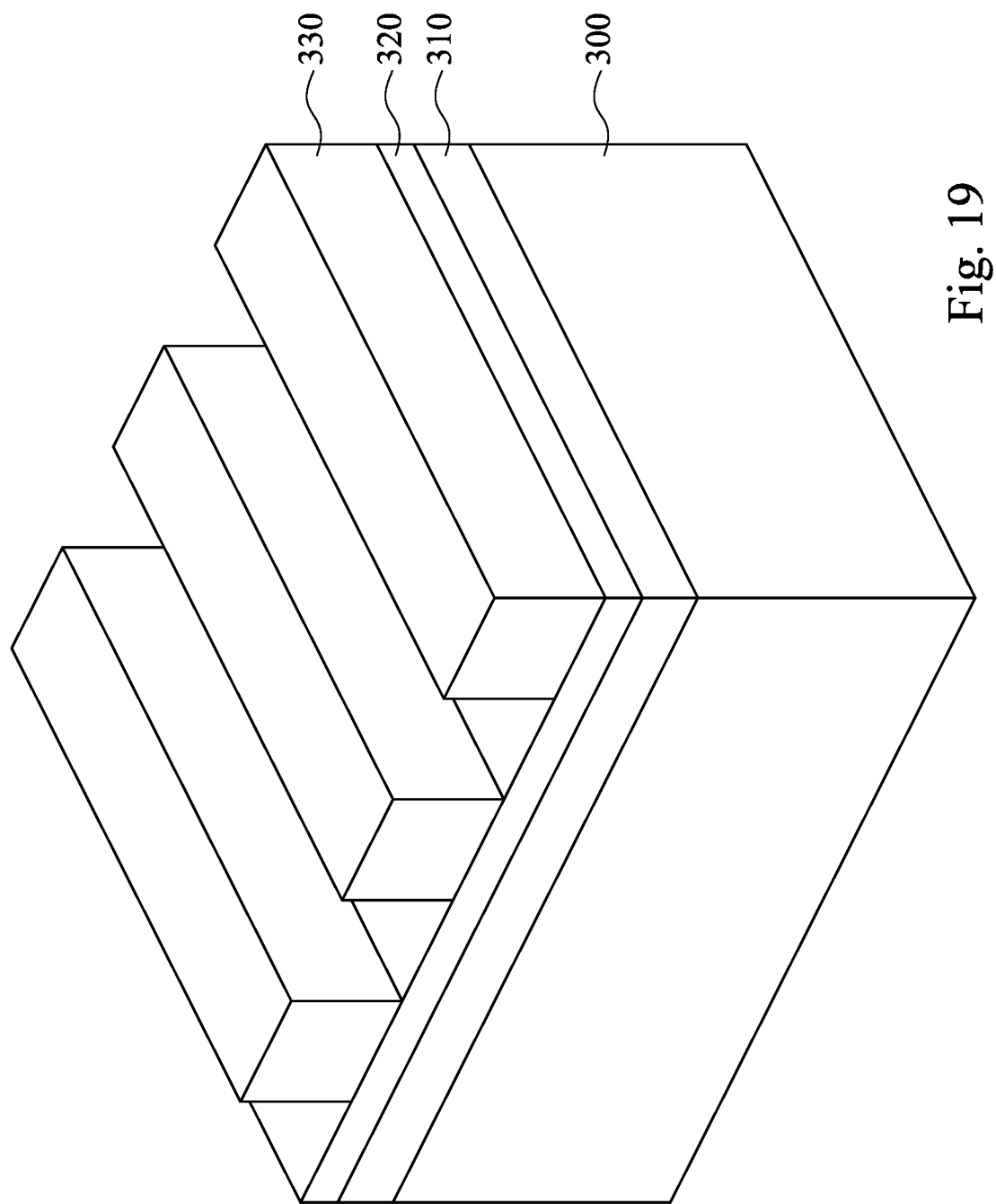

Reference is made to FIGS. 17 and 19. The method 30 proceeds to operation 32 where a patterned mask is formed over the dielectric layer. As illustrated in FIG. 19, a patterned mask 330 is formed over the dielectric layer 320, where the patterned mask 330 covers portions of the dielectric layer 320, while keeps other portions of the dielectric layer 320 exposed. It is noted that the shapes of the mask 330 illustrated in FIG. 19 are merely used to explain, and the present disclosure is not limited thereto.

In some embodiments, the mask 330 may be a photoresist. For example, the photoresist 330 is a tri-layer photoresist, with a bottom anti-reflective coating (BARC) layer, an intermediate mask layer, and a top photoresist layer (not separately illustrated within FIG. 19). However, any suitable type of photosensitive material or combination of materials may be utilized. Once the photoresist 330 has been coated on the dielectric layer 320, the photoresist 330 is patterned. In some embodiments, the photoresist 330 may be patterned by exposing a photosensitive material within the photoresist 330 (e.g., the top photoresist layer in the tri-layer photoresist) to an energy source (e.g., light) through, e.g., a reticle. The impact of the energy will cause a chemical reaction in those parts of the photosensitive material that were impacted by the patterned energy source, thereby modifying the chemical properties of the exposed portions of the photoresist such that the chemical properties of the exposed portions of the photoresist 330 are different from the chemical properties of the unexposed portions of the photoresist 330. The photoresist 330 may then be developed with, e.g., a developer, in order to separate the exposed portion of the photoresist 330 from the unexposed portion of the photoresist 330.

Figure 20:
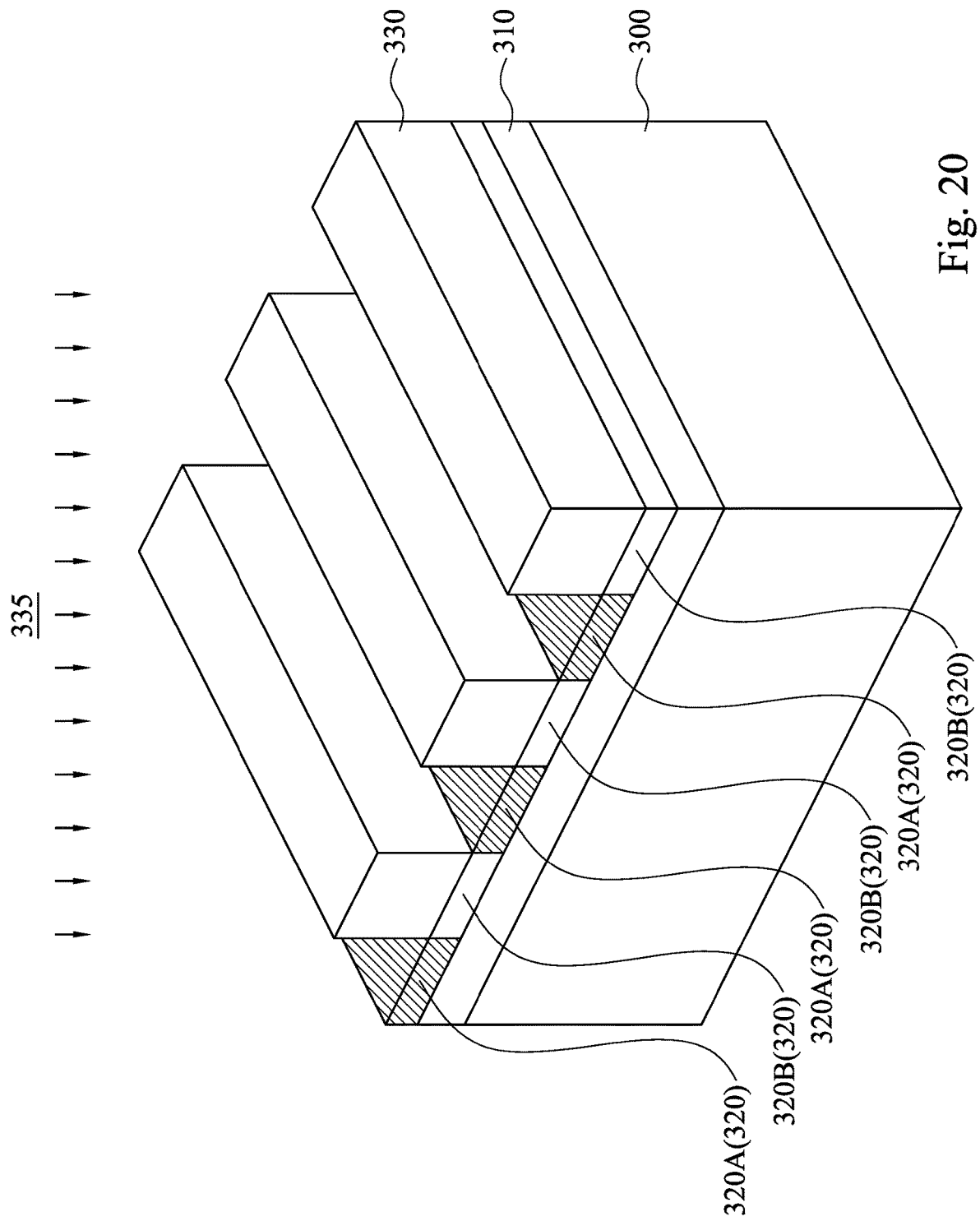

Reference is made to FIGS. 17 and 20. The method 30 proceeds to operation 33 where a plasma treatment is performed to the dielectric layer. As illustrated in FIG. 20, a plasma treatment 335 is performed to the dielectric layer 320 by using the patterned mask 330 as a mask so as to change the etching properties of different portions of the dielectric layer 320. In greater details, portions 320A of the dielectric layer 320 that are exposed from the mask 330 are subject to the plasma treatment 335, and the other portions 320B of the dielectric layer 320 are protected by the mask 330 during the plasma treatment 335.

In some embodiments where the dielectric layer 320 is made of SiOC, a helium (He) plasma may be applied to break parts of the Si—C bonds of the exposed portions 320A of the dielectric layer 320, because the Si—C bonds are susceptible to attack by the plasma processing. In some embodiments, the silicon (Si), carbon (C), oxygen (O), and nitrogen (N) concentrations of a SiOC dielectric layer not treated with plasma treatment are respectively from about 28.9%, 16.2%, 54.6%, and 0.2%, and the Si, C, O, and N concentrations of a SiOC dielectric layer treated with plasma treatment are respectively about 28.2%, 11.8%, 59.5%, and 0.5%. That is, the plasma treatment 335 results in a reduced carbon concentration and an increased oxygen concentration, which in turn results in the treated portions 320A of the dielectric layer 320 having a higher oxygen concentration and a lower carbon concentration than the untreated portions 320B of the dielectric layer 320. In some embodiments, He plasma may be generated with the following conditions: a He flow rate from about 500 to about 10000 sccm; a RF power of from about 5 to about 5000 Watts; a chamber pressure of about 5 mtorr to about 1000 mtorr; and a temperature of about 20° C. to about 700° C. The He plasma treatment 335 is performed for a period of about 1 to about 300 seconds.

After the plasma treatment 335, the dielectric layer 320 includes treated portions 320A with greater oxygen concentration and the untreated portions 320B with less oxygen concentration. Stated another way, the treated portions 320A have a first oxygen concentration and the untreated portions 320B have a second oxygen concentration lower than the first oxygen concentration. The oxygen concentration difference between the treated portions 320A and the untreated portions 320B results in etch selectivity between these portions 320A and 320B in the subsequent etching process (in the operation 22). In some embodiments, the etch selectivity is greater than 40 in some embodiments. That is, the etch rate of the untreated portions 320B may be greater (or lower) than 40 times the etch rate of the treated portions 320A in the following etching process.

Figure 21:
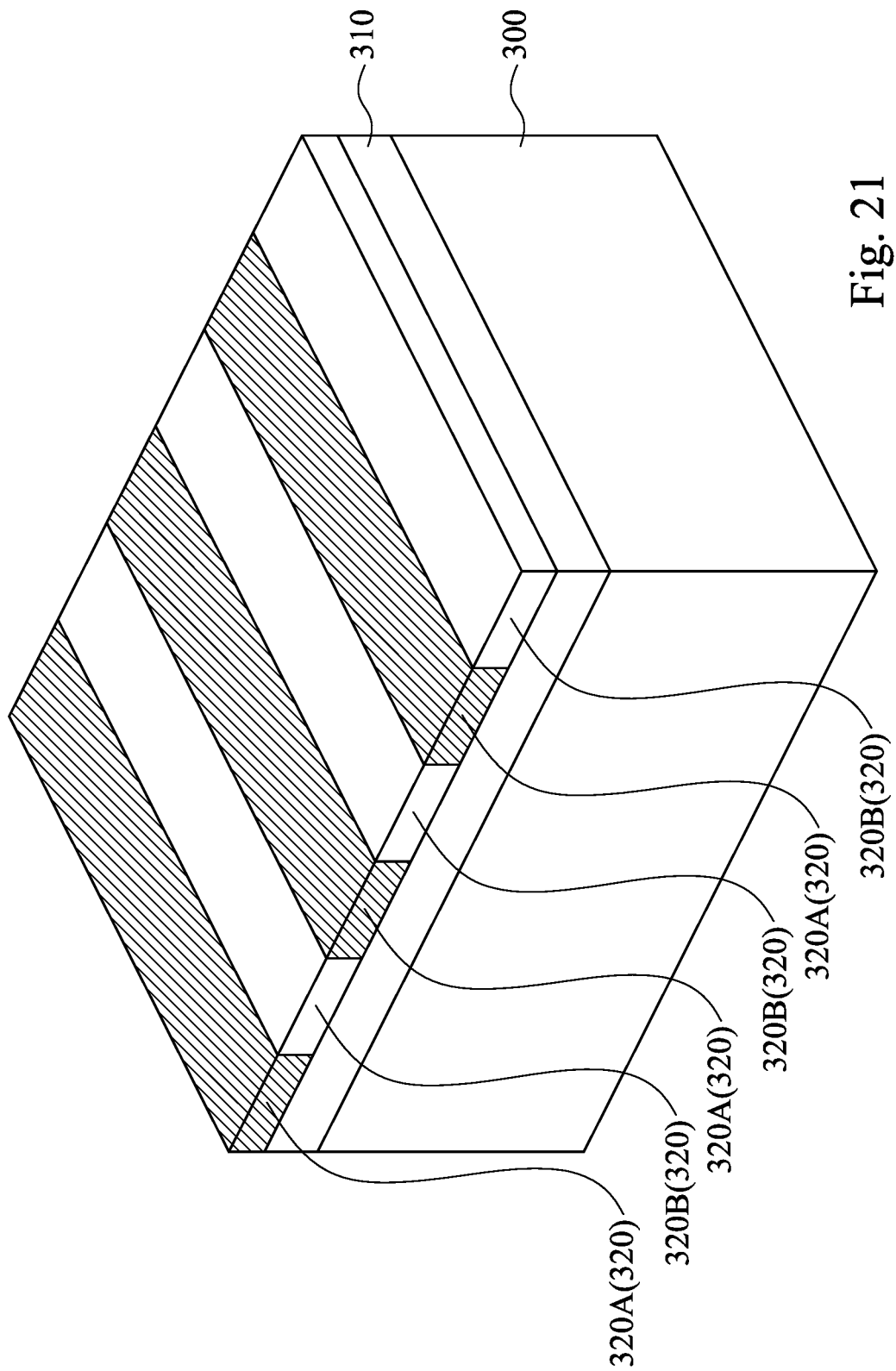

Reference is made to FIGS. 17 and 21. The method 30 proceeds to operation 34 where the patterned mask is removed. The patterned mask 330 is removed by suitable process, such as ashing, such that the untreated portions 320B of the dielectric layer 320 are exposed.

Figure 22:
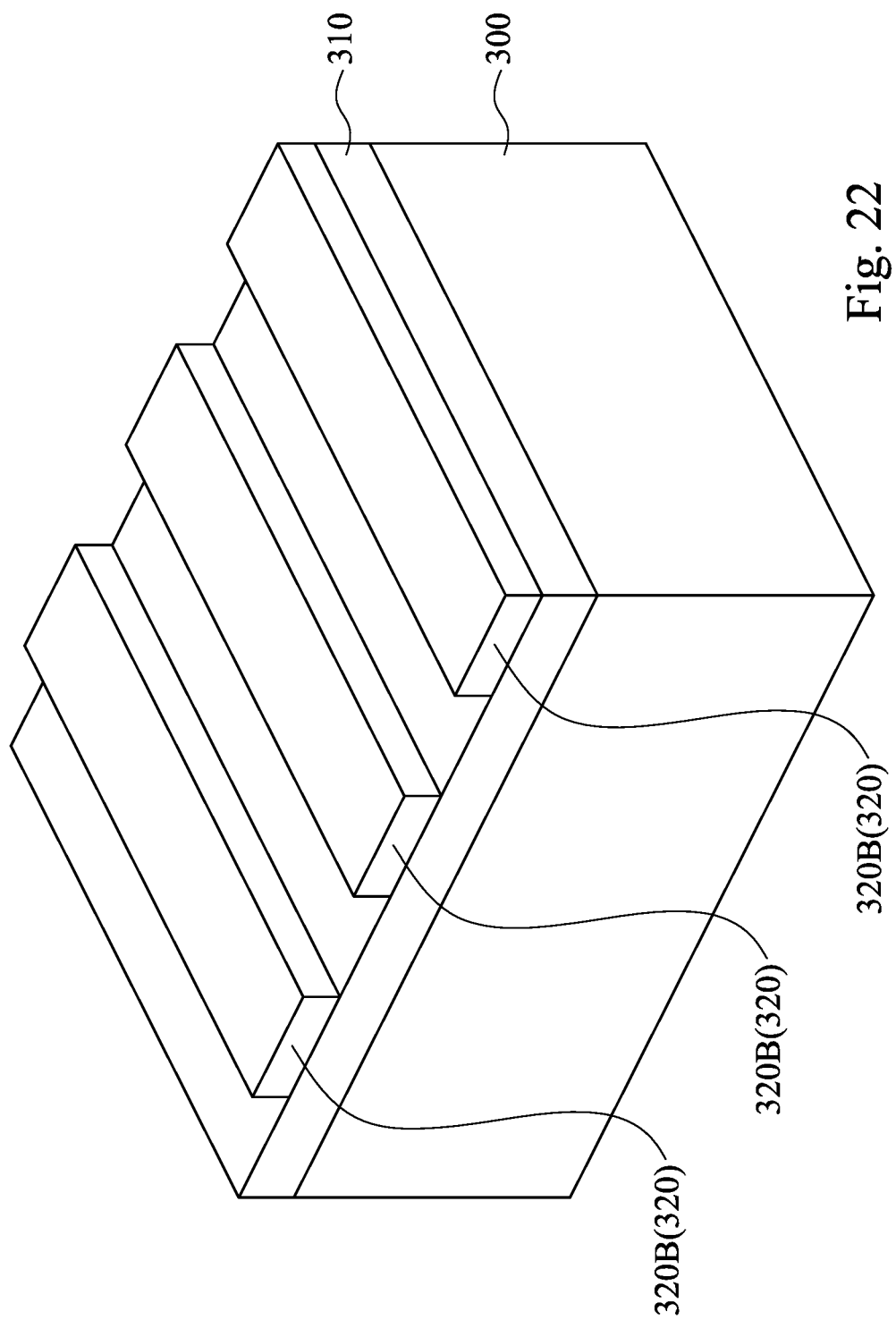

Reference is made to FIGS. 17 and 22. The method 30 proceeds to operation 35 where portions of the dielectric layer are removed. As illustrated in FIG. 22, the treated portions 320A of the dielectric layer 320 (see FIG. 21) are selectively removed, and the untreated portions 320B of the dielectric layer 320 remain on the metal layer 310. In some embodiments, after the operation 35, the untreated portions 320B may have a certain loss but still has enough thickness that covers portions of the metal layer 310. In some embodiments, the selective removal may include a selective wet etching and/or dry etching with an etch selectivity between the untreated portions 320B and the treated portions 320A, such as an etch selectivity greater than 40. That is, the etch rate of the treated portions 320A in the selective etching is greater than 40 times the etch rate of the untreated portions 320B in the selective etching. In some embodiments, the selective etching process uses an etchant (e.g., $H_2$, HF, $NF_3$, and/or $NH_3$) at etching conditions of 70° C. (about 30° C. to about 120° C. in some embodiments), pressure from about 40 mtorr to about 3000 mtorr with or without plasma.

Figure 23A:
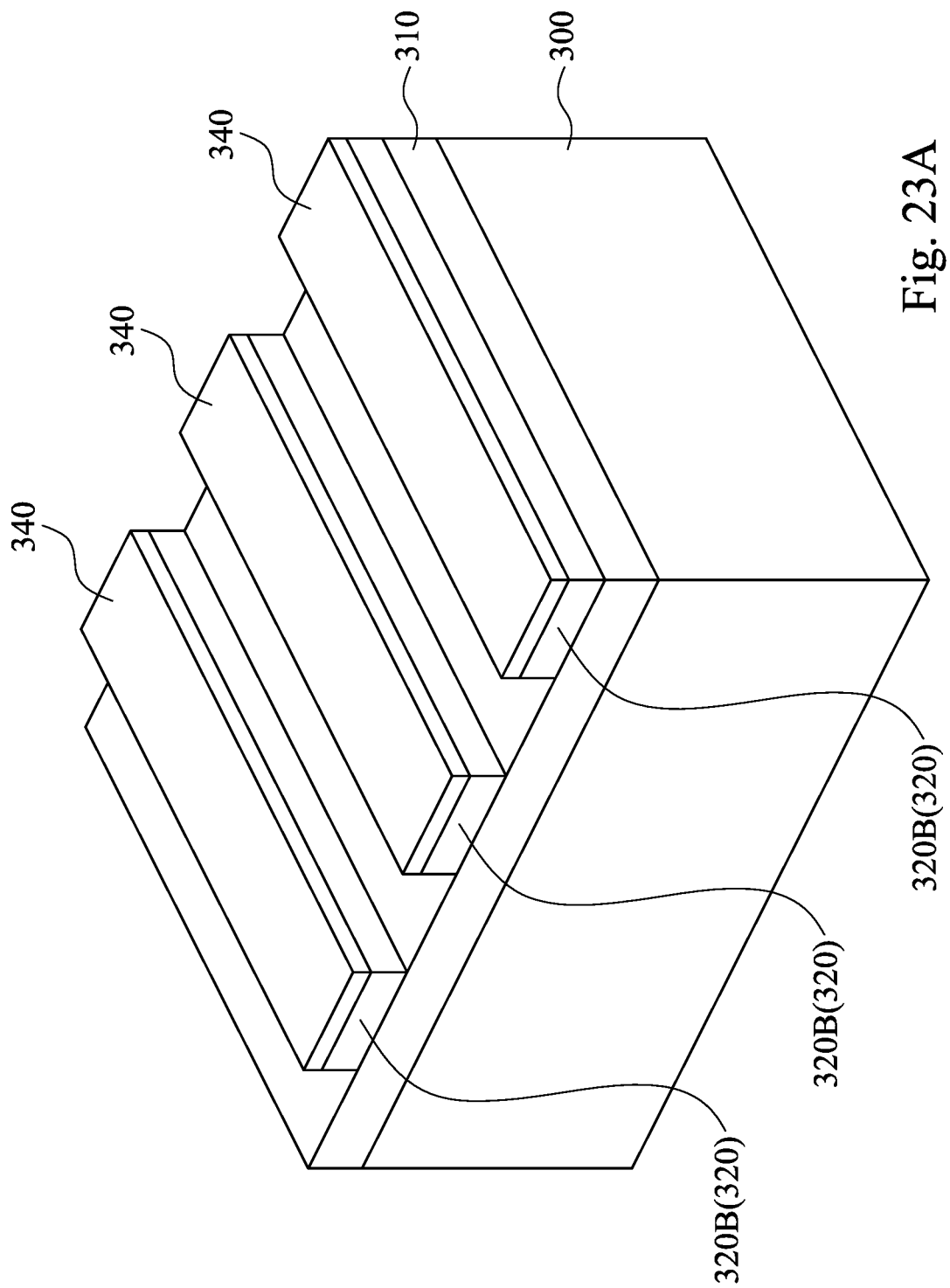
Figure 23B:
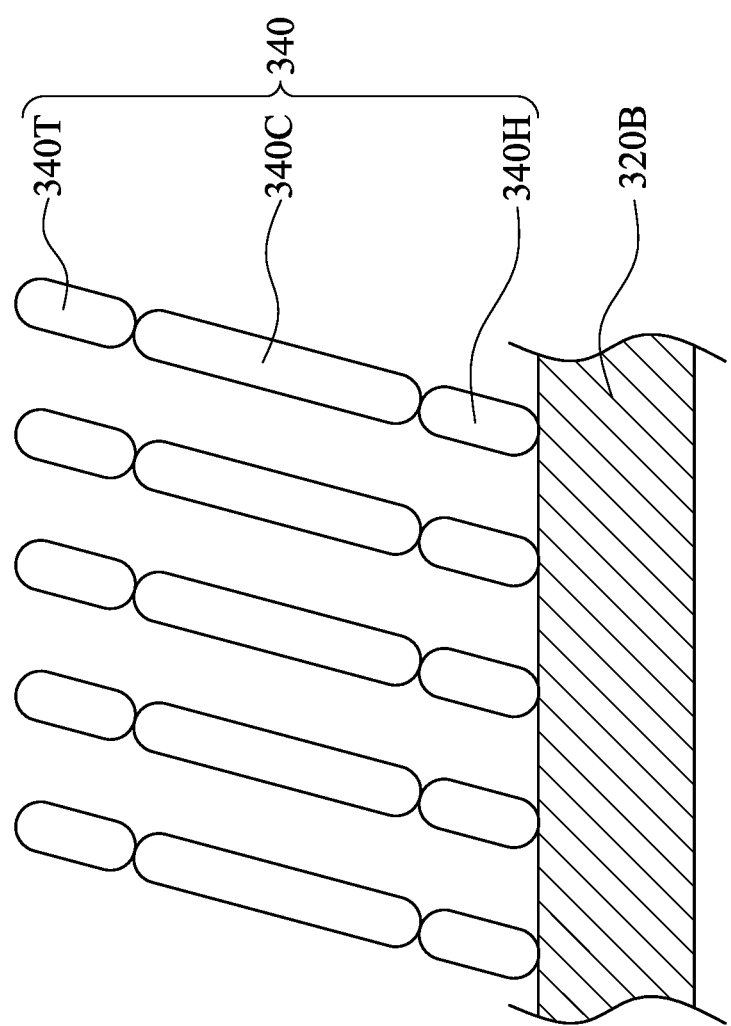

Reference is made to FIGS. 17, 23A, and 23B. The method 30 proceeds to operation 36 where inhibitors are selectively formed on the remaining dielectric layer. As illustrated in FIG. 23A, a plurality of inhibitors 340 are selectively grown on the remaining untreated portions 320B of the dielectric layer 320. That is, the inhibitors 340 cover the top surfaces of the portions 320B of the dielectric layer 320, and leave the top surface of the metal layer 310 uncovered. In some embodiments, the thickness of the inhibitor 340 may be in a range from about 1 nm to about 50 nm. In some embodiments, the thickness of the inhibitor 340 is lower than about 20 nm. The inhibitors 340 include a material that can suppress subsequent deposition on the untreated portions of the dielectric layer 320. In some embodiments, the inhibitor 340 may be formed by liquid and/or vapor deposition process.

In some embodiments, the inhibitor 340 may be polymer or self-assemble monolayer (SAM). The SAM inhibitor includes silane-type inhibitor or thiol-type inhibitor. In some embodiments, the silane-type inhibitor may be Octadecyl-trichlorosilane ($CH_3(CH_2)_{17}SiCl_3$), Trichloro(1H, 1H, 2H, 2H-perfluorooctyl)silane ($CF_3(CF_2)_5(CH_2)_2SiCl_3$), Dimethyldichlorosilane (($CH_3)_2SiCl_2$)/(Dimethylamino)trimethylsilane (($CH_3)_2NSi(CH_3)_3$), 1-(Trimethylsilyl)pyrrolidine (($CH_3)_3Si-NC_4H_8$), Hexamethyldisilazane ($[(CH_3)_3Si]_2NH$), or Bis(dimethylamino)dimethylsilane ($[(CH_3)_2N]_2Si(CH_3)_2$). In some other embodiments, the thiol-type inhibitor may be alkanethiol, propanethiol, butanethiol, hexanethiol, heptanethiol, Octadecanethiol, nonanethiol, or dodecanethiol. In some embodiments, silane-type inhibitor can selectively formed on a dielectric layer, and thiol-type inhibitor can selectively formed on a metal layer, respectively.

In some embodiments where the inhibitor 340 are self-assemble monolayer (SAM), the molecules of the inhibitor 340 each have a first protruding end portion (e.g., head group) and a second protruding end portion (e.g., terminal group) that are located on opposite sides of an optional middle portion (molecular chain). The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a metal oxide deposition inhibitor group. The optional middle portion may include an alkyl chain. The Van der Waals interactions between these chains cause the self-assembled monolayers to be ordered. In some embodiments, where the SAM 340 includes alkanethiosls ($X-(CH_2)_n-SH$), the head group can be bound to a surface of a metal material rather than a dielectric material. As such, the inhibitor 340 can be selectively formed (grown) on a specific surface of a metal material, while formation of the inhibitors 340 on the dielectric material can be suppressed.

Reference is made to FIG. 23B. For example, the self-assemble monolayer 340 is formed on a substrate including the dielectric layer 320B. The SAM 340 includes a head group 340H connected to a terminal group 340T (i.e., functional group) by way of a molecular chain 340C (i.e., tail). The head group 340H has a hydrophilic interfacial property that attracts the SAM 340 to the dielectric layer 320A. In some embodiments, the head group 340H may include trichlorosilicon ($SiCl_3$) or trimethoxysilane ($Si(OCH_3)_3$), which provide the hydrophilic interfacial property. In some embodiments, the molecular chain 340C may include an alkyl chain, such as methylene ($CH_2)_n$, for example. The terminal group 340T has a hydrophobic interfacial property that repels metal, thereby preventing metal from adhering to the SAM 340. In some embodiments, the terminal group 340T may include a methyl group ($CH_3$), which provides the hydrophobic interfacial property.

Figure 24:
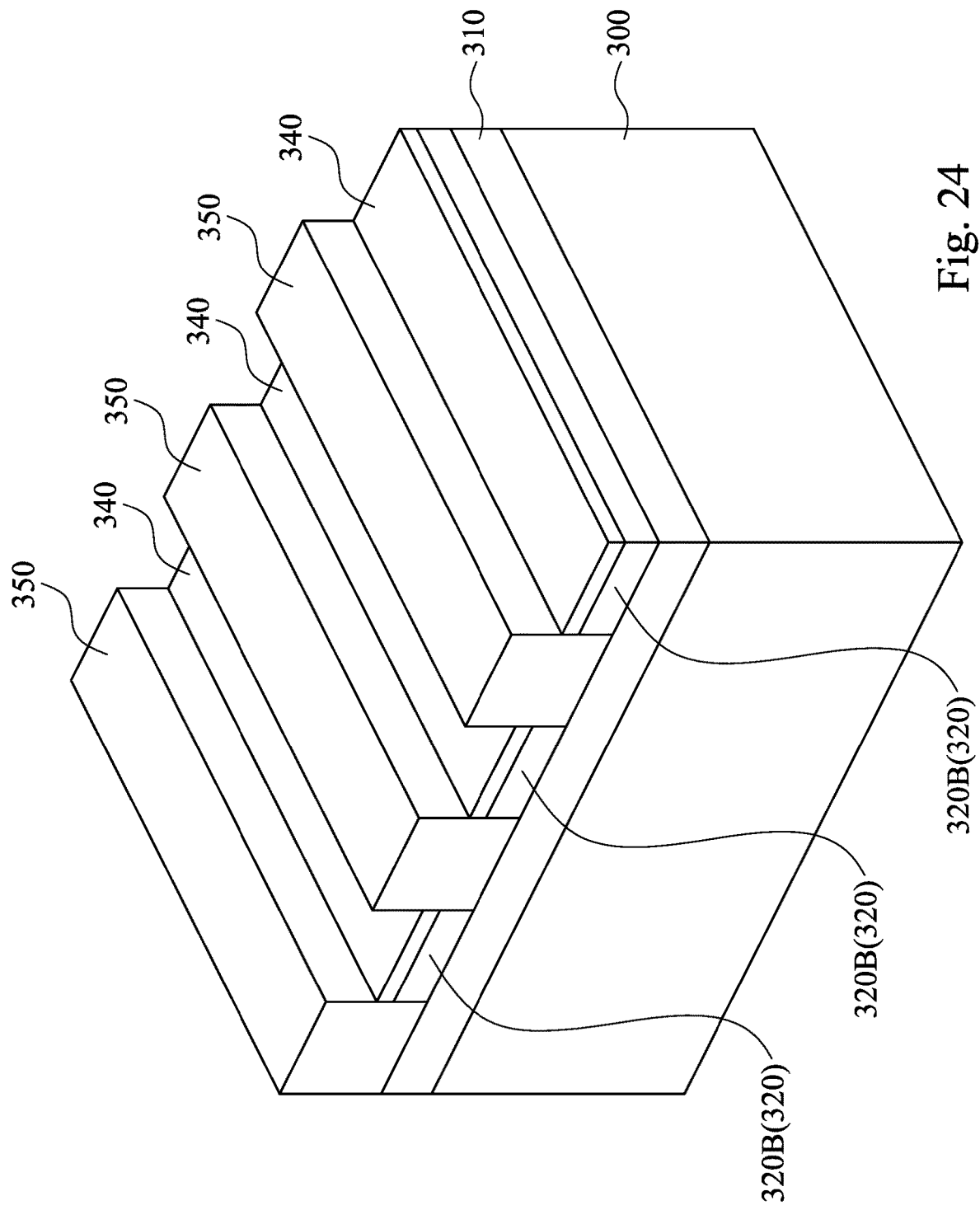

Reference is made to FIGS. 17 and 24. The method 30 proceeds to operation 37 where an area selective deposition (ASD) is performed. As illustrated in FIG. 24, the ASD process is employed to form a hard mask 350 self-aligned to the metal layer 310. The ASD process may be an area-selective atomic layer deposition (ALD) that employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles. In FIG. 24, the self-aligned hard mask 350 has a thickness which is determined by the deposition cycles of ALD processes. The precursor (and/or the reactant) in every cycle can be the same or different.

ASD is a surface sensitive deposition process, i.e., the film growth is dependent on the material's surface characteristics. For example, the terminal groups 340T of the inhibitors 340 (see FIG. 23B) are substantially inert with the precursors of the ALD process, and the molecular chain 340C of the inhibitors 340 (see FIG. 23B) form a good coverage to block the precursors (i.e., forming steric hindrance) from reacting with the untreated portions 320B. As such, the precursors are prevented from bonding to the inhibitors 340, and the self-aligned hard mask 350 can be selectively formed on the metal layer 310, not on the inhibitors 340 and/or untreated portions 320B, which in turn results in the hard mask 350 self-aligned to the metal layer 310. In some embodiments, the material of the hard masks can be a dielectric, such as SiO, SiN, SiC, SiOC, SiON, SiCN, SiOCN, and/or combinations thereof.

Due to the material properties as mentioned above, precursors of the ALD process have a tendency not to adhere to the surface of the inhibitors 340. In this way, the precursors of the ASD process have high selectivity between the inhibitors 340 and the metal layer 310. Specifically, the ASD process has selectivity for the metal layer 310 with respect to the inhibitors 340. As such, by forming the inhibitors 340, the deposition rate of the self-aligned hark mask 350 over the dielectric layer 320B (under the inhibitors 340) can be efficiently suppressed. Thus, during the ALD process, the self-aligned hark mask 350 is formed over the metal layer 310, while leaving the top surface of the inhibitors 340 uncovered. In other words, the self-aligned hark mask 350 may not be formed on the inhibitors 340 that covers the untreated dielectric portions 320B. In some embodiments where the ASD process is an area-selective ALD process, the ALD process may include plural reaction cycles to form a desired thickness of the self-aligned hark mask 350.

Figure 25:
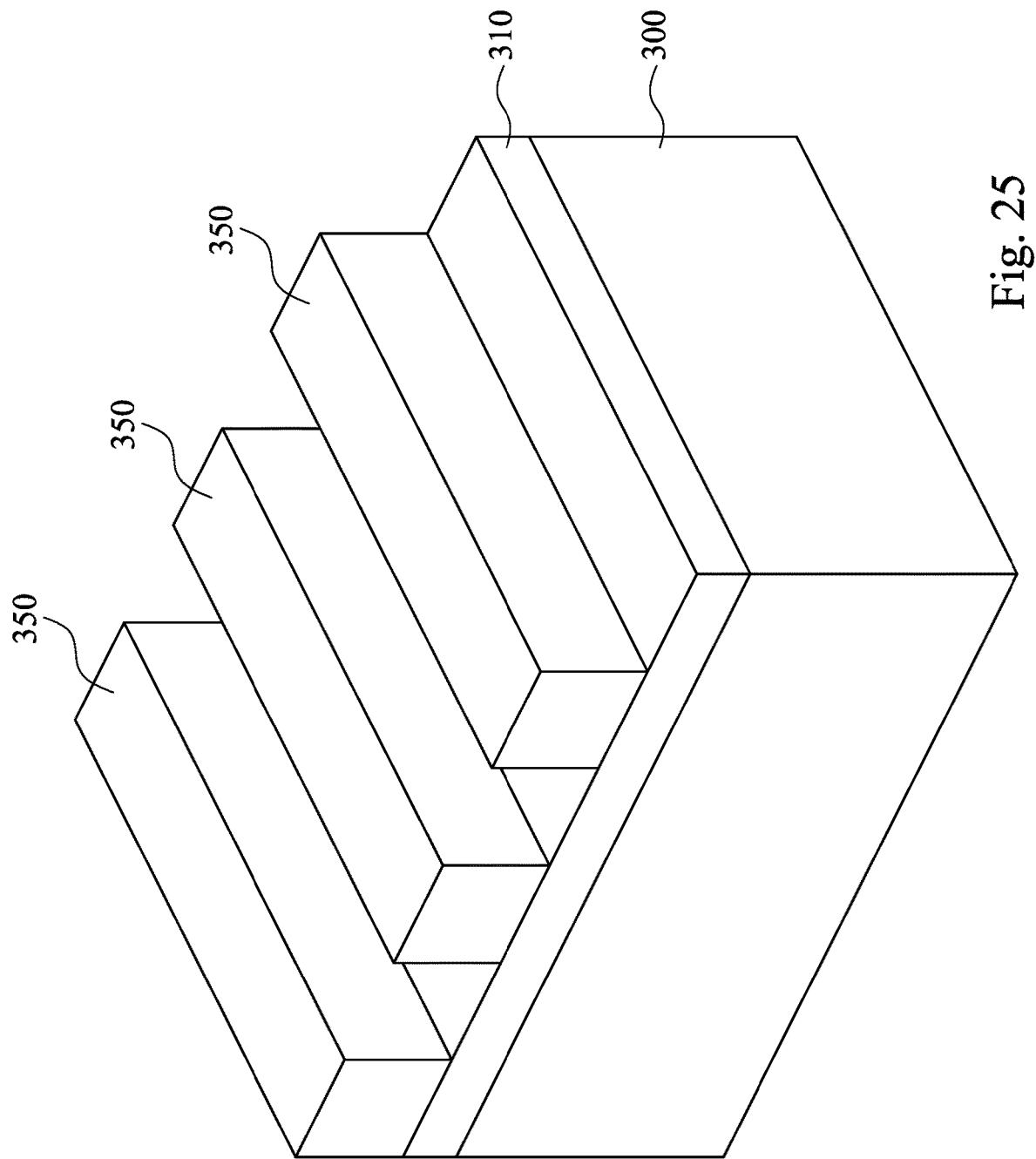

Reference is made to FIGS. 17 and 25. The method 30 proceeds to operation 38 where the inhibitors and the dielectric layer are removed. The inhibitors 340 and the dielectric layers 320B are removed by suitable process, such as wet etching, dry etching, or combinations thereof. After the inhibitors 340 and the dielectric layers 320B are removed, the top surface of the metal layer 310 is exposed through the hard mask 350.

Figure 26:
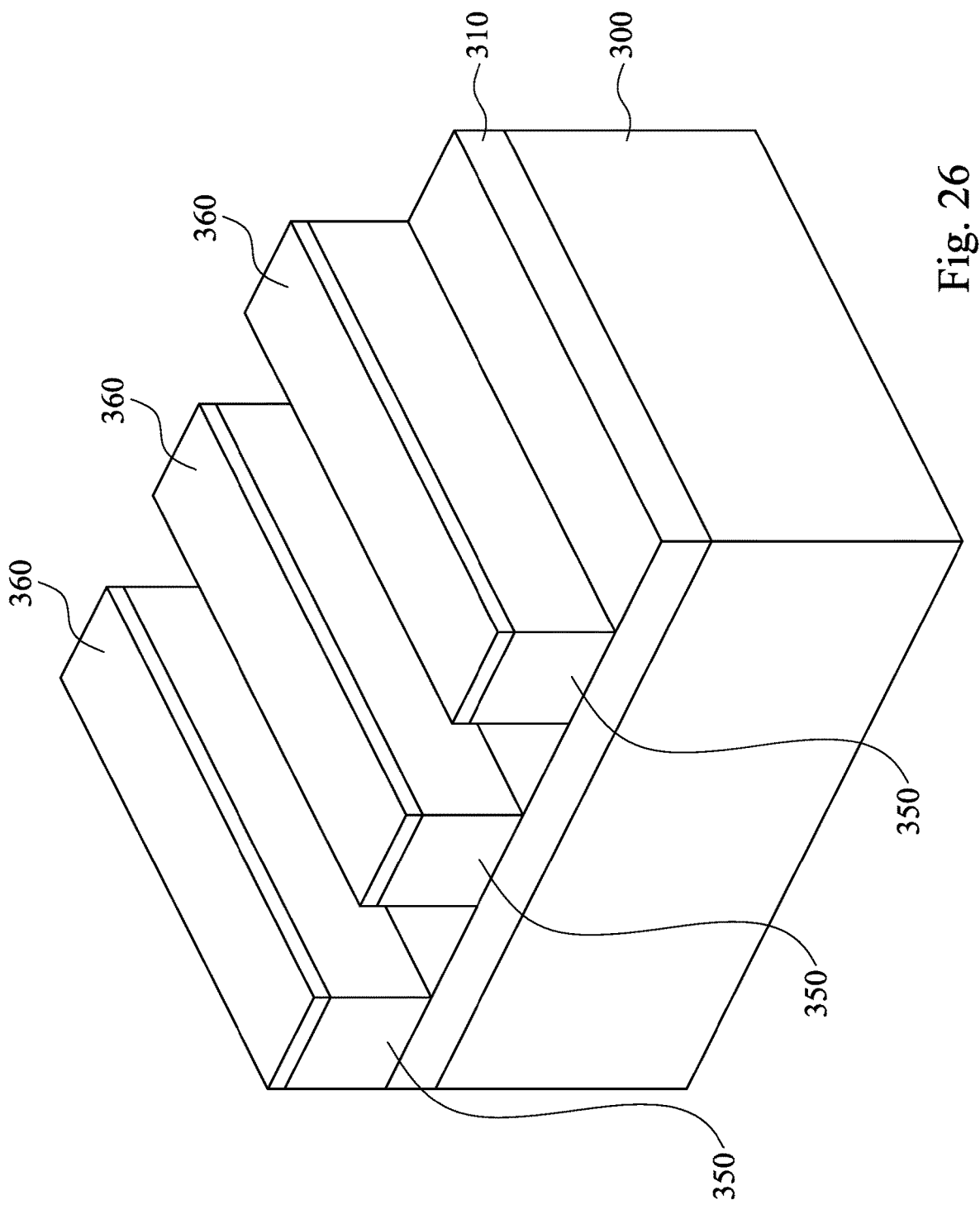

Reference is made to FIGS. 17 and 26. The method 30 proceeds to operation 39 where inhibitors are formed. In FIG. 26, inhibitors 360 are selectively formed on the hard mask 350. That is, the inhibitors 360 cover the top surface of the hard mask 350, while leaving the top surface of the metal layer 310 uncovered. The properties of the inhibitors 360 are similar to those of the inhibitors 340 described in FIGS. 23A and 23B, and thus similar details in this aspect will not be repeated hereinafter. In some embodiments, the hard mask 350 is made of dielectric material, so as to provide sufficient deposition selectivity between the hard mask 350 and the metal layer 310. As such, the inhibitors 360 have a tendency to form on the hard mask 350, rather than on the metal layer 310.

Figure 27:
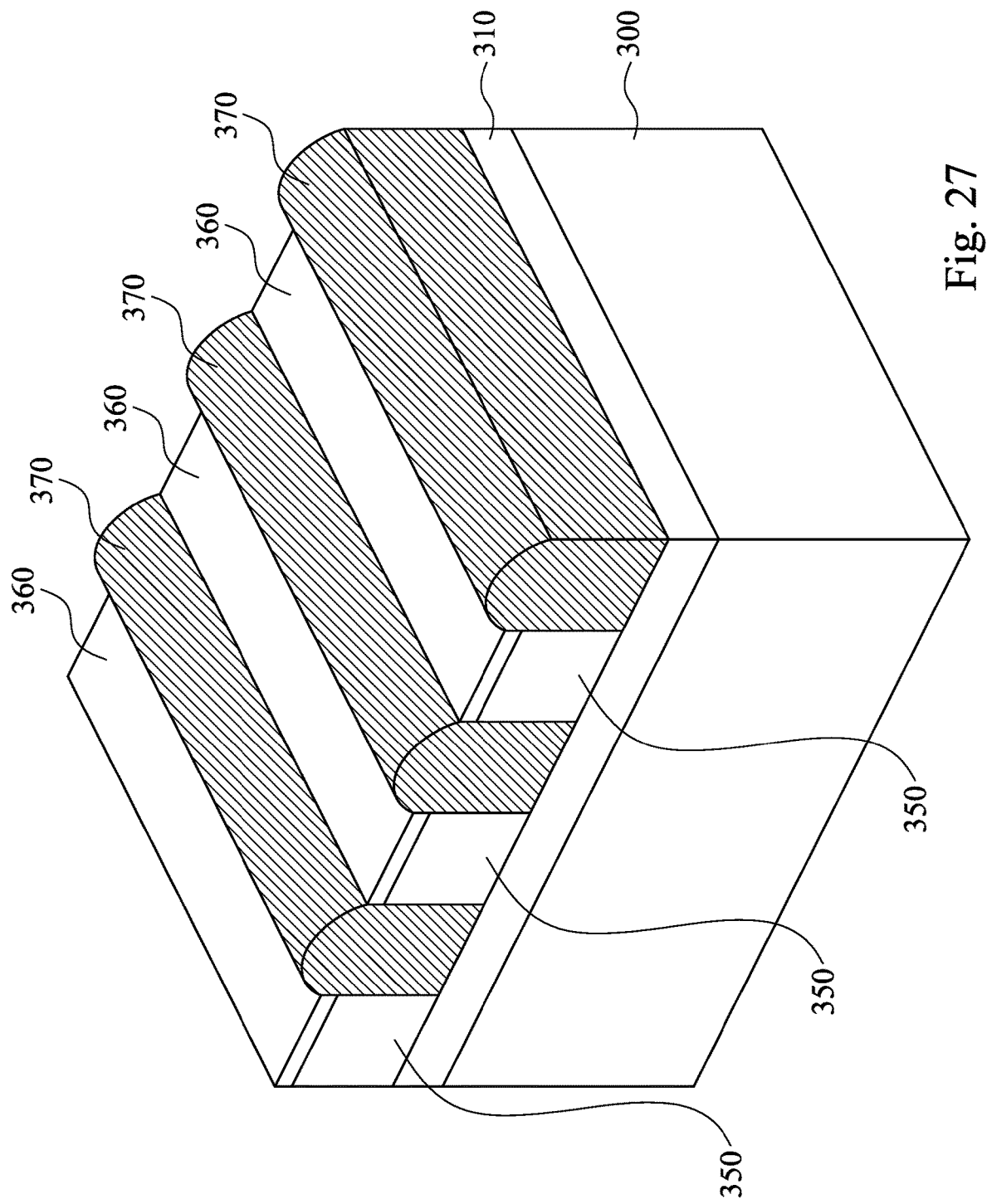

Reference is made to FIGS. 17 and 27. The method 30 proceeds to operation 40 where an area selective deposition (ASD) is performed. As illustrated in FIG. 27, the ASD process is employed to form a hard mask 370 self-aligned to the metal layer 310. Moreover, ASD is a surface sensitive deposition process, i.e., the film growth is dependent on the material's surface characteristics. For example, the terminal groups of the inhibitors 360 are substantially inert with the precursors of the ALD process, and the molecular chain of the inhibitors 360 form a good coverage to block the precursors (i.e., forming steric hindrance) from reacting with the hard mask 350. As such, the precursors are hard to react on the inhibitors 360, and the self-aligned hard mask 370 can be selectively formed on the metal layer 310, not on the inhibitors 360 and/or the hard mask 350, which in turn results in the hard mask 370 self-aligned to the metal layer 310. In some embodiments, the material of the hard masks can be dielectric film, such as SiO, SiN, SiC, SiOC, SiON, SiCN, SiOCN, and/or combinations thereof. In some embodiments, the hard mask 350 and the hard mask 370 are made of different materials, so as to provide etching selectivity therebetween.

Due to the material properties as mentioned above, precursors of the ALD process have a tendency not to adhere to the surface of the inhibitors 360. In this way, the precursors of the ASD process have high selectivity between the inhibitors 360 and the metal layer 310. Specifically, the ASD process has selectivity for the metal layer 310 with respect to the inhibitors 360. As such, by forming the inhibitors 360, the deposition rate of the self-aligned hark mask 370 over the hard mask 350 (under the inhibitors 360) can be suppressed. Thus, during the ASD process, the self-aligned hark mask 370 may be formed over the metal layer 310, while leaving the top surface of the inhibitors 360 uncovered. In other words, the self-aligned hark mask 370 may not be formed on the inhibitors 360 that covers the hard mask 350.

Figure 28:
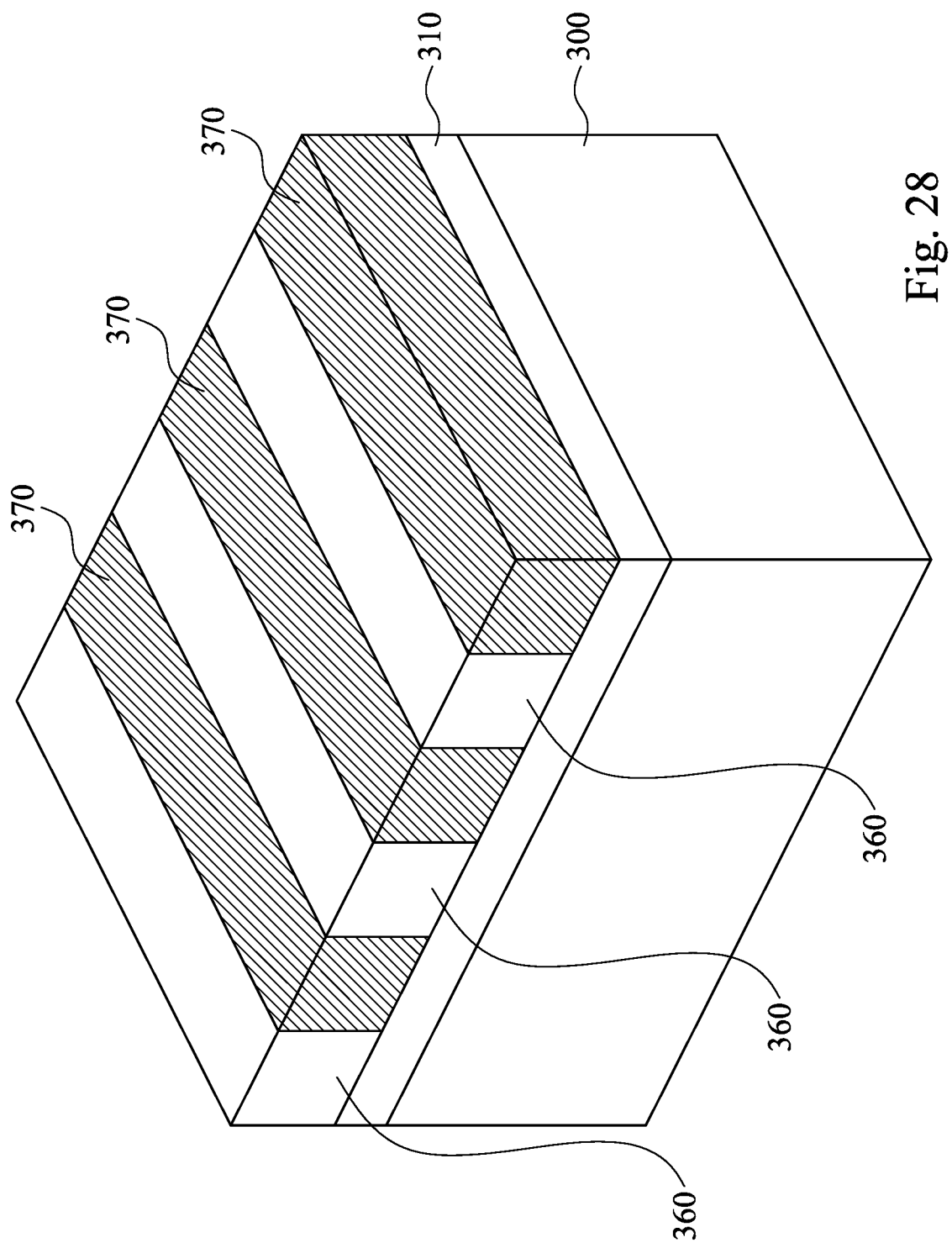

Reference is made to FIGS. 17 and 28. The method 30 proceeds to operation 41 where a CMP process is performed. As illustrated in FIG. 28, a CMP process is performed to remove excessive material of the hard mask 370 until the top surface of the hard mask 350 are exposed. During the CMP, the inhibitors 360 are removed accordingly, and the top surface of the hard mask 350 is level with the top surface of the hard mask 370.

FIGS. 29 to 33 illustrate a semiconductor structure at various stages according to aspects of the method of FIG. 17. FIGS. 29 to 33 illustrate various stages after the structure of FIG. 21. Details of FIGS. 29 to 33 are similar to those described in FIGS. 22 to 28, and thus similar descriptions in this aspect will not be repeated hereinafter for simplicity.

Figure 29:
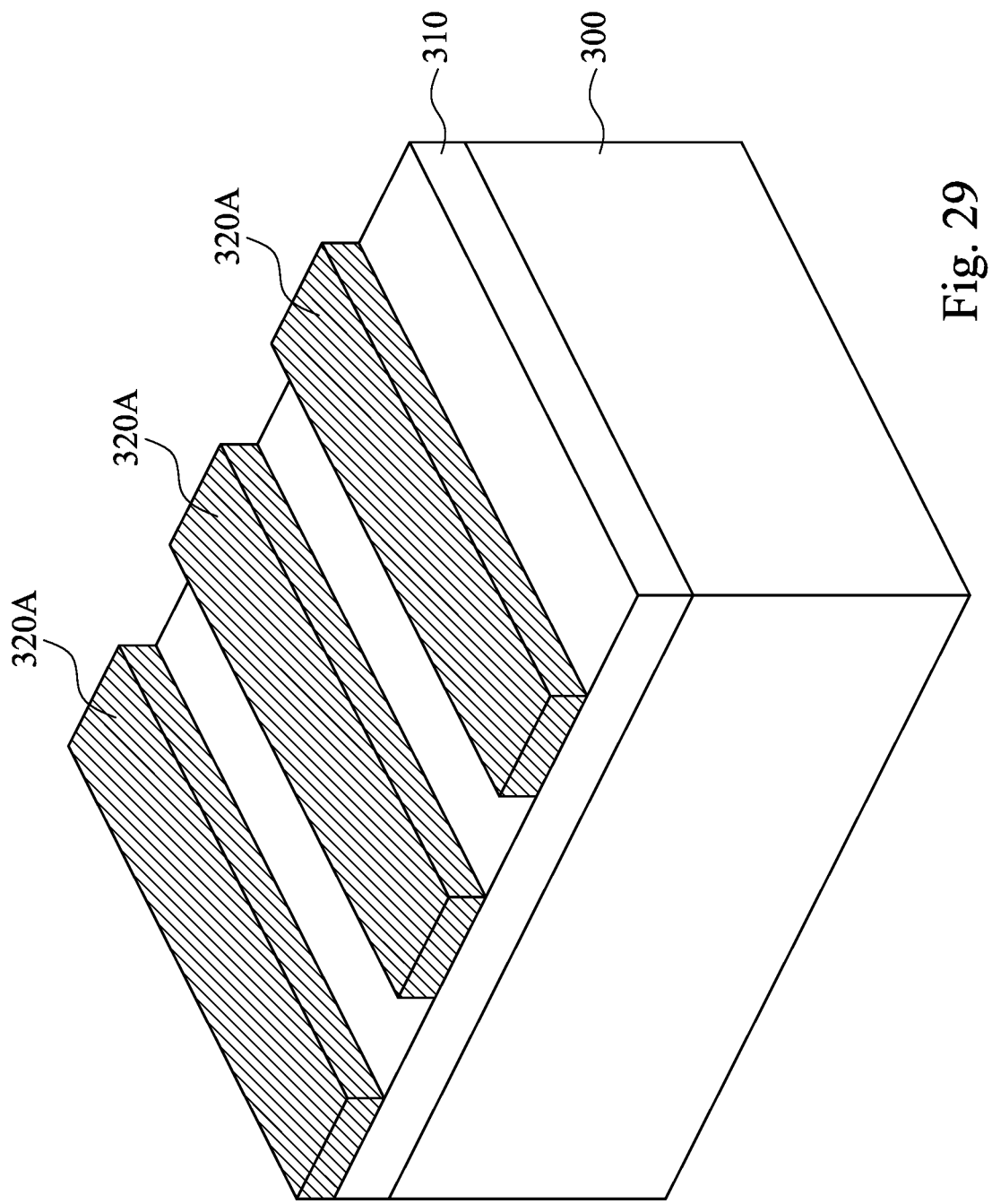
FIGS. 29 to 33 illustrate a semiconductor structure at various stages according to aspects of the method of FIG. 17.

Reference is made to FIG. 29. FIG. 29 is different from FIG. 22, in that the untreated portions 320B of the dielectric layer 320 (see FIG. 21) are selectively removed, and the treated portions 320A of the dielectric layer 320 remain on the metal layer 310. In some embodiments, the selective removal may include a selective wet etching and/or dry etching removal with an etch selectivity between the untreated portions 320B and the treated portions 320A, such as an etch selectivity greater than 40. In some embodiments, the etchant of the selective etching process may include $H_2$, HF, $NF_3$, and/or $NH_3$.

Figure 30:
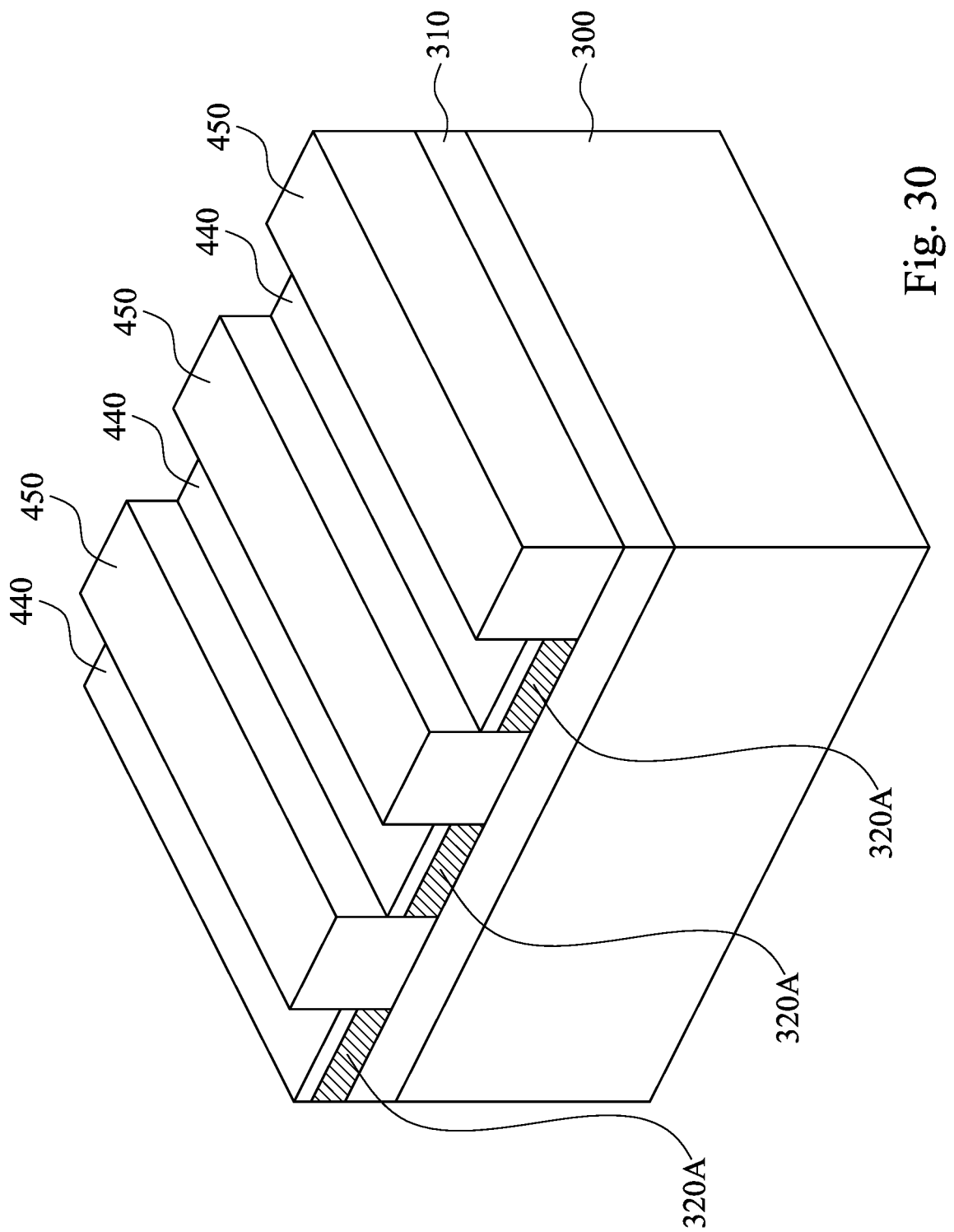

Reference is made to FIG. 30. A plurality of inhibitors 440 are selectively grown on the treated portions 320A of the dielectric layer 320. That is, the inhibitors 440 cover the top surfaces of the portions 320A of the dielectric layer 320, while leaving the top surface of the metal layer 310 uncovered. The properties of the inhibitors 440 can be similar to the inhibitors 340 of FIGS. 23A and 23B, and thus relevant descriptions are omitted for simplicity. Then, an area-selective deposition (ASD) process is employed to form a hard mask 450 self-aligned to the metal layer 310. By forming the inhibitors 440, the deposition rate of the self-aligned hark mask 450 over the dielectric layer 320A (under the inhibitors 440) can be suppressed. Thus, during the ASD process, the self-aligned hark mask 450 may be formed over the metal layer 310, while leaving the top surface of the inhibitors 440 uncovered. The processes of FIG. 30 are similar to those described in FIG. 23A to 24, and thus similar descriptions will not be repeated hereinafter.

Figure 31:
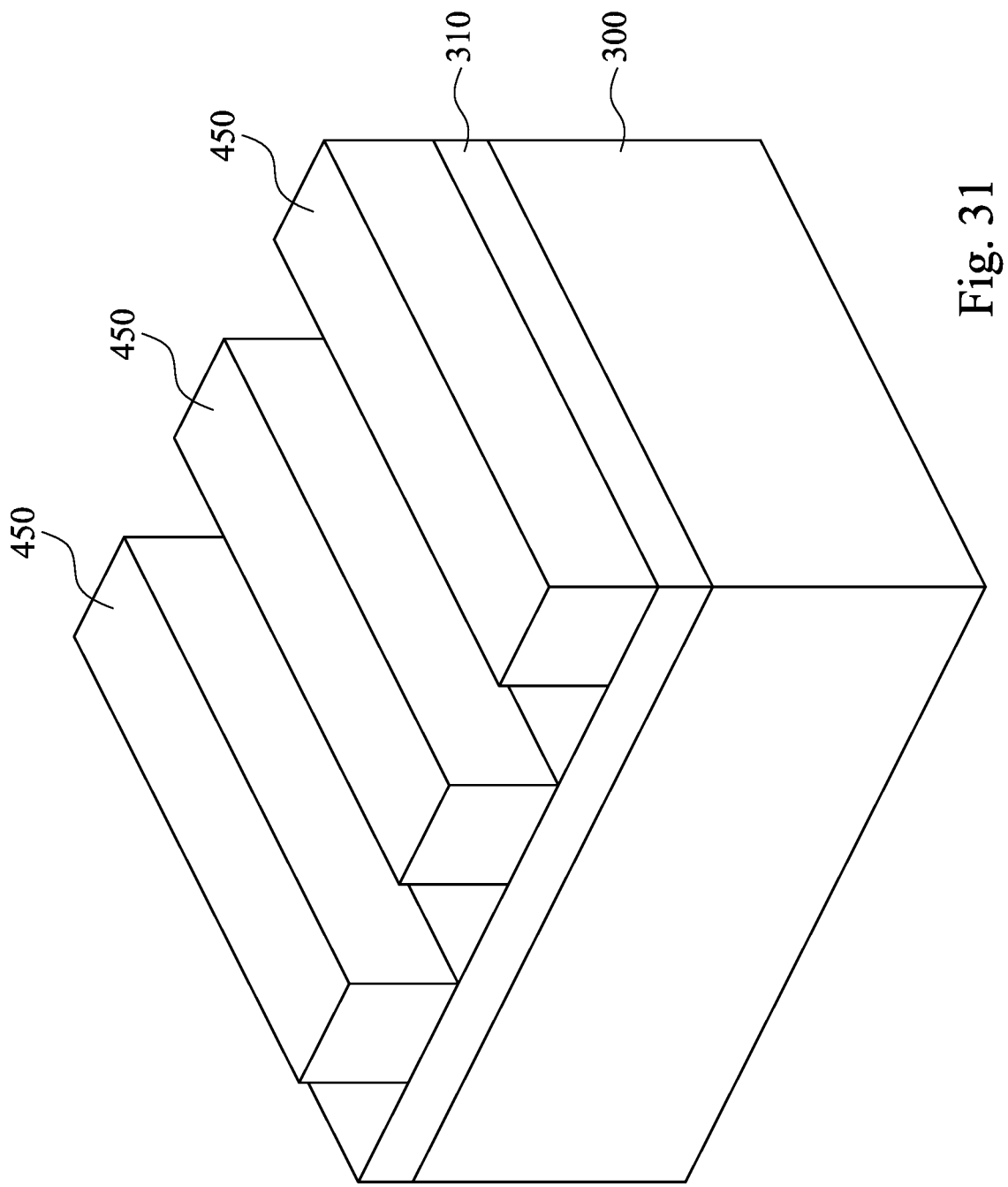

Reference is made to FIG. 31. The inhibitors 440 and the dielectric layers 320B are removed by suitable process, such as wet etching, dry etching, or combinations thereof. After the inhibitors 440 and the dielectric layers 320B are removed, the top surface of the metal layer 310 is exposed through the hard mask 350.

Figure 32:
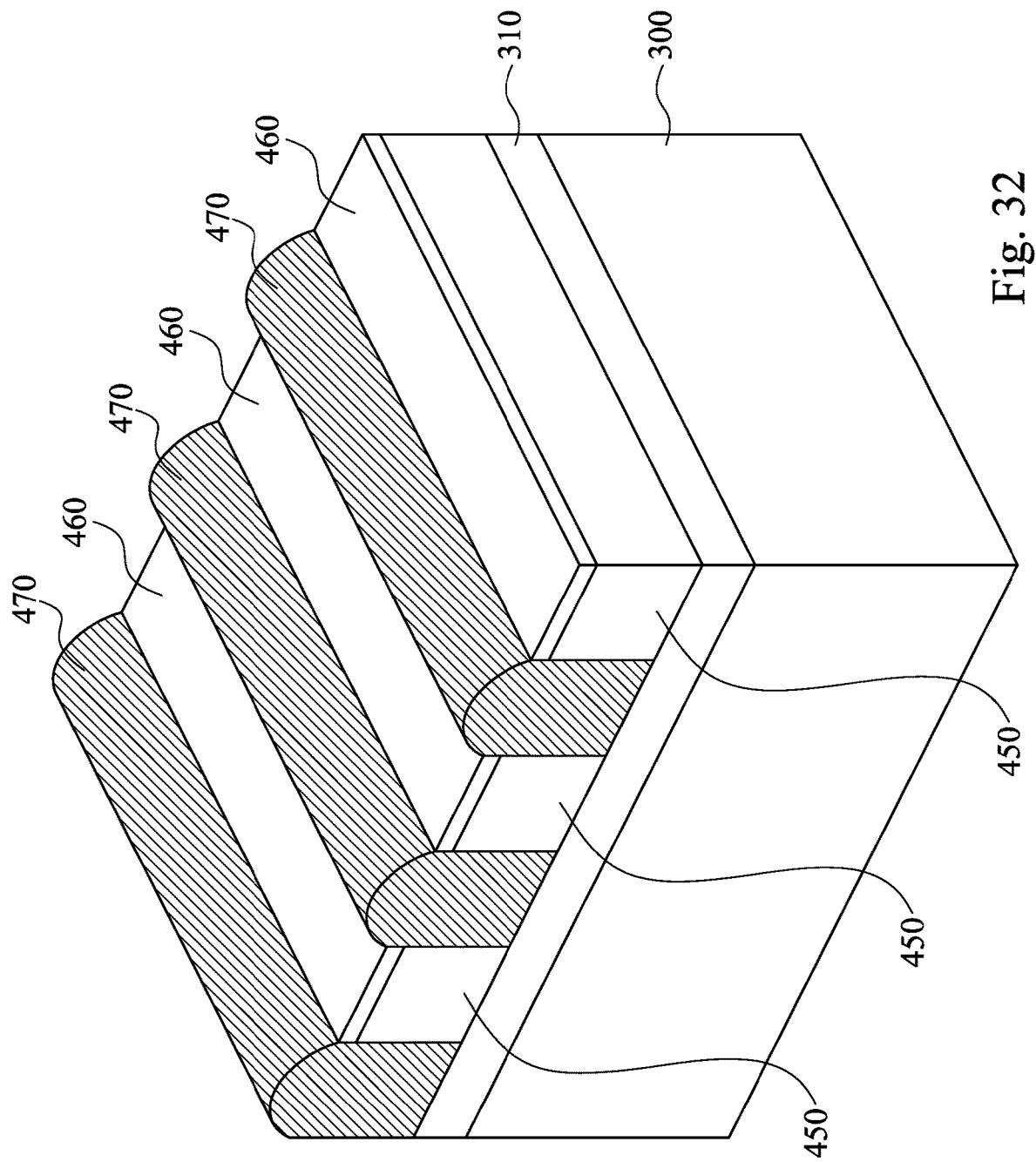

Reference is made to FIG. 32. Inhibitors 460 are selectively formed on the hard mask 450. That is, the inhibitors 460 cover the top surface of the hard mask 450, while leaving the top surface of the metal layer 310 uncovered. The properties of the inhibitors 460 are similar to those of the inhibitors 340 described in FIGS. 23A and 23B, and thus similar details in this aspect will not be repeated hereinafter. In some embodiments, the hard mask 450 is made of dielectric material, so as to provide sufficient deposition selectivity between the hard mask 450 and the metal layer 310. As such, the inhibitors 460 have a tendency to form on the hard mask 450, rather than on the metal layer 310.

Then, an area-selective deposition (ASD) process is employed to form a hard mask 470 self-aligned to the metal layer 310. Moreover, ASD is a surface sensitive deposition process, i.e., the film growth is dependent on the material's surface characteristics. For example, the terminal groups of the inhibitors 460 are substantially inert with the precursors of the ASD process, and the molecular chain of the inhibitors 460 form a good coverage to block the precursors (i.e., forming steric hindrance) from reacting with the hard mask 450. As such, the precursors are prevented from bonding to the inhibitors 460, and the self-aligned hard mask 470 can be selectively formed on the metal layer 310, not on the inhibitor 460 and/or the hard mask 450, which in turn results in the hard mask 470 self-aligned to the metal layer 310. In some embodiments, the material of the hard masks can be dielectric film, such as SiO, SiN, SiC, SiOC, SiON, SiCN, SiOCN, and/or combinations thereof. In some embodiments, the hard mask 450 and the hard mask 470 are made of different materials, so as to provide etching selectivity therebetween. The processes of FIG. 32 are similar to those described in FIGS. 26 and 27, and thus similar descriptions will not be repeated hereinafter.

Figure 33:
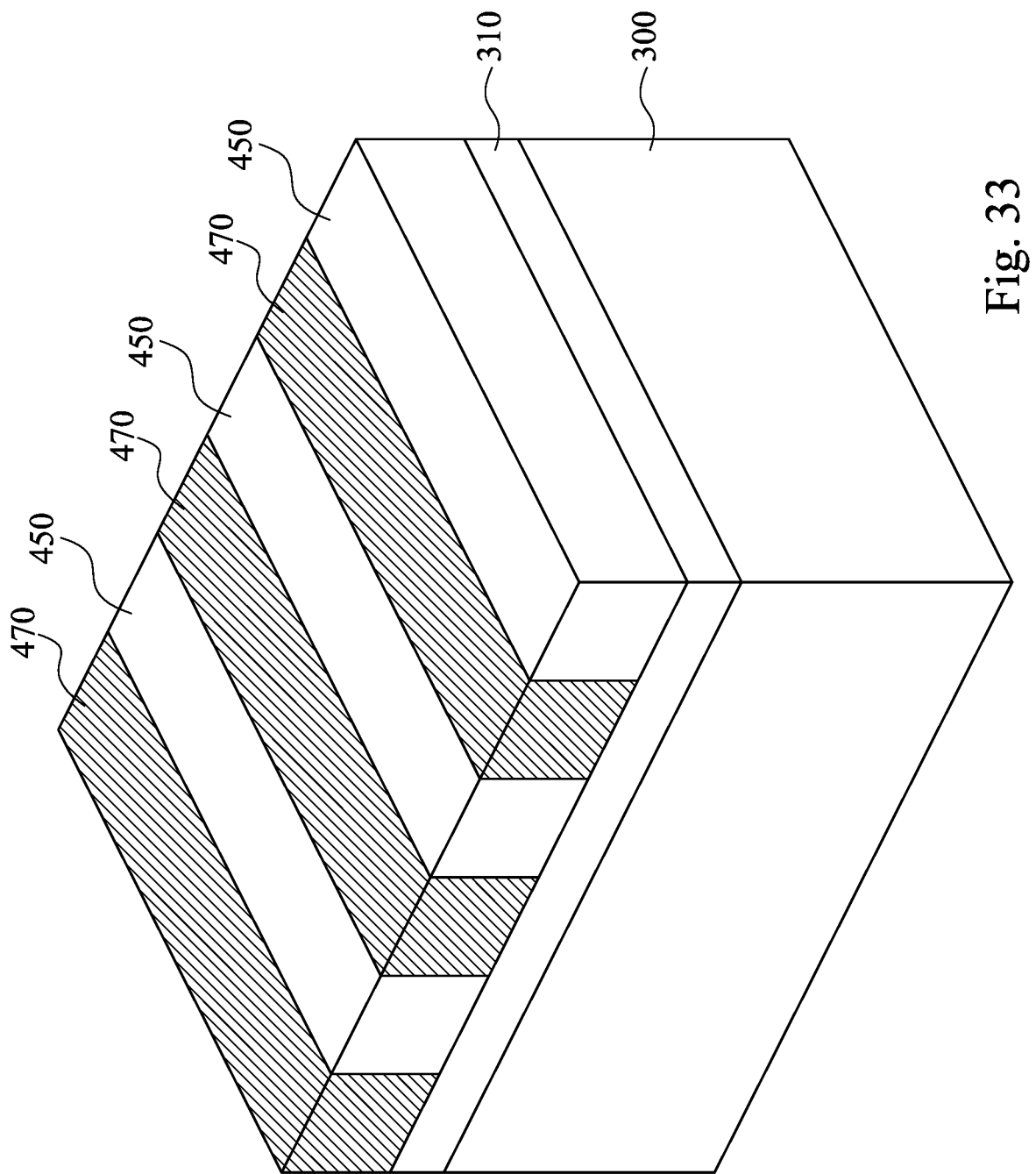

Reference is made to FIG. 33. A CMP process is performed to remove excessive material of the hard mask 470 until the top surface of the hard mask 450 are exposed. During the CMP, the inhibitors 460 are removed accordingly, and the top surface of the hard mask 450 is level with the top surface of the hard mask 470.

FIGS. 34 to 46C illustrate a semiconductor structure at various stages in accordance with some embodiments of the present disclosure.

Figure 34:
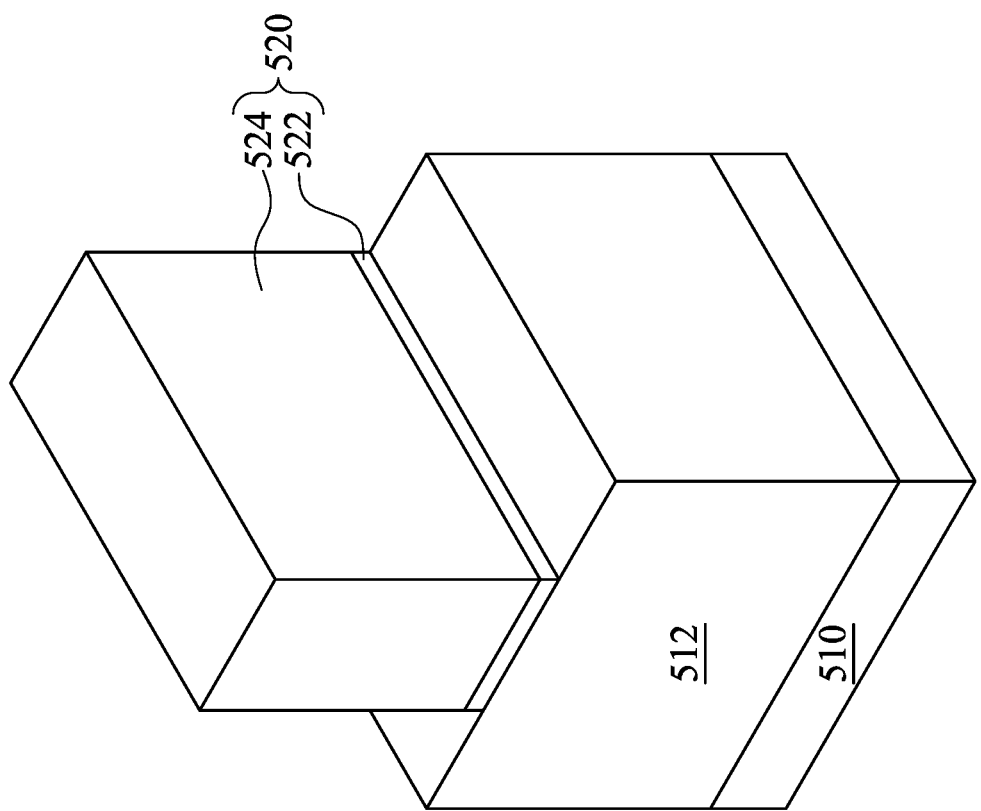
FIGS. 34 to 46C illustrate a semiconductor structure at various stages in accordance with some embodiments of the present disclosure.

Reference is made to FIG. 34. A semiconductor fin 512 is formed on a substrate 510. In some embodiments, the substrate 510 includes silicon. Alternatively, the substrate 510 may include germanium, silicon germanium, gallium arsenide or other appropriate semiconductor materials. Also alternatively, the substrate 510 may include an epitaxial layer. Furthermore, the substrate 510 may include a semiconductor-on-insulator (SOI) structure. Also alternatively, the substrate 510 may include a buried dielectric layer, such as a buried oxide (BOX) layer, such as one formed by separation by implantation of oxygen (SIMOX) technology, wafer bonding, SEG, or other appropriate method.

In some embodiments, the semiconductor fin 512 protrudes from the substrate 510. In some embodiments, the semiconductor fin 512 includes silicon. The semiconductor fin 512 may be formed, for example, by patterning and etching the substrate 510 using photolithography techniques. In some embodiments, a layer of photoresist material (not shown) is sequentially deposited over the substrate 510. The layer of photoresist material is irradiated (exposed) in accordance with a predetermined pattern (the semiconductor fin 512 in this case) and developed to remove portions of the photoresist material. The remaining photoresist material protects the underlying material from subsequent processing steps, such as etching. It is noted that other masks, such as an oxide or silicon nitride mask, may also be used in the etching process. The quantity of the semiconductor fins is exemplary, and is not limiting the disclosure.

Then, a dummy gate stack 520 is formed across the semiconductor fin 512. The dummy gate stack 520 includes a gate dielectric 522 and a dummy gate 524 over the gate dielectric 522. The dummy gate stack 520 can be formed by, for example, depositing a gate dielectric layer and a dummy gate layer over the substrate and following by a patterning process (i.e. etching) to form the gate dielectric 522 and the dummy gate 524.

The gate dielectric 522 may include $SiO_2$, silicon nitride, a high-K dielectric material or other suitable material. In various examples, the gate dielectric 522 may be deposited by a CVD process, a subatmospheric CVD (SACVD) process, a flowable CVD process, an ALD process, a PVD process, or other suitable process. In some embodiments, the gate dielectric 522 may include silicon oxide. In some embodiments, the gate dielectric 522 of the gate stack 118 may include silicon nitride, a high-k dielectric material or other suitable material. In some embodiments, the dummy gate 524 of the gate stack 520 may include polycrystalline silicon (polysilicon).

Figure 35:
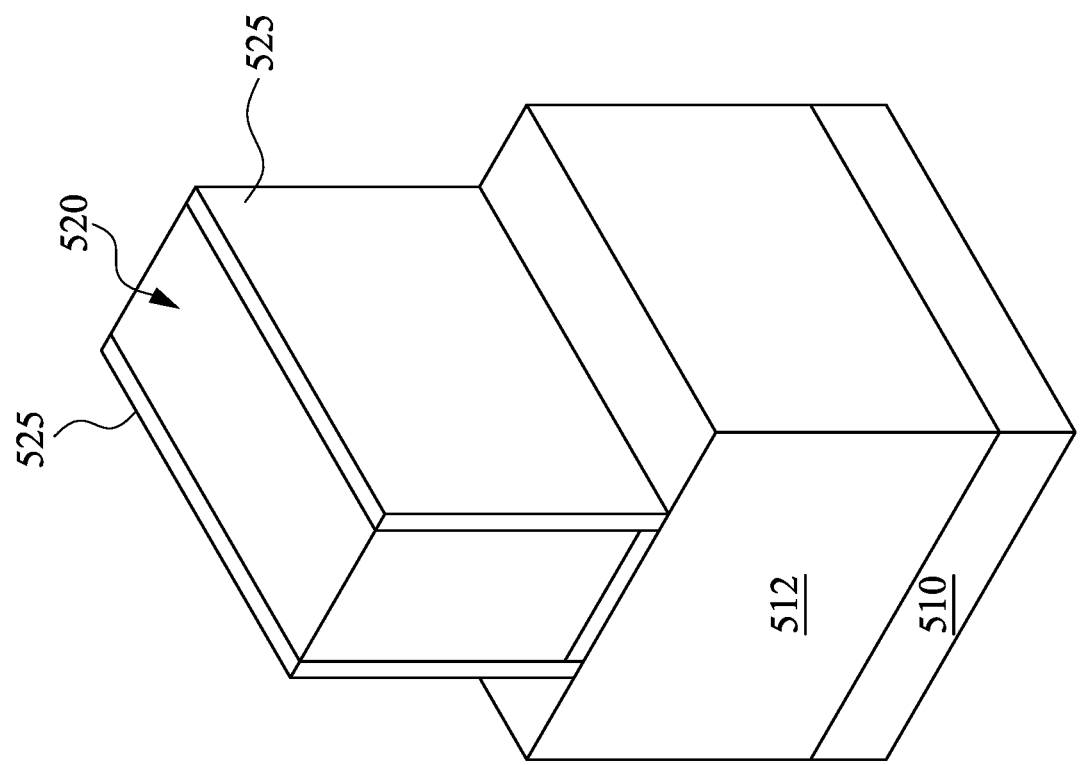

Reference is made to FIG. 35. Gate spacers 525 are formed on the substrate 510 and respectively along opposite sides of the dummy gate stack 520. In some embodiments, the gate spacers 525 may include silicon oxide, silicon nitride, silicon oxy-nitride, or other suitable material. The gate spacers 525 may include a single layer or multilayer structure. To form the gate spacers 525, a blanket layer may be formed on the substrate 510 by CVD, PVD, ALD, or other suitable technique. Then, an anisotropic etching is performed on the blanket layer to form the gate spacers 525 respectively on opposite sides of the dummy gate stack 520. In some embodiments, the gate spacers 525 can be used to offset subsequently formed doped regions, such as source/drain regions. The gate spacers 525 can further be used for designing or modifying the source/drain region (junction) profile.

Figure 36:
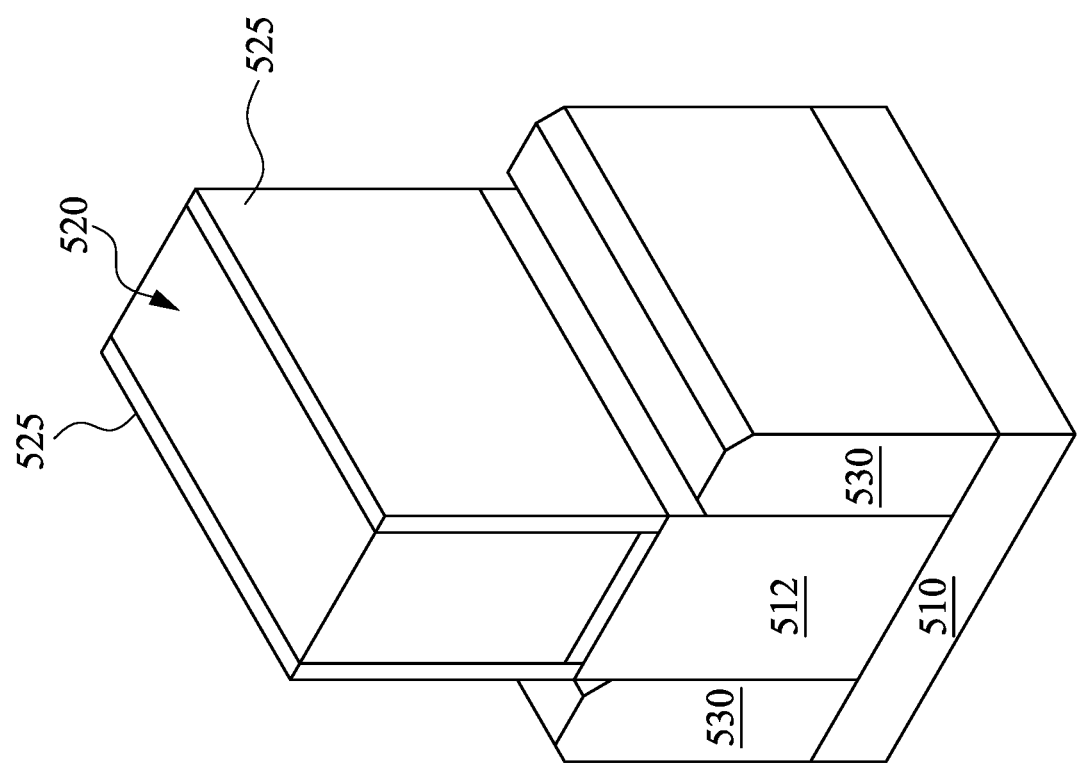

Reference is made to FIG. 36. Portions of the semiconductor fin 512 exposed from the dummy gate stack 520 and the gate spacers 525 are removed (or recessed) to form recesses therein, and a plurality of source/drain (S/D) structure 530 are then formed in the recesses. The S/D structures 530 may be formed using one or more epitaxy or epitaxial (epi) processes, such that Si features, SiGe features, and/or other suitable features can be formed in a crystalline state on the semiconductor fins 512. Thus, the S/D structures 530 may also be referred to as epitaxy structures 530 in some embodiments. One or more annealing processes may be performed to activate the S/D structures 530. The annealing processes include rapid thermal annealing (RTA) and/or laser annealing processes.

Figure 37:
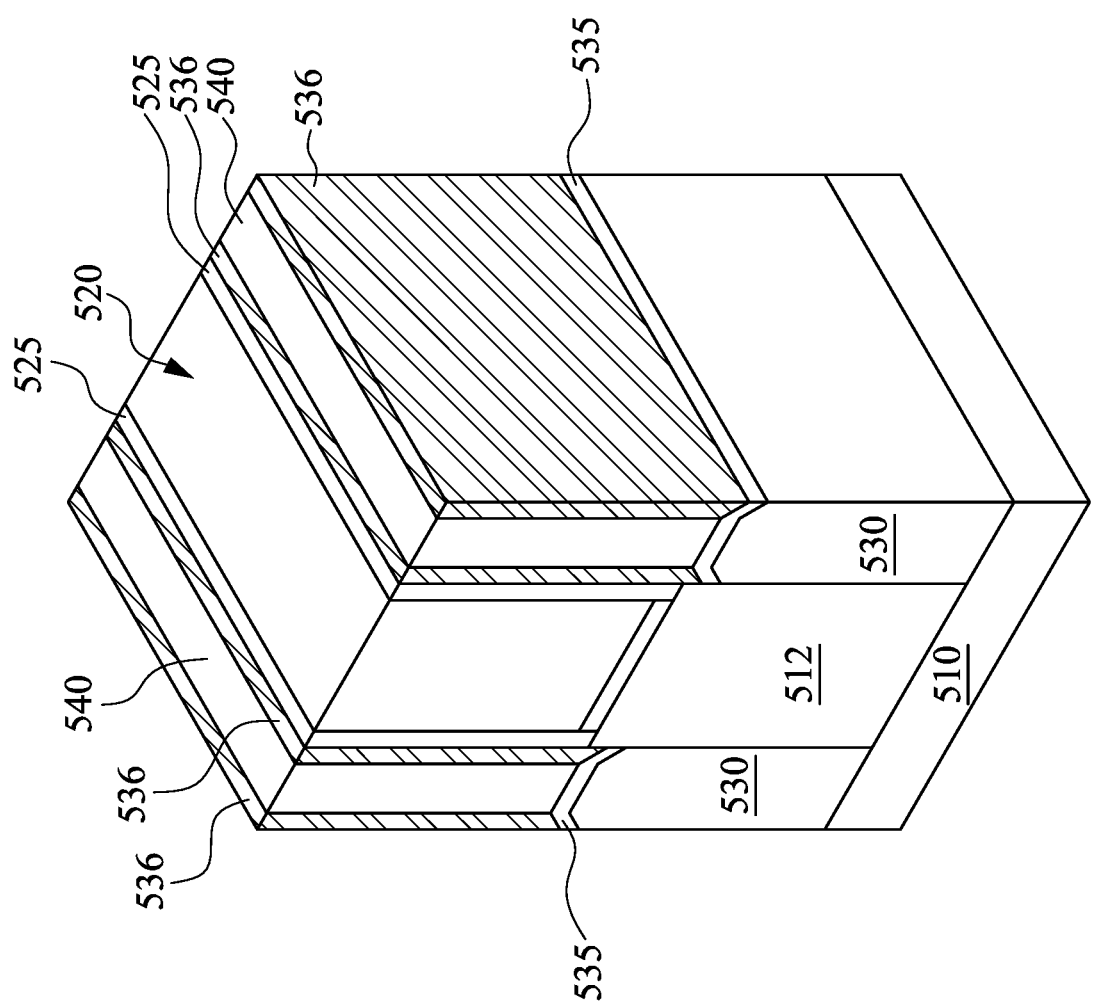

Reference is made to FIG. 37. An etching stop layer 535, spacers 536, and interlayer dielectric (ILD) 540 are formed over the substrate 510. In some embodiments, the etching stop layer 535 includes a silicon nitride layer, silicon carbon nitride layer, a silicon oxynitride layer, or the like. In some embodiments, the ILD 540 includes silicon oxide, silicon nitride, silicon oxynitride, silicon carbide, low-dielectric constant dielectric material or a combination thereof. The LD 540 includes a single layer or multiple layers. The material of the spacers 536 may include, for example, SiO, SiN, SiOC, and SiOCN. In some other embodiments, the spacers 536 may include carbon-doped silicon oxynitride. In some other embodiments, the spacers 536 can be omitted.

Figure 38:
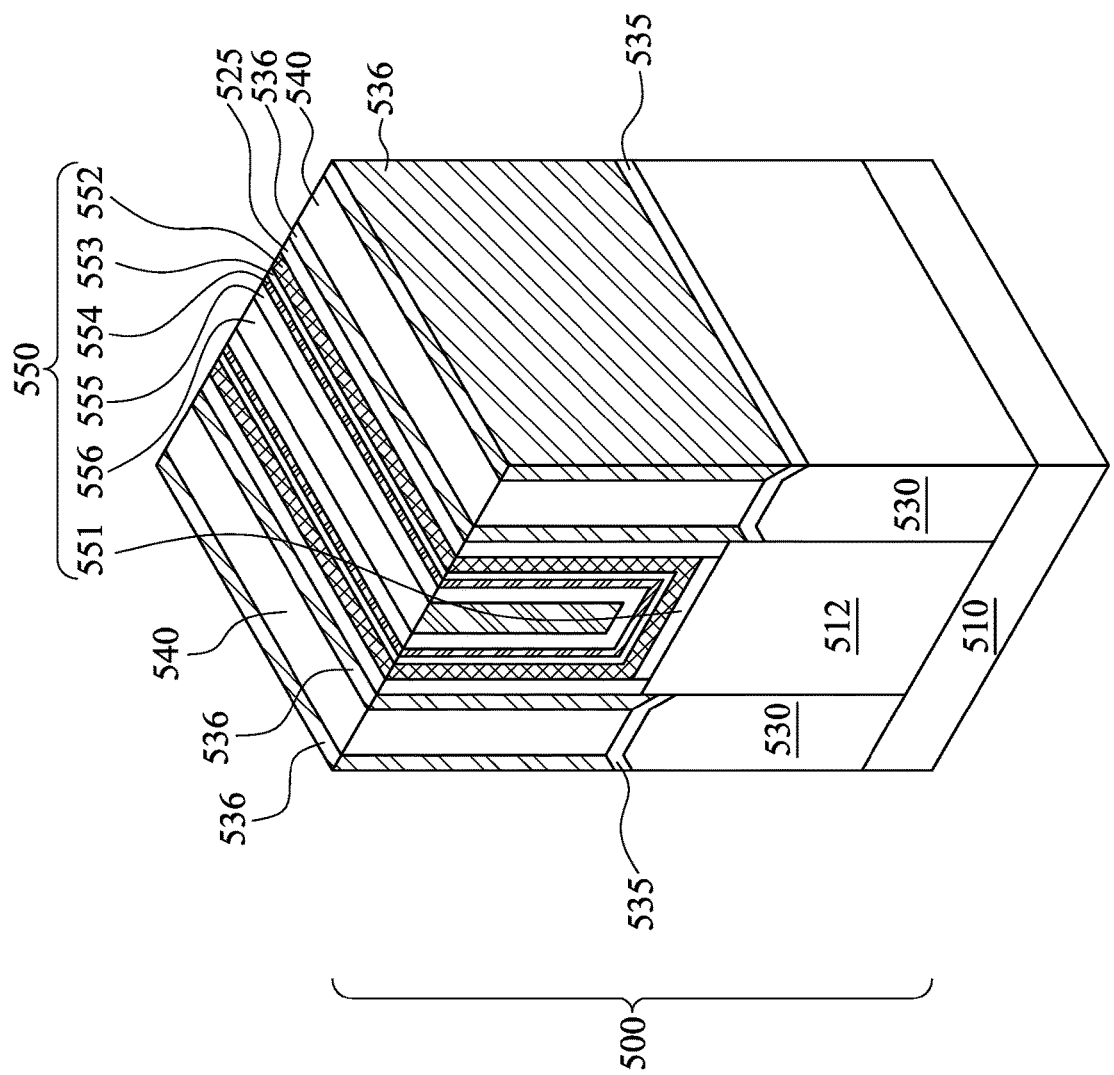

Reference is made to FIG. 38. A gate stack 550 is formed. In some embodiments, the gate stack 520 (see FIG. 37) is a dummy gate stack. That is, in some embodiments using a gate-last process, the gate stack 520 is a dummy gate stack and will be replaced by the final gate stack 550 at a subsequent step. In some embodiments, the gate stack 520 may be replaced at a later step by a high-k dielectric layer and a metal gate electrode. In some embodiments, the dummy gate stack 520 may be removed by one or more etching processes to form a gate trench between the spacers 525. A plurality of layers included in the gate stack 550 may be sequentially deposited in the gate trench. Then, a CMP process is performed to remove excessive materials to form the gate stack 550. In the following description, the structure shown in FIG. 38 may be referred to as a semiconductor device 500.

In some embodiments represented in FIG. 38, the gate stack 550 includes an interfacial layer 551, a gate dielectric layer 552, a capping layer 553, a first work function metal layer 554, a second work function metal layer 555, and a gate electrode 556, which can be formed by suitable process.

The interfacial layer 551 may include dielectric material such as silicon oxide ($SiO_2$), HfSiO, and/or silicon oxynitride (SiON). The gate dielectric layer 552 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The capping layer 553 may include titanium nitride (TiN) and/or tantalum nitride (TaN), but other materials and combinations of material layers are contemplated for the capping layer 553.

The first and second work function metal layers 554 and 555 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the first and second work function metal layers 554 and 555 may include the same dopant type or different dopant types. The gate electrode 556 may include tungsten (W). In some other embodiments, the gate electrode 556 includes aluminum (Al), copper (Cu) or other suitable conductive material.

Figure 39:
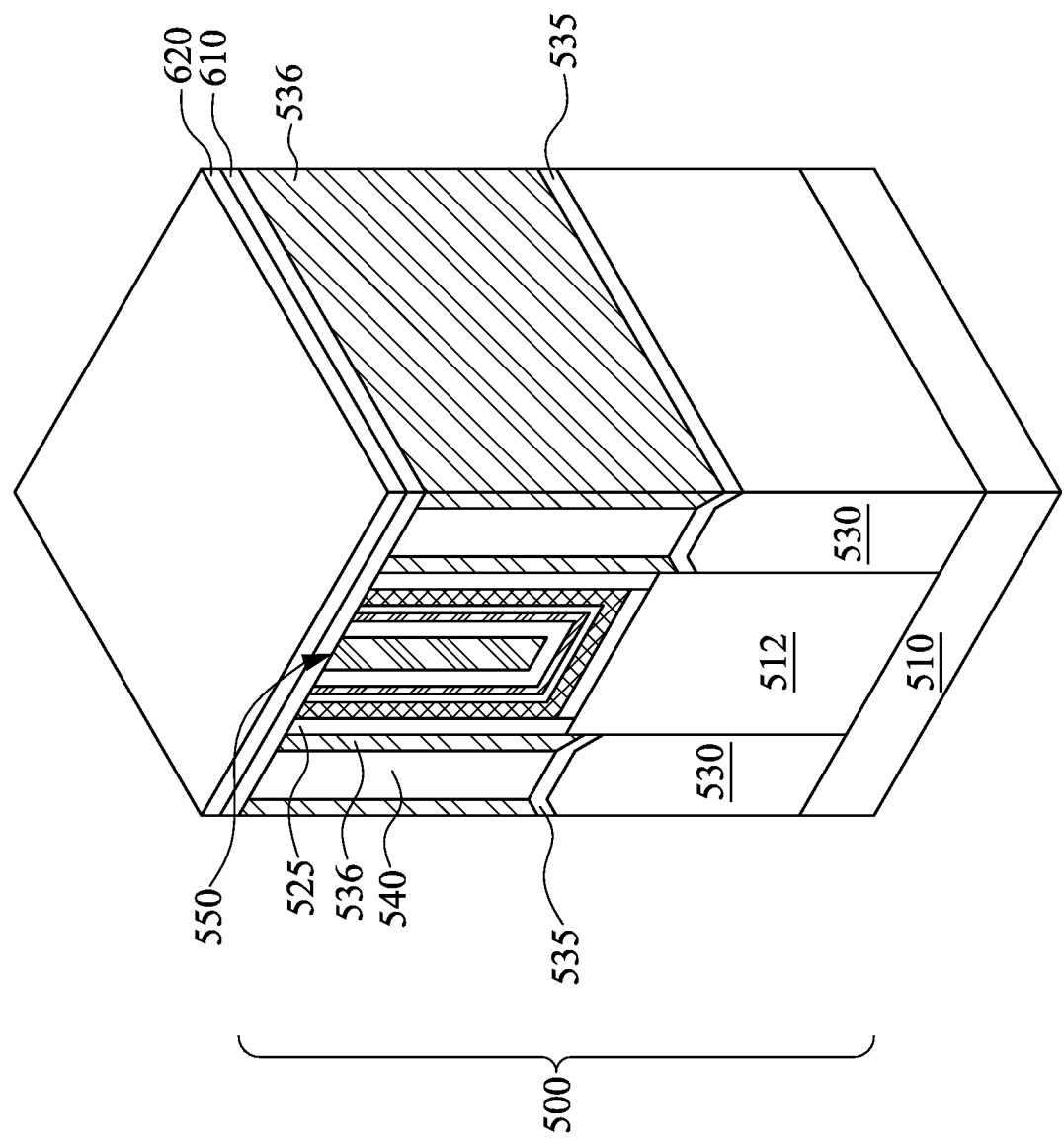

Reference is made to FIG. 39. A metal layer 610 and a dielectric layer 620 are formed over the semiconductor structure 500. The metal layer 610 may include W, TiN, Co, Ru, Pt, and/or other suitable materials. The metal layer 610 may be formed by suitable process, such as CVD, PVD, or ALD. The dielectric layer 620 may include SiO, SiN, SiC, SiOC, SiON, SiCN, SiOCN, and/or other suitable materials. The dielectric layer 620 may be formed by suitable process, such as CVD, PVD, or ALD.

Figure 40:
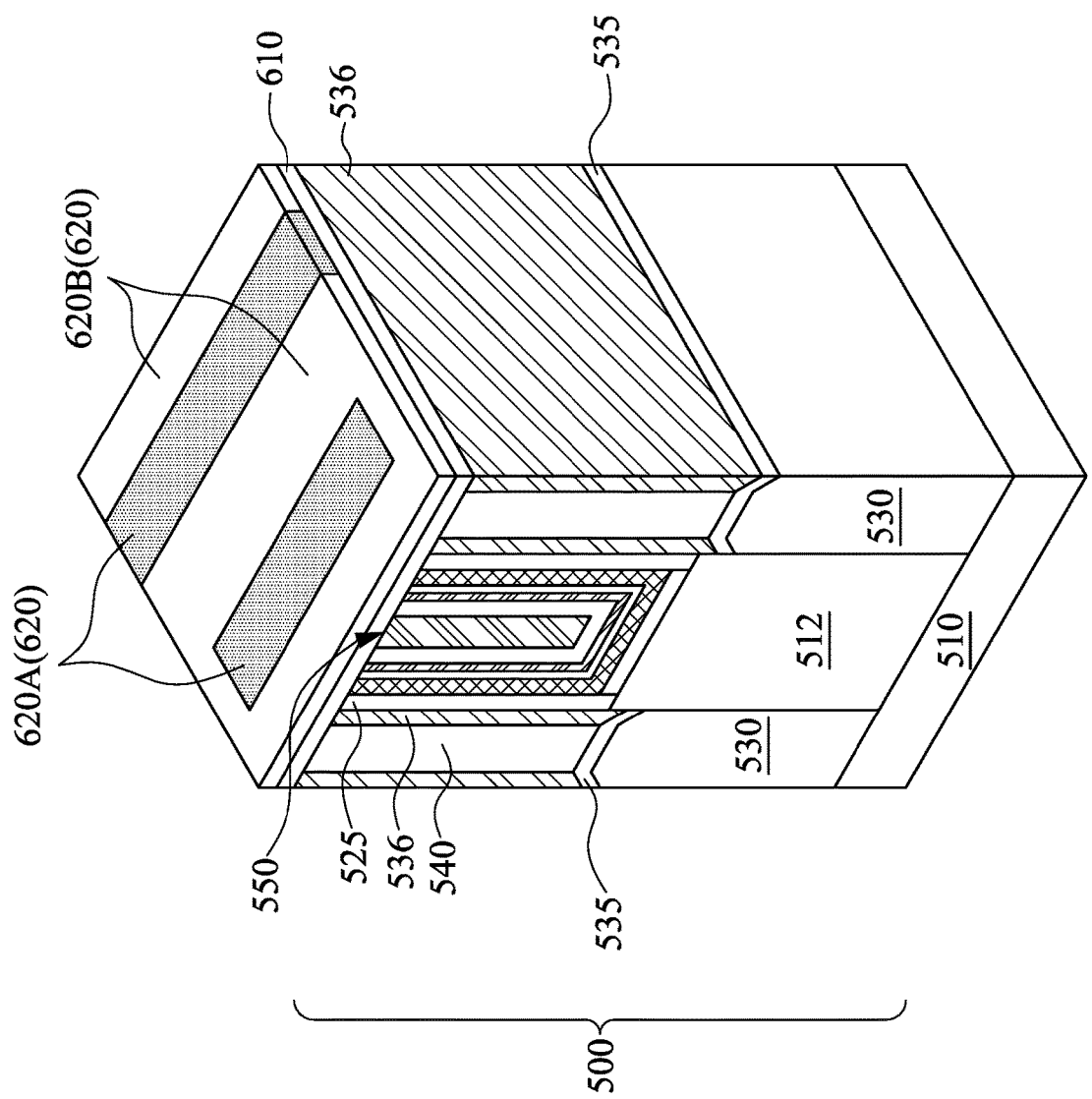

Reference is made to FIG. 40. A plasma treatment is performed to the dielectric layer 620 to form a plurality of treated portions 620A and untreated portions 620B. The plasma treatment is similar to that described in FIG. 4, and similar descriptions in this aspect will not be repeated hereinafter. Here, the treated portions 620A are subject to the plasma treatment, and the untreated portions 620B are protected by a mask (not shown) during the plasma treatment. As a result, the treated portions 620A and the untreated portions 620B are different in oxygen composition due to the break parts of the Si—C bonds of the treated portions 620A. In some embodiments, the treated portions 620A have an oxygen concentration higher than the untreated portions 620B.

Figure 41:
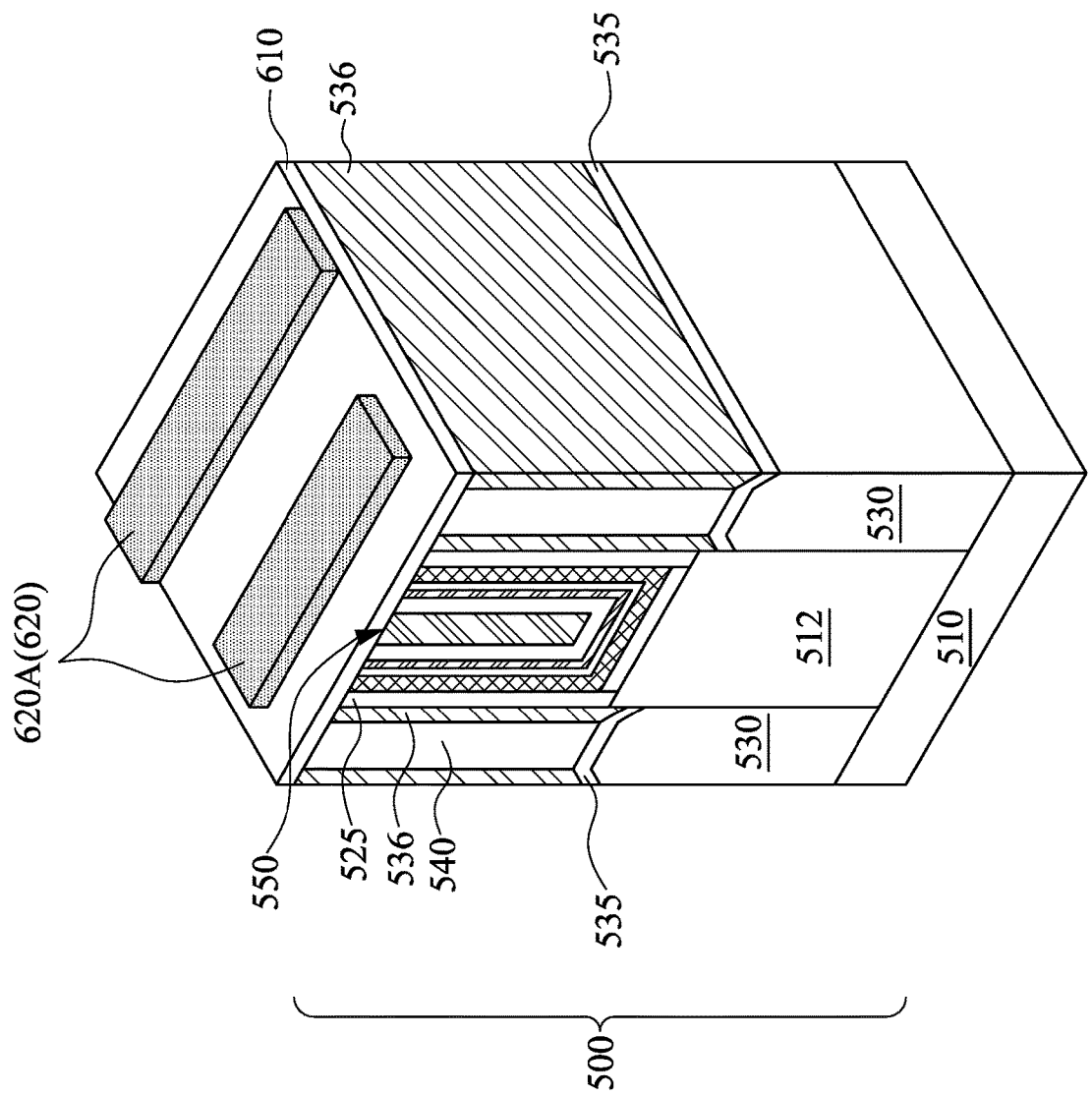

Reference is made to FIG. 41. The untreated portions 620B of the dielectric layer 620 are selectively removed, and the treated portions 620A of the dielectric layer 620 remain on the metal layer 610. In some embodiments, the etchant of the selective etching process may include $H_2$, HF, $NF_3$, and/or $NH_3$.

Figure 42:
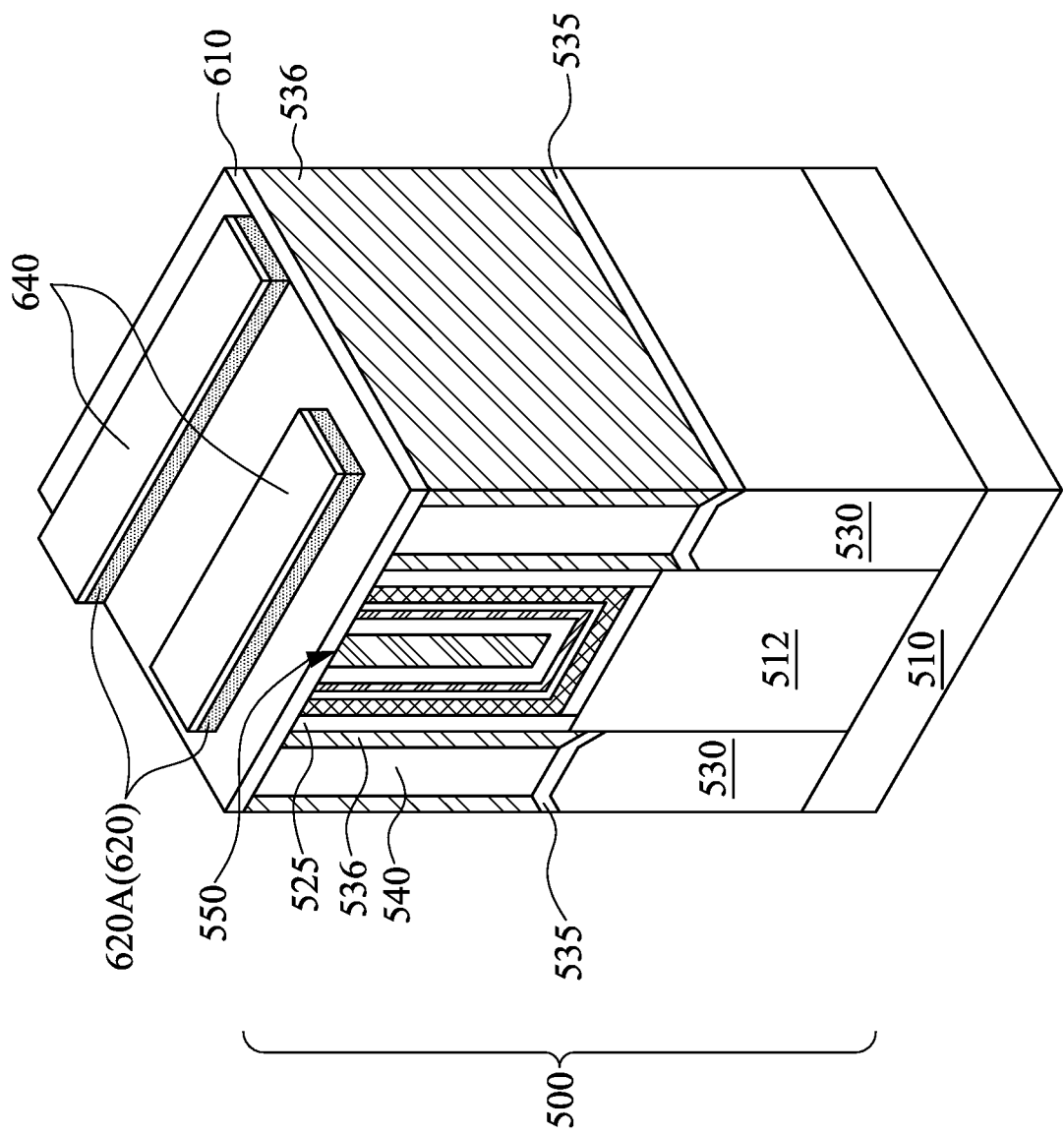

Reference is made to FIG. 42. A plurality of inhibitors 640 are selectively grown on the treated portions 620A of the dielectric layer 620. That is, the inhibitors 640 cover the top surfaces of the portions 620A of the dielectric layer 620, while leaving the top surface of the metal layer 610 uncovered. The inhibitors 640 include a material that can suppress deposition of the material of an ASD layer formed on the underlying structure. It is noted that the inhibitors 640 may be similar to the inhibitors 140 of FIGS. 7A and 7B, thus similar description in this aspect will not be repeated hereinafter.

Figure 43A:
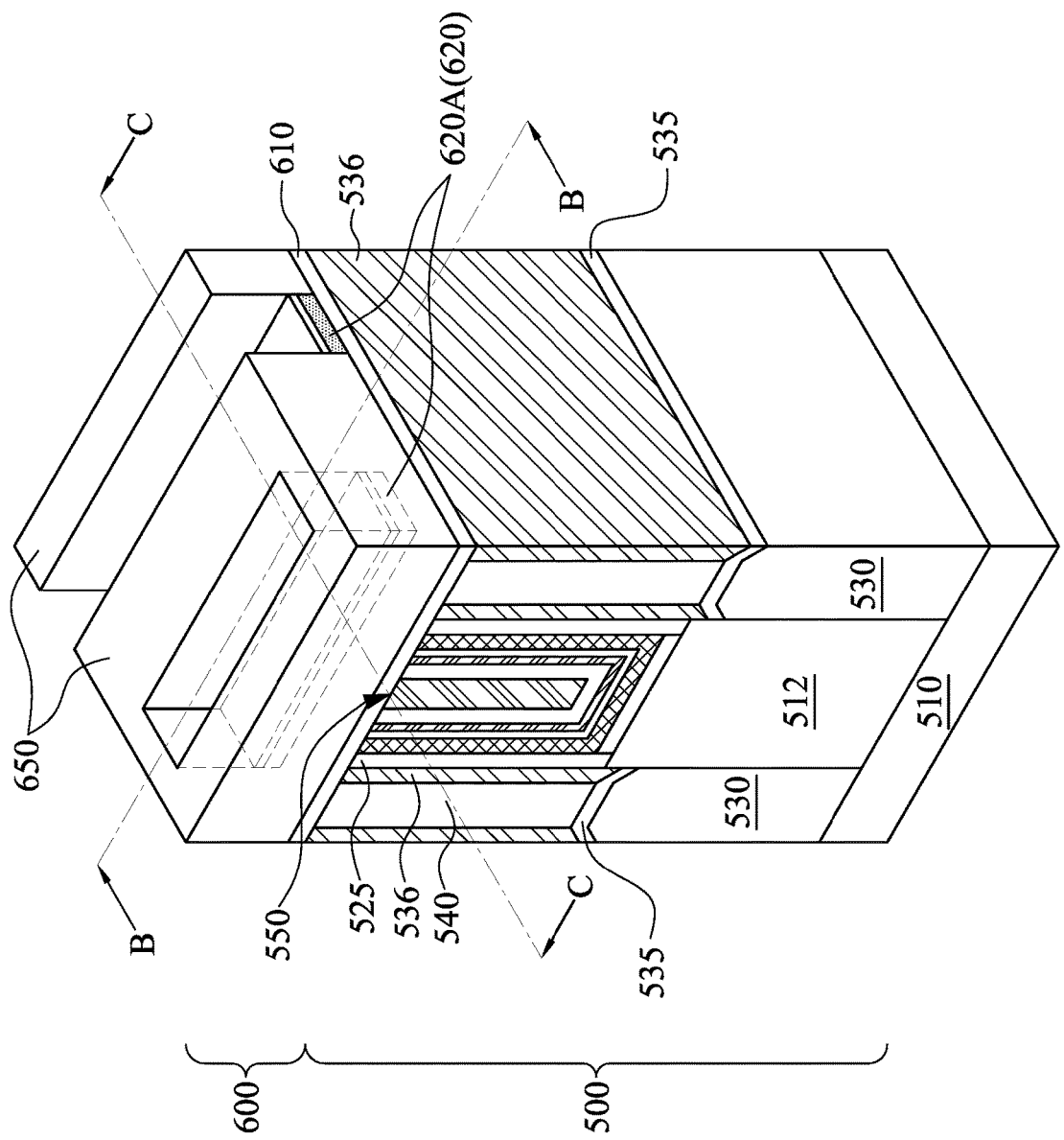
Figure 43B:
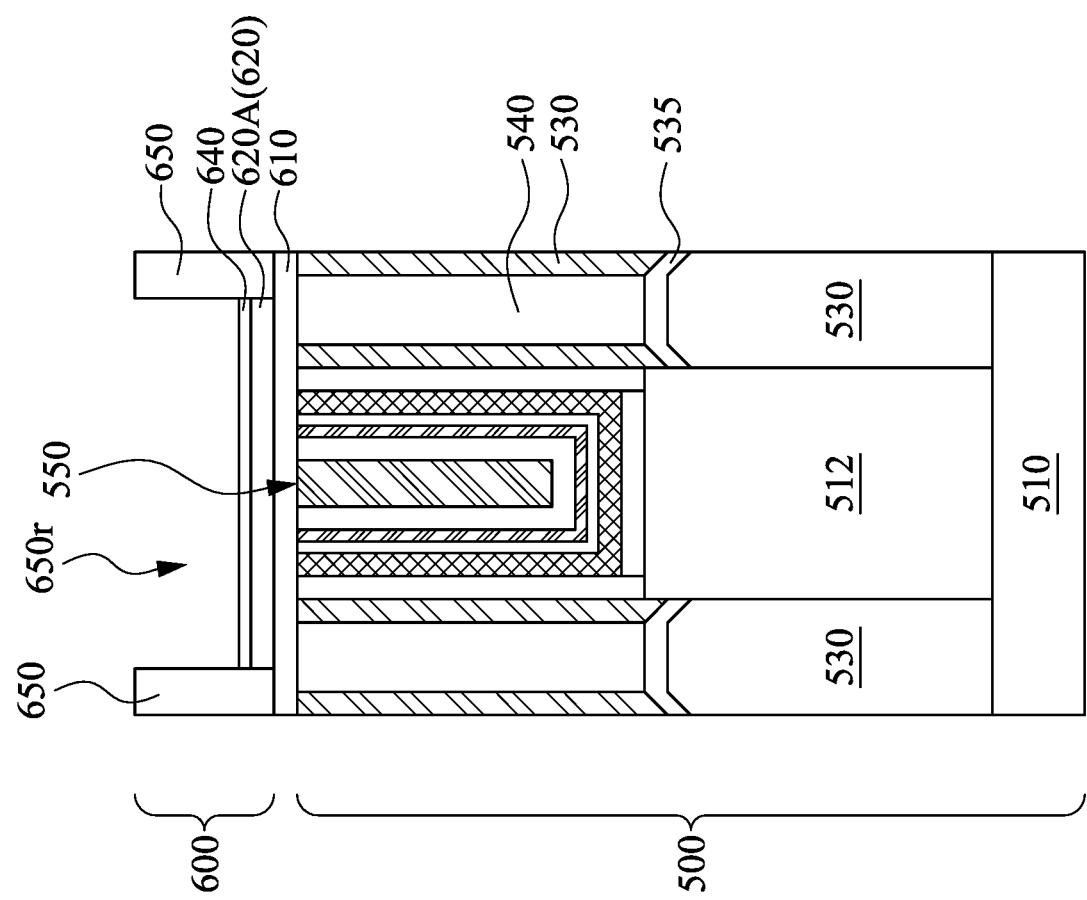
Figure 43C:
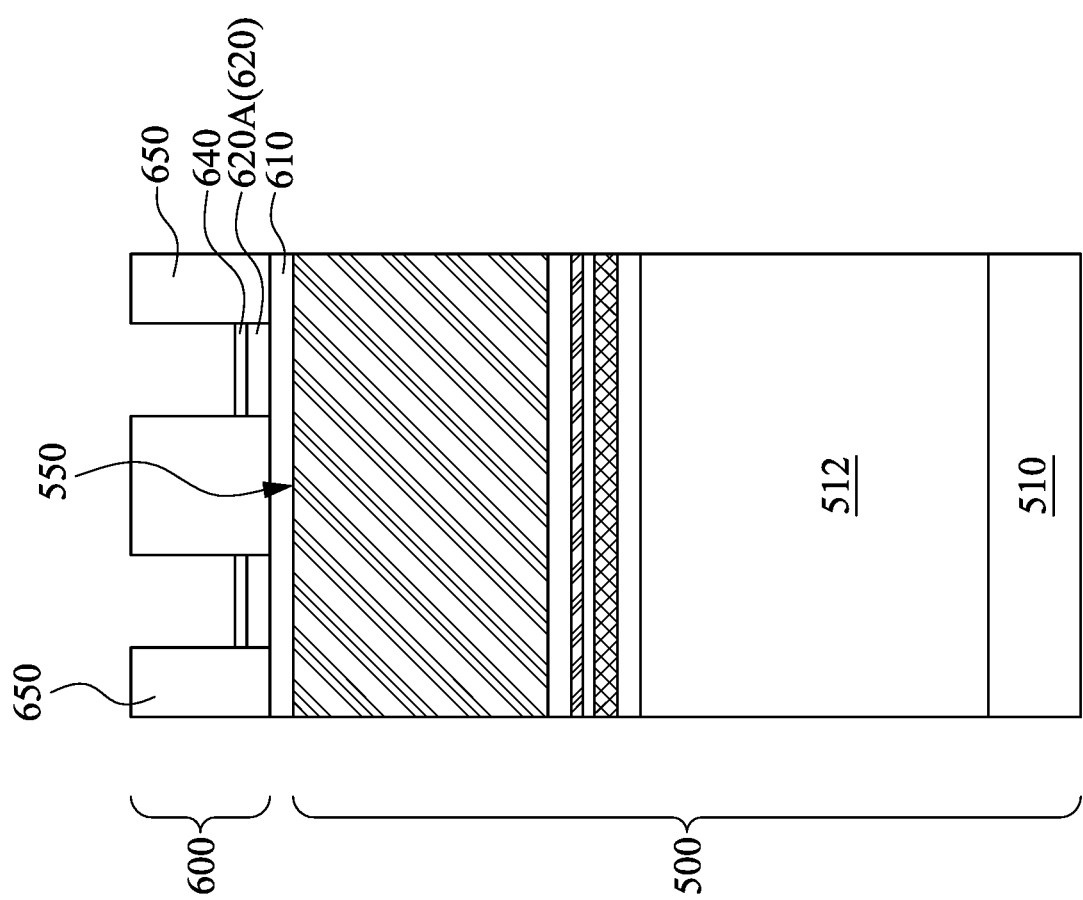

Reference is made to FIGS. 43A, 43B, and 43C, in which FIG. 43A is a perspective view of an intermediate structure during manufacturing a semiconductor device, FIG. 43B is a cross-sectional view along line B-B of FIG. 43A, and FIG. 43C is a cross-sectional view along line C-C of FIG. 43A. An area selective deposition (ASD) process is employed to form a hard mask 650 over the semiconductor device 500 and self-aligned to the metal layer 610. Due to the material properties as mentioned above, precursors of the ALD process have a tendency not to adhere to the surface of the inhibitors 640. In this way, the precursors of the ASD process have high selectivity between the inhibitors 640 and the metal layer 610. Specifically, the ALD process has selectivity for the metal layer 610 with respect to the inhibitors 640. As such, by forming the inhibitors 640, the deposition rate of the self-aligned hark mask 650 over the treated portions 620A (under the inhibitors 640) can be efficiently suppressed. Thus, during the ASD process, the self-aligned hark mask 650 may be formed over the metal layer 610 with a plurality of openings 650r therein, and leaves the top surface of the inhibitors 640 uncovered. In other words, the self-aligned hark mask 650 may not be formed on the inhibitors 640 that covers the treated portions 620A. In some embodiments where the ASD process is an atomic layer deposition (ALD) process, the ALD process may include plural reaction cycles to form a desired thickness of the self-aligned hark mask 650.

Till this stage, the hard mask structure 600 is formed, in which the hard mask structure 600 includes the metal layer 610, the dielectric layers 620A, the inhibitors 640, and the hard mask 650. In some other embodiments, the hard mask structure 600 can be replaced by the structures described in FIGS. 1-8, 9-16, 17-28, and 29-33, and can be formed by the method thereof. Stated another way, the underlying structures 100, 200, and 300 described in FIGS. 1-8, 9-16, 17-28, and 29-33 can be replaced by the semiconductor device 500 of FIGS. 43A to 43C.

Figure 44A:
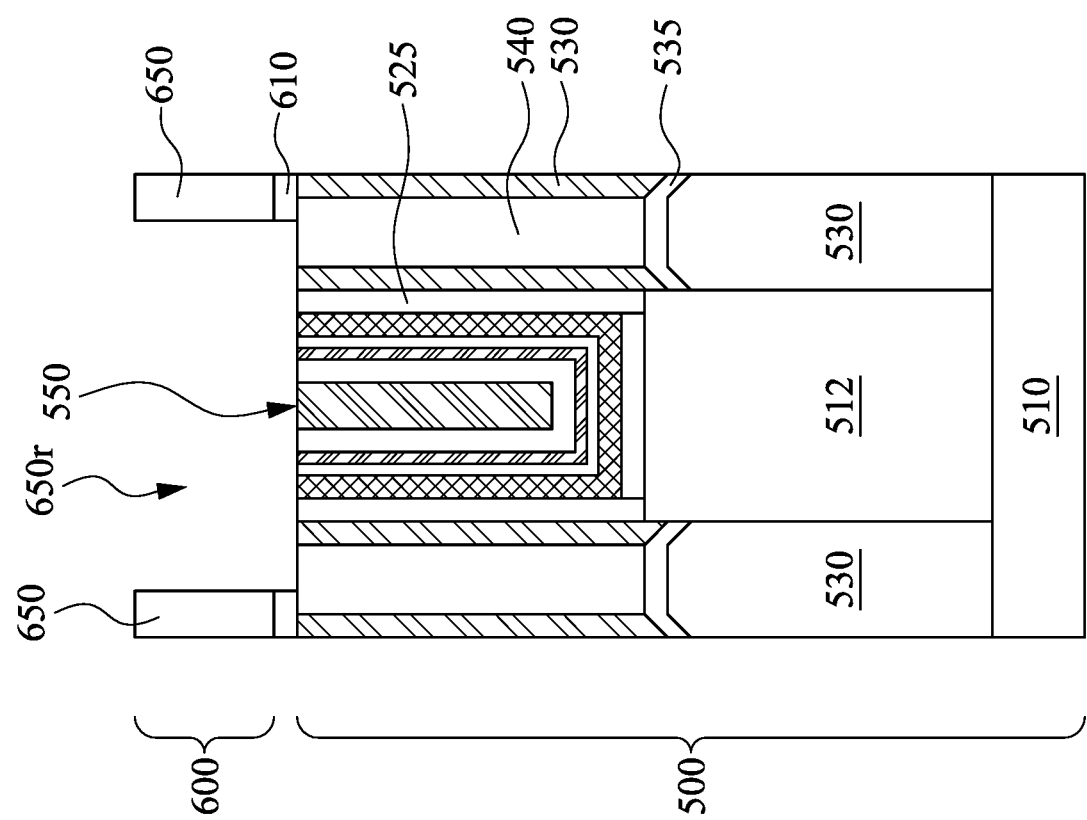
Figure 44B:
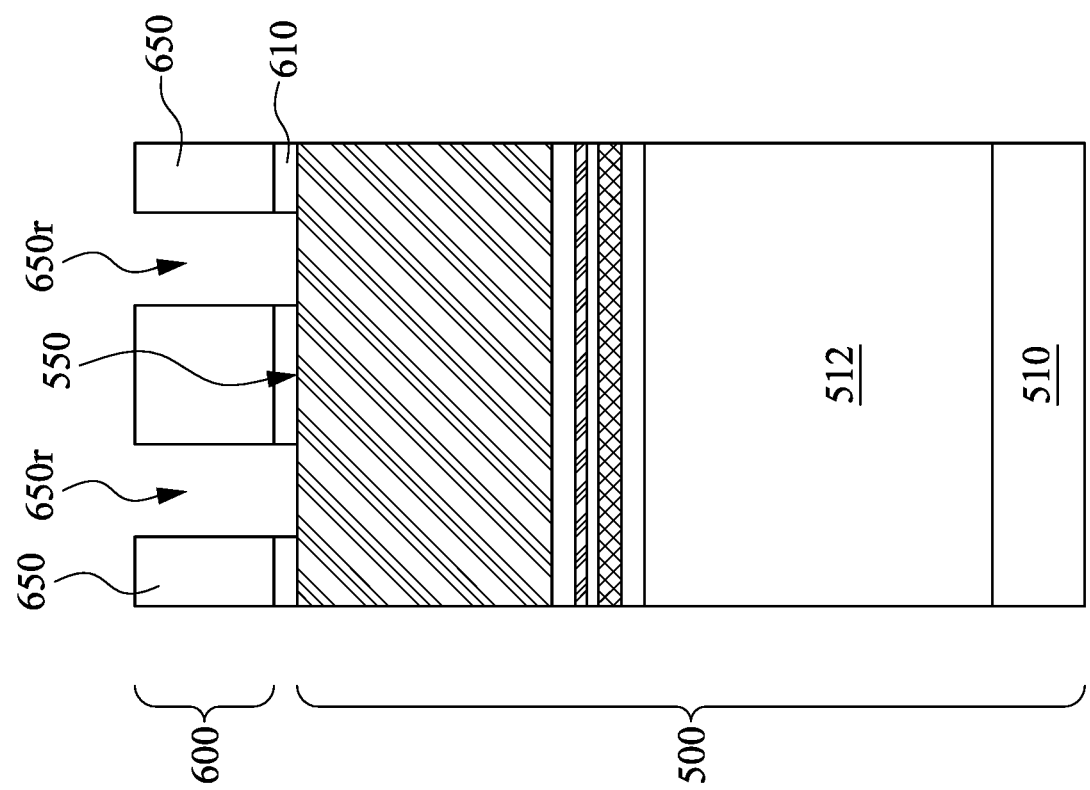

Reference is made to FIGS. 44A and 44B. An etching process is performed to remove portions of the inhibitor 640, the dielectric layers 620A, and the metal layer 610 that are exposed from the hard mask 650. The hard mask 650 has an opening 650r defining a line-cut to be formed later. A portion of the semiconductor device 500 is exposed within the opening 650r. In some embodiments, the opening 650r has a larger width along a direction of line B-B of FIG. 43A such that adjacent sidewall spacers 525 and the ILD 540 are exposed in the opening 650r to obtain advantages, such as relaxing lithography process resolution constrains, especially when spaces between two adjacent fin features in the device 500 become smaller and smaller.

Figure 45A:
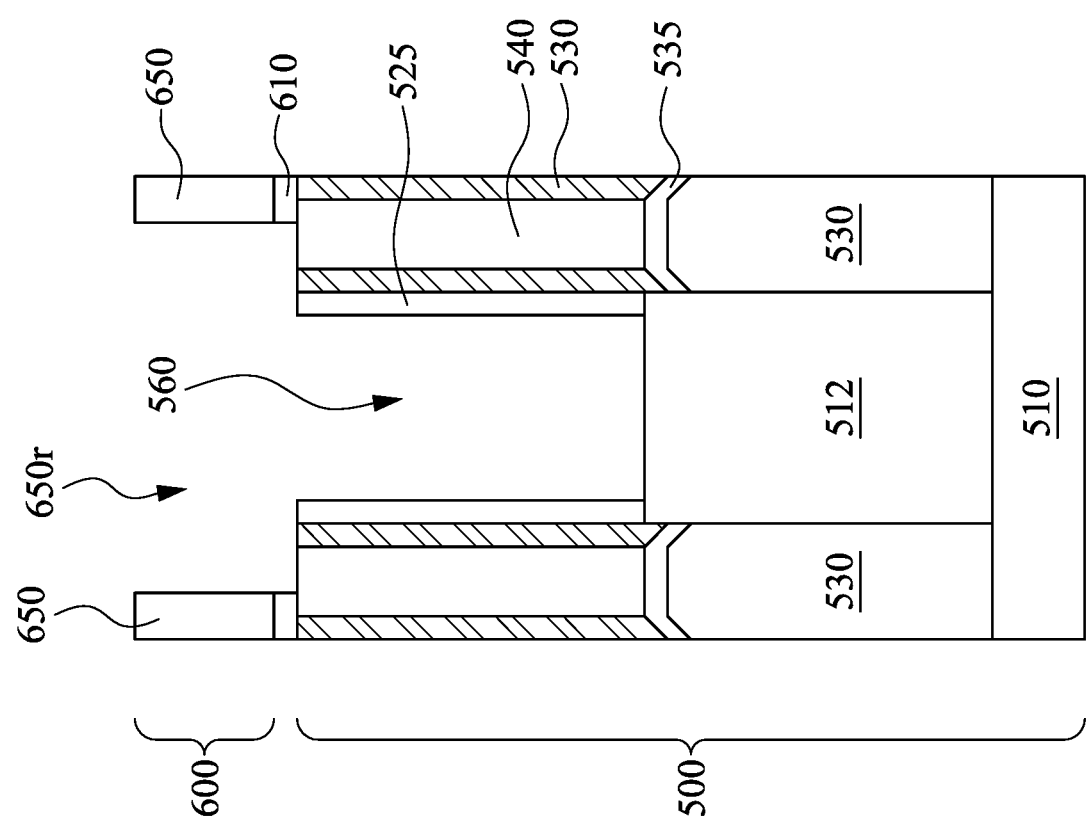
Figure 45B:
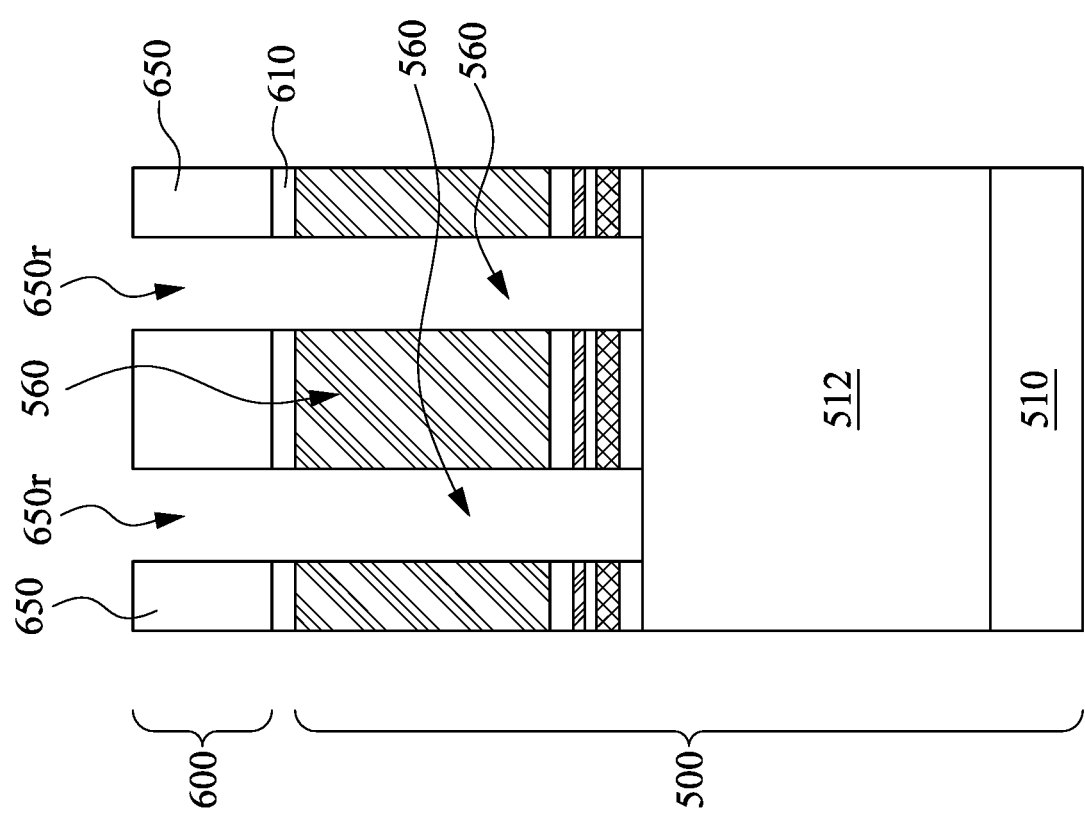

Reference is made to FIGS. 45A and 45B. The exposed gate stack 550 (see FIGS. 44A and 44B) is removed through the opening 650r to form a line-cut 560. The gate stack 550 may be removed by etching process. The etch process may include a wet etch, a dry etch, and/or a combination thereof. As an example, a dry etching process may be implemented using fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etch process is chosen to selectively etch the gate stack 550 without substantially etching the sidewall spacers 525 and the ILD 540. As shown, in instances where the portions of the sidewall spacers 525 and the ILD 540 are exposed in the opening 650r, the exposed portions of the sidewall spacers 525 and the ILD 540 together serves as a sub-etch-mask. Thus, the line-cut 560 is formed with a self-alignment nature, which relaxes process constrains.

Figure 46A:
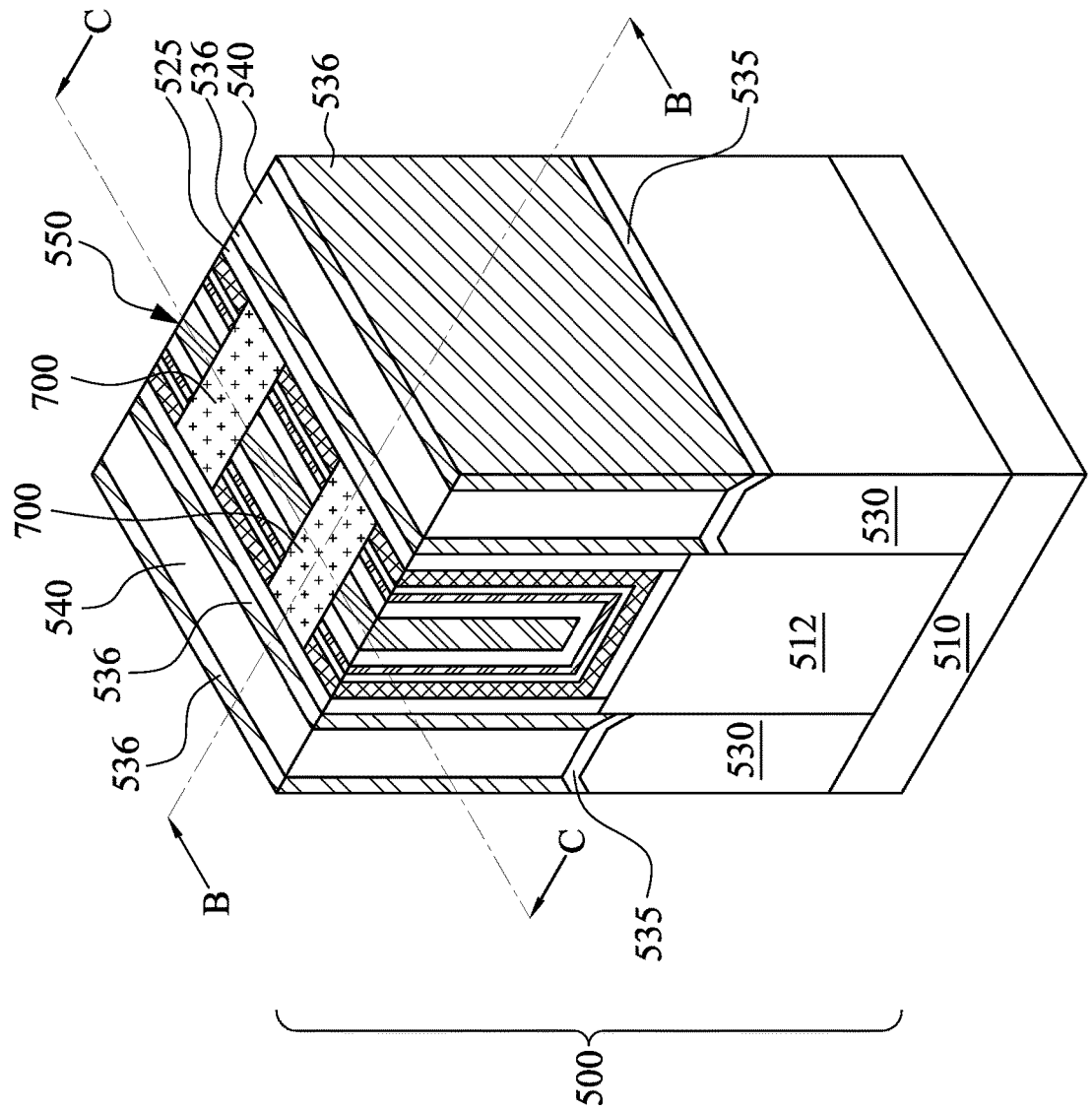
Figure 46B:
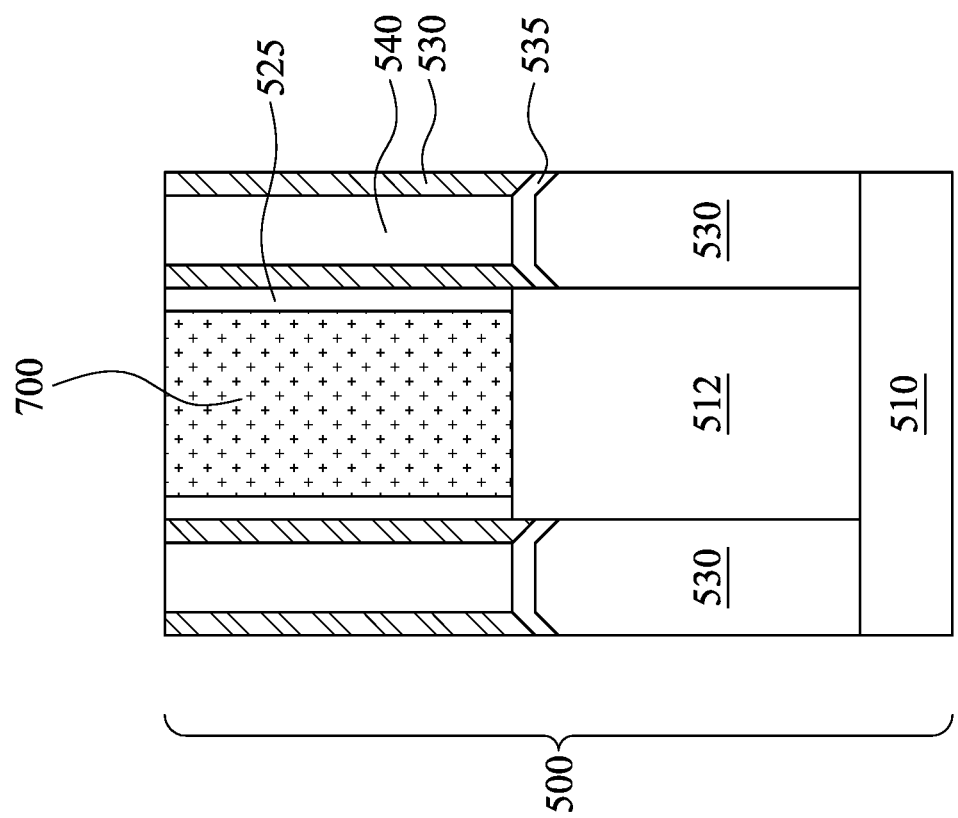
Figure 46C:
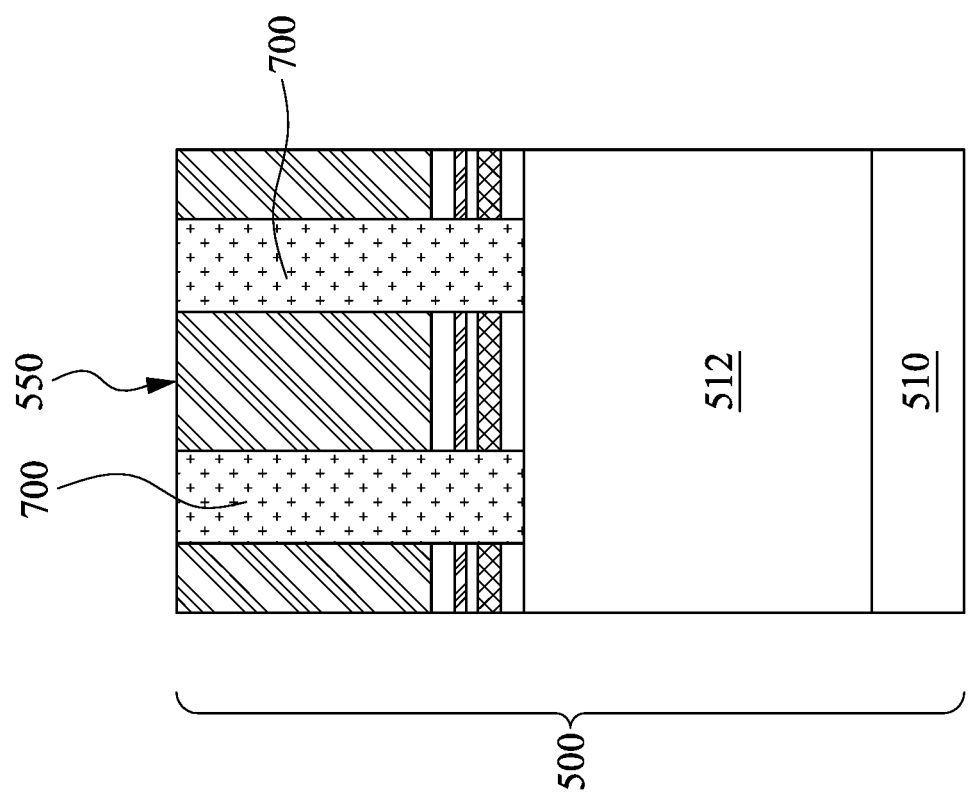

Reference is made to FIG. 46A to 46C, in which FIG. 46B is a cross-sectional view along line B-B of FIG. 46A, and FIG. 46C is a cross-sectional view along line C-C of FIG. 46A. In some embodiments, the hard mask structure 600 in FIGS. 45A to 45B is then removed by an etching process, and the line-cut 560 is filled with a dielectric layer 700 to form an isolation region between two sub-HK/MG lines. The dielectric layer 700 may be deposited by CVD, ALD, spin-on coating, or other suitable techniques. The dielectric layer 700 may include silicon oxide, silicon nitride, oxynitride, a dielectric material having a dielectric constant (k) lower than thermal silicon oxide (therefore referred to as low-k dielectric material layer), and/or other suitable dielectric material layer. A CMP may be performed to polish back the dielectric layer 700 hereby provide a substantially planar top surface of the dielectric layer 700 with respect to the gate stack 550.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that the metal layer is a blanket layer covering an entirety of the underlying structure, and thus the selective deposition of the hard mask will not be affected by materials of the underlying structure, and will be self-aligned to desired regions of the underlying structure as long as these regions are free from coverage by the inhibitor. Moreover, since the treated dielectric portions may be formed in a pattern corresponding to a pattern of the mask, the self-aligned hard mask that does not cover the treated dielectric portions has a pattern corresponding to the pattern of the mask in nature, without employing additional etching processes. On the contrary, if the hard mask is patterned using photolithography and etching techniques, a patterned photoresist layer is formed on the hard mask and acts as a mask for etching the hard mask. However, the total thickness of the photoresist layer and the hard mask would lead to a high aspect ratio etching condition, which in turn leads to a poor process window and difficulty in etching. As such, a hard mask, which is patterned by photolithography and etching techniques, would be unsatisfactory for a scaled down device. However, in some embodiments of the present disclosure, because the deposition of the hard mask 150 results in a desired pattern in nature without undergoing a photolithography process and an etching process, the concern about the increased aspect ratio and the unsatisfactory pattern of the hard mask can be eased. Moreover, in some embodiments where the ASD is an ALD process, the thickness of the hard mask can be controlled precisely to achieve a desirable low aspect ratio of the openings in the hard mask 150, which in turn facilitates subsequent etching and deposition processes.

In some embodiments of the present disclosure, a method includes forming a metal layer over a substrate; forming a dielectric layer over the metal layer; performing a plasma treatment to a first portion of the dielectric layer, such that a carbon concentration of the first portion of the dielectric layer is lower than a carbon concentration of a second portion of the dielectric layer; selectively forming an inhibitor over the first portion of the dielectric layer; and selectively forming a hard mask over portions of the metal layer that is uncovered by the inhibitor.

In some embodiments of the present disclosure, a method includes forming a metal layer over a substrate; depositing a dielectric layer over the metal layer; patterning the dielectric layer such that portions of the metal layer are exposed by the patterned dielectric layer; selectively forming an inhibitor on the patterned dielectric layer, while the inhibitor is not formed on the portions of the metal layer; and performing a deposition process to form a hard mask on the portions of the metal layer that are uncovered by the inhibitor.

In some embodiments of the present disclosure, a method includes forming a transistor over a substrate; forming a metal layer over the transistor; forming a dielectric layer over the metal layer; patterning the dielectric layer, such that portions of the metal layer are exposed by the patterned dielectric layer; forming a hard mask on the portions of the metal layer, wherein the patterned dielectric layer is uncovered by the hard mask; removing the patterned dielectric layer uncovered by the hard mask; and removing a portion of a gate structure of the transistor uncovered by the hard mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a metal layer over a substrate;
   forming a dielectric layer over the metal layer;
   performing a plasma treatment to a first portion of the dielectric layer, such that a carbon concentration of the first portion of the dielectric layer is lower than a carbon concentration of a second portion of the dielectric layer;
removing the second portion of the dielectric layer;
after removing the second portion of the dielectric layer, selectively forming an inhibitor over the first portion of the dielectric layer, wherein portions of the metal layer are uncovered by the inhibitor; and
selectively forming a hard mask over the portions of the metal layer that are uncovered by the inhibitor.

2. The method of claim 1, wherein the dielectric layer is made of SiOC.

3. The method of claim 1, wherein the plasma treatment is performed such that an oxygen concentration of the first portion of the dielectric layer is higher than an oxygen concentration of a second portion of the dielectric layer.

4. The method of claim 1, wherein the inhibitor has a higher deposition rate on the first portion of the dielectric layer than on the metal layer.

5. The method of claim 1, wherein the plasma treatment is performed using a helium plasma.

6. The method of claim 1, wherein selectively forming the hard mask is performed such that a top surface of the hard mask is higher than a top surface of the inhibitor.

7. A method, comprising:
forming a metal layer over a substrate;
depositing a dielectric layer over the metal layer;
patterning the dielectric layer such that portions of the metal layer are exposed by the patterned dielectric layer;
selectively forming an inhibitor on the patterned dielectric layer, while the inhibitor is not formed on the portions of the metal layer; and
performing a deposition process to form a hard mask on the portions of the metal layer that are uncovered by the inhibitor, wherein a bottom surface of the hard mask is lower than a bottom surface of the inhibitor, and a top surface of the hard mask is higher than a top surface of the inhibitor.

8. The method of claim 7, wherein patterning the dielectric layer comprises:
performing a plasma treatment to a portion of the dielectric layer; and
removing an un-treated portion of the dielectric layer.

9. The method of claim 8, wherein the plasma treatment is performed such that an oxygen concentration of the portion of the dielectric layer is higher than an oxygen concentration of the un-treated portion of the dielectric layer.

10. The method of claim 9, wherein the plasma treatment is performed such that a carbon concentration of the portion of the dielectric layer is lower than a carbon concentration of the un-treated portion of the dielectric layer.

11. The method of claim 7, wherein the inhibitor has a higher deposition rate on the patterned dielectric layer than on the portions of the metal layer.

12. The method of claim 7, wherein the hard mask is in contact with sidewalls of the inhibitor.

13. A method, comprising:
forming a transistor over a substrate;
forming a metal layer over the transistor;
forming a dielectric layer over the metal layer;
patterning the dielectric layer, such that portions of the metal layer are exposed by the patterned dielectric layer;
forming a hard mask on the portions of the metal layer, wherein the patterned dielectric layer is uncovered by the hard mask;
removing the patterned dielectric layer uncovered by the hard mask; and
removing a portion of a gate structure of the transistor uncovered by the hard mask.

14. The method of claim 13, wherein patterning the dielectric layer comprises:
performing a plasma treatment to a first portion of the dielectric layer; and
removing a second portion of the dielectric layer untreated by the plasma treatment.

15. The method of claim 13, further comprising forming an inhibitor over the patterned dielectric layer, wherein the hard mask has a higher deposition on the portions of the metal layer than on the inhibitor.

16. The method of claim 15, wherein removing the patterned dielectric layer further comprises removing the inhibitor over the patterned dielectric layer.

17. The method of claim 13, further comprising removing the hard mask and the metal layer after removing the portion of the gate structure of the transistor.

18. The method of claim 13, wherein the portion of the gate structure of the transistor is removed to form an opening, and the method further comprises filling the opening with a dielectric material.

19. The method of claim 13, wherein the dielectric layer is made of SiOC.

20. The method of claim 13, wherein patterning the dielectric layer comprises:
performing a helium plasma to a first portion of the dielectric layer; and
removing a second portion of the dielectric layer untreated by the helium plasma.

* * * * *